(12) United States Patent
Mogi et al.

(10) Patent No.: US 7,028,061 B2
(45) Date of Patent: Apr. 11, 2006

(54) FIR FILTER AND SETTING METHOD OF COEFFICIENT THEREOF

(75) Inventors: Yukihiko Mogi, Kanagawa (JP); Kazuhiko Nishibori, Kanagawa (JP)

(73) Assignee: Sony Corporation (JP)

(*) Notice: Subject to any disclaimer, the term of this patent is extended or adjusted under 35 U.S.C. 154(b) by 773 days.

(21) Appl. No.: 09/874,061

(22) Filed: Jun. 6, 2001

(65) Prior Publication Data
US 2002/0042802 A1 Apr. 11, 2002

(30) Foreign Application Priority Data
Jun. 7, 2000 (JP) .................. P2000-175579

(51) Int. Cl.
*G06F 17/10* (2006.01)

(52) U.S. Cl. .................. 708/319; 708/322
(58) Field of Classification Search .............. 708/319, 708/322, 323
See application file for complete search history.

(56) References Cited

U.S. PATENT DOCUMENTS

| | | | | |
|---|---|---|---|---|
| 4,494,214 A | * | 1/1985 | Bernard et al. | 708/322 |
| 5,602,765 A | * | 2/1997 | Tanaka et al. | 708/322 |
| 5,777,912 A | * | 7/1998 | Leung et al. | 708/319 |
| 6,285,709 B1 | * | 9/2001 | Alelyunas et al. | 375/233 |

FOREIGN PATENT DOCUMENTS

JP    5-160675    6/1993

OTHER PUBLICATIONS

John W. Adams et al, "A New Approach to FIR Digital Filters with Fewer Multipliers and Reduced Sensitivity", IEEE Transactions on Computer Aided Design of Integrated Circuits and Systems, IEEE. New York, US vol. CAS–30, No. 5, May 1983, pp. 277–283, XP0080377549 ISSN: 0278–0070.

* cited by examiner

*Primary Examiner*—D. H. Malzahn
(74) *Attorney, Agent, or Firm*—Rader, Fishman & Grauer, PLLC; Ronald P. Kananen

(57) ABSTRACT

An FIR filter and setting method of filter coefficients thereof enabling the prevention of breakdown of equi-ripple of weighted approximation error and preservation of gain of the pass band into approximately constant. The setting method includes five steps. The initial setting step is that setting of the FIR filter, setting of the band, setting of coefficients of a pre-filter, and setting of initial extreme value point. The first step is that interpolation polynomial equation is generated for interpolating amplitude characteristic from the present extreme value point of the amplitude characteristic of the frequency. The second step is that a new extreme value point is determined from the amplitude characteristic obtained from the interpolation polynomial equation that is obtained in the first step. The third step is that judgement is performed whether or not position of the extreme value is approximated within required range while repeating the first step and the second step. The fourth step is that finding of the filter coefficients is performed from the approximated amplitude characteristic obtained in the third step.

78 Claims, 32 Drawing Sheets

FIG.3A
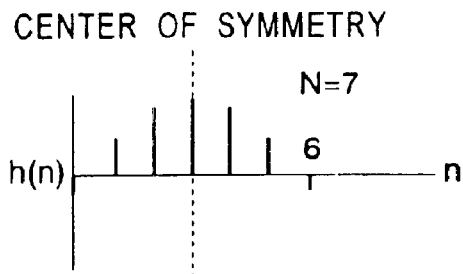
CASE 1: ODD NUMBER TAP, EVEN SYMMETRY
FIG.3B
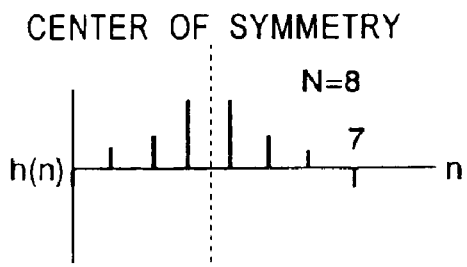
CASE 2: EVEN NUMBER TAP, EVEN SYMMETRY
FIG.3C
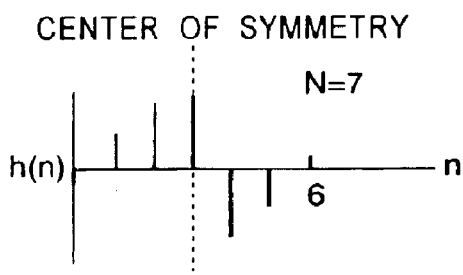
CASE 3: ODD NUMBER TAP, ODD SYMMETRY
FIG.3D
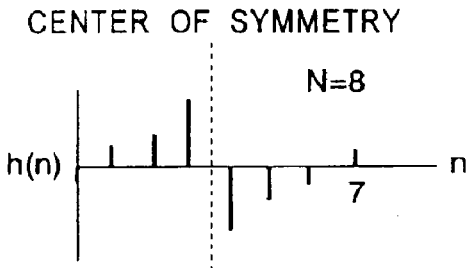
CASE 4: EVEN NUMBER TAP, ODD SYMMETRY
FIG.4
| CASE | $Q(e^{j\omega})$ | R |
|---|---|---|
| 1 | 1 | $(L-1)/2+1$ |
| 2 | $\cos(\omega/2)$ | $L/2-1+1$ |
| 3 | $\sin(\omega)$ | $(L-3)/2+1$ |
| 4 | $\sin(\omega/2)$ | $L/2-1+1$ |

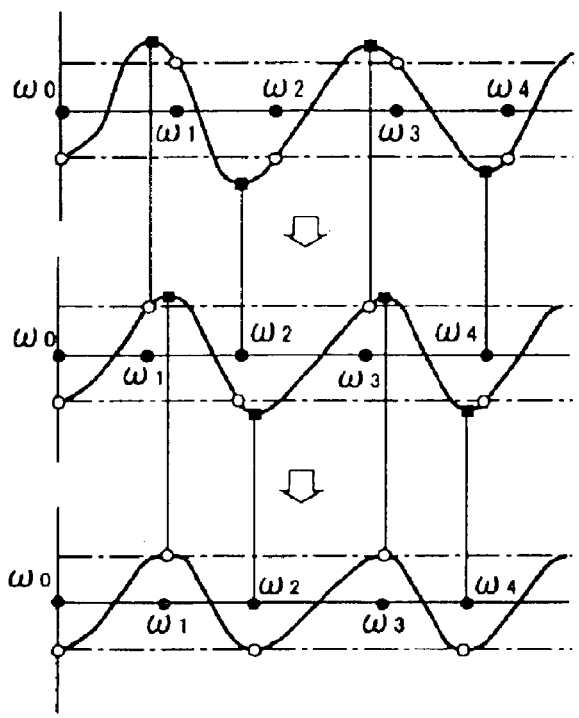
FIG.7A
FIG.7B
FIG.7C
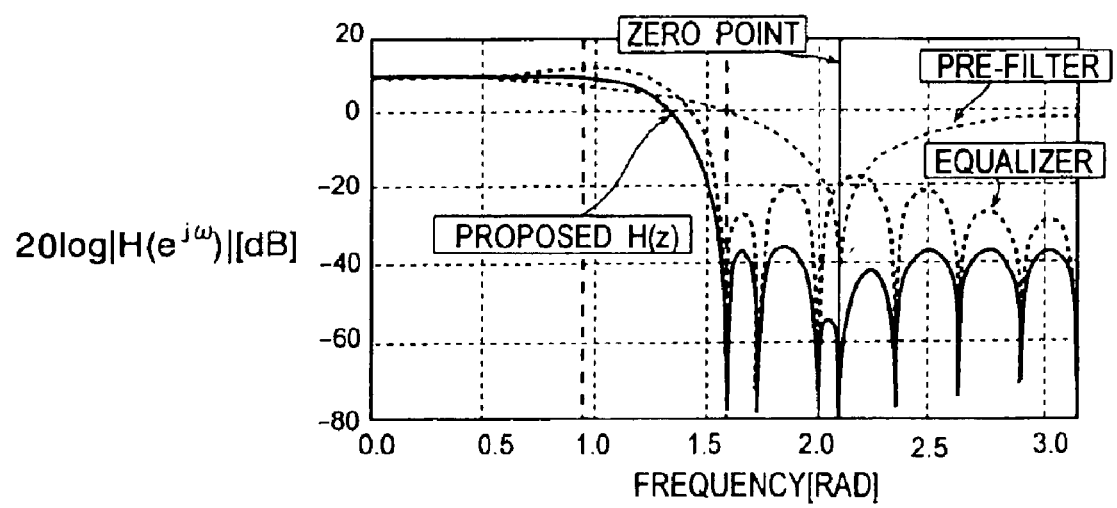
FIG.8

BOTH SATISFY
→END

FREQUENCY WITH LARGE $\omega_p$
IS SOLUTION IN THIS CASE
SOLUTION IS $\omega_p^{(pre)}$

BOTH DO NOT SATISFY
→NO SOLUTION→END

NO SOLUTION IN THE
NUMBER OF TAPS IN
THAT IT DOES NOT
SATISFY ATTENUATION
QUANTITY

ONLY ONE SIDE
SATISFIES
→FOR NEXT STEP

FIG.15A
ONLY ONE SIDE
SATISFIES
→FOR NEXT STEP
DESIGNATED
ATTENUATION
QUANTITY
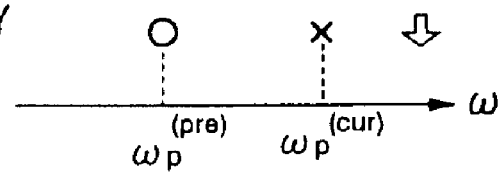
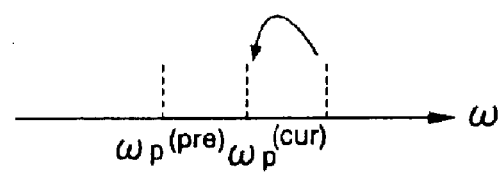
FIG.15B
BOTH SATISFY
→FOR NEXT STEP
DESIGNATED
ATTENUATION
QUANTITY
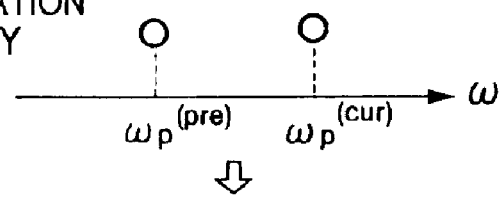
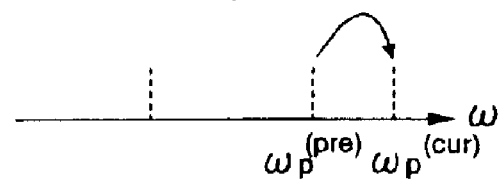

FIG. 19A
BOTH SATISFY
→END
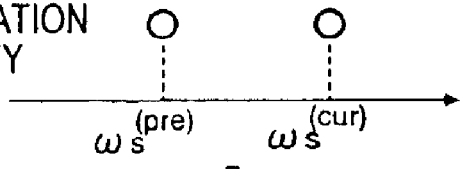
⇩
FREQUENCY WITH SMALL $\omega s$
IS SOLUTION IN THIS CASE
SOLUTION IS $\omega s^{(pre)}$
FIG. 19B
BOTH DO NOT SATISFY
→NO SOLUTION→END
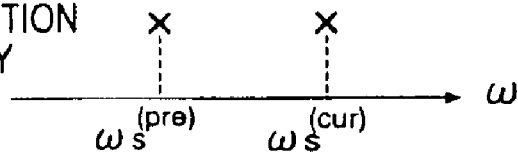
⇩
NO SOLUTION IN THE
NUMBER OF TAPS IN
THAT IT DOES NOT
SATISFY ATTENUATION
QUANTITY
FIG. 19C
ONLY ONE SIDE
SATISFIES
→FOR NEXT STEP
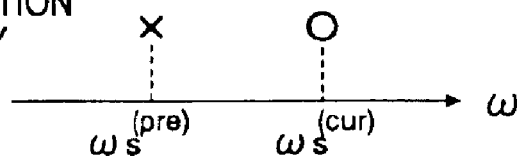
⇩
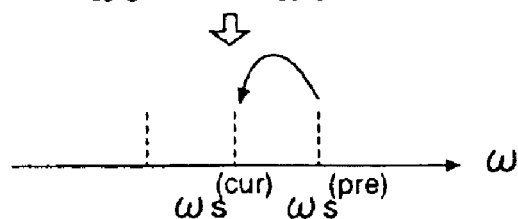

ONLY ONE SIDE
SATISFIES
→FOR NEXT STEP

BOTH SATISFY
→FOR NEXT STEP

FIG. 27A
BOTH SATISFY
→END
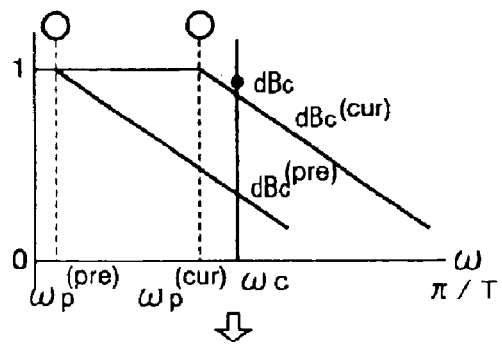
⇩
FREQUENCY WITH LARGE $\omega_p$
IS SOLUTION IN THIS CASE
SOLUTION IS $\omega_p^{(cur)}$
FIG. 27B
BOTH DO NOT SATISFY
→NO SOLUTION→END
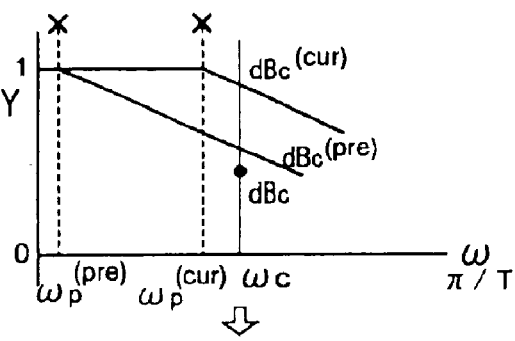
⇩
NO SOLUTION IN THE NUMBER OF TAPS
IN THAT IT IS NOT PASSED THROUGH
POINT ($\omega_c$, dBc)
OF TRANSITION BAND
FIG. 27C
ONLY ONE SIDE
SATISFIES
→FOR NEXT STEP
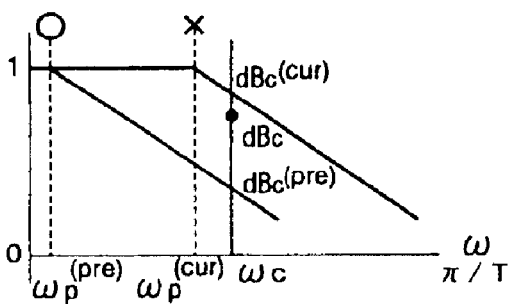
⇩
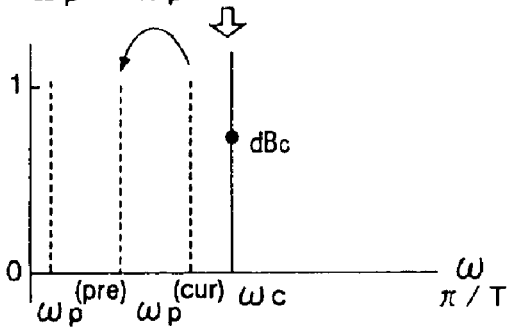

FIG.28A
ONLY ONE SIDE
SATISFIES
→FOR NEXT STEP
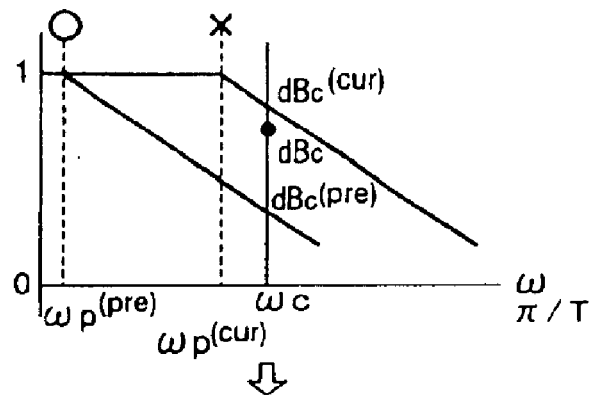
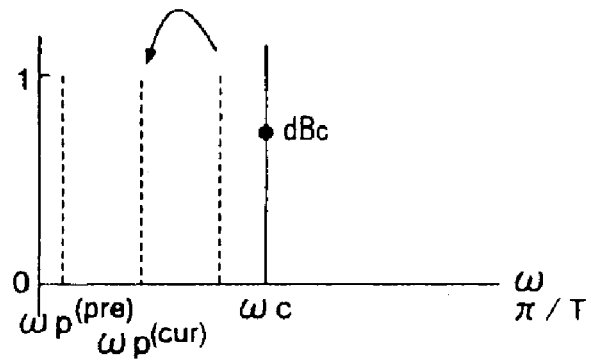
FIG.28B
BOTH SATISFY→FOR
NEXT STEP
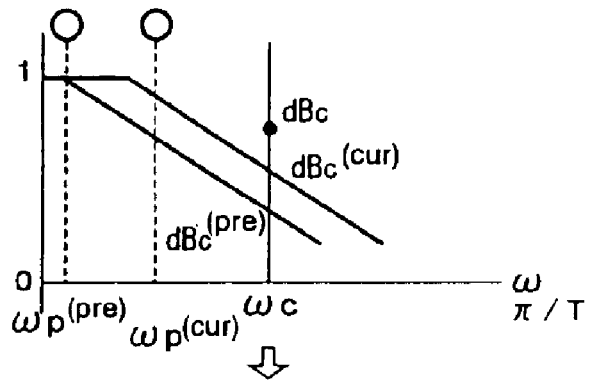
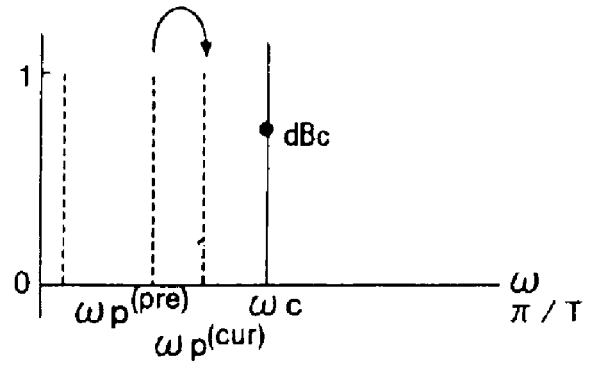

BOTH SATISFY
→END

FREQUENCY WITH LARGE $\omega s$
IS SOLUTION IN THIS CASE
SOLUTION IS $\omega s^{(cur)}$

BOTH DO NOT SATISFY
→NO SOLUTION→END

NO SOLUTION IN THE NUMBER
OF TAPS IN THAT IT IS NOT
PASSED THROUGH FREQUENCY
OF TRANSITION BAND

ONLY ONE SIDE
SATISFIES
→FOR NEXT STEP

ONLY ONE SIDE
SATISFIES
→FOR NEXT STEP

BOTH SATISFY
→FOR NEXT STEP

FIR FILTER AND SETTING METHOD OF COEFFICIENT THEREOF

BACKGROUND OF THE INVENTION

1. Field of the Invention

The present invention relates to an FIR filter and method of setting coefficients of the FIR filter that are necessary for digital signal processing.

2. Description of the Related Art

In the digital signal processing for picture and/or voice, filter processing is often used. Linear-phase FIR (Finite Impulse Response) filter is often utilized as the filter for digital signal processing of picture and/or voice in that the linear-phase FIR filter has the characteristics that its number of taps is finite and has a linear-phase.

FIG. 1 is a view illustrating circuit configuration of a transversal type filter of the linear-phase FIR filter.

The linear-phase FIR filter 1, as illustrated in FIG. 1, has (n-1) delay units 2-1 to 2-(n-1) that constitute a shift register connected to an input terminal $T_{IN}$ with cascade connection, n multipliers 3-1 to 3-n for multiplying a signal input to the input terminal $T_{IN}$ and output signals of respective delay units 2-1 to 2-(n-1) by filter coefficients h (0) to h (n-1) respectively, and an adder 4 for adding n output signals of the multipliers 3-1 to 3-n to output to an output terminal $T_{OUT}$.

As a typical method for designing such the linear-phase FIR filter, for instance, these are known Remez Exchange algorithms which Parks, T. W. and McCleLLan, J. H. et al. apply it to the linear-phase FIR filter (Parks, T. W. and McClellan, J. H.: "*Chebyshev Approximation for Non-recursive Digital Filters with Linear Phase*", IEEE Trans. Circuit Theory, CT-19, 2, pp. 189–194, 1972, as well as Rabiner, L. R., McClellan, .J .H. and Parks, T. W.: "*FIR Digital Filter Design Techniques Using Weighted Chebyshev Approximation*", Proc. IEEE, Vol 63, April, pp.595–610, 1975).

The Remez Exchange algorithm is an algorithm in which a weighted approximation error is approximated such that the weighted approximation error is made to configure equi-ripple to the desired amplitude characteristics.

There is known a resolution conversion of a picture that utilizes the sampling rate conversion as the application of the filter processing using the linear-phase FIR filter.

In this resolution conversion, multi-rate filter which has an interpolator, a decimeter and the linear-phase FIR filter as element-technique is employed (see, P. P. Vaidyanathan: "*Multirate System and Filter Banks*", Prentice Hall, 1992).

In use of the multi-rate filter, generally, the linear-phase FIR filter is made to be used in such a way as to execute a polyphase-sort (dissolution) in order to adjust the interpolator. Both the interpolator and the decimeter form periodic time invariance systems, thus having different characteristics from the time invariance system.

Distortion so called as the chessboard distortion on a lattice occurs in the resolution conversion of the picture caused by the periodic time invariance property of the interpolator.

Accordingly, Harada, and Takaie considered the condition for avoiding such chessboard distortion from the viewpoint of a zero-point arrangement of a filter (see, Yasuhiro Harada, Hitoshi Kiya,: "*Multi-rate Filter without Accompanying Chessboard Distortion and its Zero-point Arrangement*" The technical Report of IEICE CAS96-78, pp1–6, 1997-01).

A transfer function H (z) for the multi-rate filter without accompanying the chessboard distortion will be discussed. The transfer function H (z) is capable of being found in such a way as to multiply a transfer function K (z) of the linear-phase FIR filter (hereinafter referred to as an equalizer) designed by a method in some kind by the transfer function Z (z) of the zero-point in order to avoid the chessboard distortion later.

$$H(z)=Z(z) \cdot K(z) \quad (1)$$

$$Z(z)=1+z^{-1}+z^{-2}+\cdots+z^{-(u-1)} \quad (2)$$

Here, a linear-phase FIR filter fixed beforehand such as the transfer function Z (z) of the zero-point for avoiding the chessboard distortion is called as a pre-filter.

FIG. 2 shows an example of a frequency response of the multi-rate filter and a weighted approximation error, in which the chessboard distortion is avoided by multiplying the equalizer designed by the use of Remez Exchange algorithms and the pre-filter.

However, it suffers from the disadvantage in the avoiding method of the chessboard distortion according to the aforementioned method.

Namely, as illustrated in FIG. 2C, in the multi-rate filter having the transfer function H (z) designed depending on the conventional method, the equi-ripple of the weighted approximation error designed depending on the Remez Exchange algorithms is not established.

Further, as illustrated in FIG. 2B, the multi-rate filter designed depending on the conventional method, has a gain of its pass band with non-fixed value in which a right end is attenuated.

If the resolution conversion is executed using such filter, contours of picture appears fuzzy and thus, adversely affect quality of the picture.

The attenuation of this pass band cannot be avoided even though the number of coefficient of filter is increased.

SUMMARY OF THE INVENTION

An object of the present invention is to provide an FIR filter and setting method of its coefficients in which the equi-ripple of the weighted approximation error is not established, and further it is possible to maintain a gain of the pass band at approximately a constant value.

In order to achieve the above-mentioned objects, an FIR filter of the present invention has a configuration in which an impulse response is expressed by using a finite time length. This impulse response is equivalent to a filter coefficient of the FIR filter, and the FIR filter's transfer function H (z) is related to a transfer function Z (z) of a pre-filter, wherein the filter coefficient is set by performing a weighted approximation to the desired characteristics in relation to the frequency response of the pre-filter.

Also, an FIR filter of the present invention has a configuration in which the FIR filter's impulse response is expressed by using a finite time length. This impulse response is equivalent to a filter coefficient of the FIR filter, and whose transfer function H (z) is related to a transfer function Z (z) of a pre-filter, and a transfer function K (z) of an equalizer, wherein the filter coefficient is set on the basis of an amplitude characteristic of the equalizer that is obtained in such a way as to execute a weighted approximation to the desired characteristics in relation to a frequency response of the pre-filter.

Also, a method of setting filter coefficients of an FIR filter of the present invention has a method in which the FIR filter's impulse response is expressed by using a finite time length, this impulse response is equivalent to a filter coefficient of the FIR filter, and whose transfer function H (z) is related to a transfer function Z (z) of a pre-filter, wherein the filter coefficient is calculated by performing a weighted approximation to the desired characteristics in relation to a frequency response of the pre-filter.

Also, a method of setting filter coefficients of an FIR filter of the present invention has a method in which the FIR filter's impulse response is expressed by using a finite time length. This impulse response is equivalent to a filter coefficient of the FIR filter, and whose transfer function H (z) is related to a transfer function Z (z) of a pre-filter and a transfer function K (z) of an equalizer, wherein the filter coefficient is calculated depending on an amplitude characteristic of the equalizer, which is obtained in such a way as to execute a weighted approximation to the desired characteristics in relation to a frequency response of the pre-filter.

Also, a setting method of filter coefficients of an FIR filter of the present invention has a method in which weighted approximation is executed to the desired characteristics by using Remez Exchange algorithms taking into account a frequency response of a pre-filter.

Also, a method of setting filter coefficients of an FIR filter of the present invention has a method in which the FIR filter's impulse response is expressed by a finite time length. This impulse response is equivalent to a filter coefficient. The setting method of a filter coefficient of the FIR filter comprises: a first step for generating an interpolation polynomial equation for interpolating an amplitude characteristic from an extreme value point of the amplitude characteristic of a frequency; a second step for determining a new extreme value point from the amplitude characteristic obtained from the interpolation polynomial equation that is generated in the first step; a third step for judging whether or not a position of the extreme value is approximated within a required range by repeating the operation in the first step and the second step; and a fourth step for finding the filter coefficient from the approximated amplitude characteristic obtained in the third step.

Also, a method of setting filter coefficients of an FIR filter of the present invention has a method in which there is further provided an initial setting step for carrying out, at least, setting of the FIR filter, setting of the band, setting of coefficient of a pre-filter, and setting of initial extreme value point, before executing the operation the first step.

Also, a method of setting filter coefficients of an FIR filter of the present invention has a method wherein, in the second step and the third step, the extreme-value of weighted approximation error calculated from the extreme-value point used for the interpolation is searched for the entire approximation band, then an obtained extreme-value is taken to be a new extreme-value point, and it is judged that the optimum approximation is obtained when the position of the extreme-value is not changed.

Also, a method of setting filter coefficients of an FIR filter of the present invention has a method in which, in the fourth step, the filter coefficient is calculated by performing a weighted approximation to the desired characteristics in relation to a frequency response of the pre-filter.

Also, a method of setting filter coefficients of an FIR filter of the present invention has a method in which, in the fourth step, the filter coefficient is calculated depending on an amplitude characteristic of the equalizer obtained in such a way as to execute a weighted approximation to the desired characteristics in relation to a frequency response of the pre-filter.

Also, according to the invention an FIR filter has an impulse response expressed by using a finite time length, the impulse response being equivalent to a filter coefficient of the FIR filter, the FIR filter having an arbitrary number of taps, and whose transfer function H (z) is related to a transfer function Z (z) of a pre-filter, wherein the filter coefficient is set in such a way as to perform a weighted approximation to the desired characteristics so as to satisfy an attenuation quantity of a stop band in relation to a frequency response of the pre-filter which satisfies the attenuation quantity of the stop band, when the number of taps is variable and the bandwidth is fixed.

Also, an FIR filter has an impulse response expressed by using a finite time length, the impulse response being equivalent to a filter coefficient of the FIR filter, the FIR filter having an arbitrary number of taps, and whose transfer function H (z) is related to a transfer function Z (z) of a pre-filter and transfer function K (z) of an equalizer, wherein the filter coefficient is set on the basis of an amplitude characteristic of the equalizer obtained in such a way as to perform a weighted approximation to the desired characteristics so as to satisfy an attenuation quantity of a stop band in relation to a frequency response of the pre-filter which satisfies the attenuation quantity of the stop band, when the number of taps is variable and the bandwidth is fixed.

Also, a method of setting filter coefficients of an FIR filter of the present invention has a method in which the FIR filter's impulse response is expressed by using a finite time length wherein, this impulse response is equivalent to a filter coefficient of the FIR filter, the FIR filter has arbitrary number of taps, and whose transfer function H (z) is related to a transfer function Z (z) of a pre-filter, wherein the filter coefficient is calculated by performing a weighted approximation to the desired characteristics so as to satisfy an attenuation quantity of a stop band in relation to the frequency response of the pre-filter which satisfies an attenuation quantity of the stop band, when the band is fixed and the number of taps is made variable.

Also, a method of setting filter coefficients of an FIR filter of the present invention has a method in which the FIR filter's impulse response is expressed by using a finite time length, wherein this impulse response is equivalent to a filter coefficient of the FIR filter, the FIR filter has an arbitrary number of taps, and whose transfer function H (z) is related to a transfer function Z (z) of a pre-filter and a transfer function K (z) of an equalizer, wherein the filter coefficient is calculated depending on an amplitude characteristic of the equalizer obtained in such a way as to execute a weighted approximation to the desired characteristics so as to satisfy an attenuation quantity of a stop band in relation to the frequency response of the pre-filter which satisfies an attenuation quantity of the stop band, when the band is fixed and the number of taps is made variable.

Also, a method of setting filter coefficients of an FIR filter of the present invention has a method in which the FIR filter's impulse response is expressed by using a finite time length, in which this impulse response is equivalent to a filter coefficient of the FIR filter, and the FIR filter's number of tap is variable, and whose band is fixed, which the setting method of a filter coefficient of an FIR filter comprises the steps of: a first step for generating an interpolation polynomial equation for interpolating an amplitude characteristic from an extreme value point of the amplitude characteristic of the frequency; a second step for determining a new extreme value point from the amplitude characteristic obtained from the interpolation polynomial equation that is obtained in the first step; a third step for judging whether or not a position of the extreme value is approximated within a required range while repeating the first step and the second step; a fourth step for examining an attenuation quantity of a stop band from the approximated amplitude characteristic obtained in the third step; a fifth step for comparing the examined attenuation quantity with the attenuation quantity of the stop band thus designated to judge whether or not a result of the comparison satisfies a predetermined condition; a sixth step for changing the number of taps when a result of the comparison of the fifth step does not satisfy the predetermined condition; and a seventh step for finding the filter coefficient from the amplitude characteristic thus approximated depending on the third step which satisfies the predetermined condition in the fifth step.

Also a method of setting filter coefficients of an FIR filter of the present invention has a method, wherein there is provided at least an initial setting step for carrying out a setting of the FIR filter, setting of the band, setting of a coefficient of a pre-filter, and setting of an initial extreme value point, before executing the first step.

Also, a method of setting filter coefficients of an FIR filter of the present invention has a method, in the fourth step, in which the minimum attenuation quantity in the stop band is examined, and in the sixth step, the number of the taps is increased.

Also, a method of setting filter coefficients of an FIR filter of the present invention has a method, in the above described seventh step, in which the filter coefficient is calculated by performing a weighted approximation with reference to the desired characteristics so as to satisfy an attenuation quantity of a stop band in relation to a frequency response of the pre-filter that satisfies the attenuation quantity of the stop band when a band is fixed and the number of taps is made variable.

Also, a method of setting filter coefficients of an FIR filter of the present invention has a method, in the above described seventh step, in which the filter coefficient is calculated depending on an amplitude characteristic of an equalizer obtained in such a way as to execute a weighted approximation with reference to the desired characteristics so as to satisfy an attenuation quantity of a stop band in relation to frequency response of the pre-filter that satisfies the attenuation quantity of the stop band when a band is fixed and the number of taps is made variable.

Also, an FIR filter of the present invention has a configuration in which the FIR filter's impulse response is expressed by using a finite time length, where in this impulse response is equivalent to a filter coefficient of the FIR filter, the FIR filter has an arbitrary number of taps, and whose transfer function H (z) is related to a transfer function Z (z) of a pre-filter, wherein the filter coefficient is set in such a way as to execute a weighted approximation to the desired characteristics so as to satisfy an attenuation quantity of a stop band in relation to a frequency response of the pre-filter which satisfies an attenuation quantity of a stop band, when the number of taps is fixed and band setting is changeable.

Also, an FIR filter of the present invention has a configuration in which the FIR filter's impulse response is expressed by using a finite time length, wherein this impulse response is equivalent to a filter coefficient of the FIR filter, the FIR filter has arbitrary number of taps, and whose transfer function H (z) is related to a transfer function Z (z) of a pre-filter and transfer function K (z) of an equalizer, wherein the filter coefficient is set on the basis of an amplitude characteristic of the equalizer obtained in such a way as to execute a weighted approximation to the desired characteristics so as to satisfy an attenuation quantity of a stop band in relation to frequency response of the pre-filter which satisfies an attenuation quantity of a stop band, when the number of taps is fixed and band setting is changeable.

Also, a method of setting filter coefficients of an FIR filter of the present invention has a method in which the FIR filter's impulse response is expressed by using a finite time length, wherein this impulse response is equivalent to a filter coefficient of the FIR filter, the FIR filter has arbitrary number of taps, and whose transfer function H (z) is related to a transfer function Z (z) of a pre-filter, wherein the filter coefficient is calculated by performing a weighted approximation to the desired characteristics so as to satisfy an attenuation quantity of a stop band in relation to the frequency response of the pre-filter which satisfies an attenuation quantity of the stop band, when the number of taps is fixed and band setting is changeable.

Also, a method of setting filter coefficients of an FIR filter of the present invention has a method in which the FIR filter's impulse response is expressed by using a finite time length, this impulse response is equivalent to a filter coefficient of the FIR filter, the FIR filter has arbitrary number of taps, and whose transfer function H (z) is related to a transfer function Z (z) of a pre-filter and a transfer function K (z) of an equalizer, wherein the filter coefficient is calculated depending on an amplitude characteristic of the equalizer obtained in such a way as to execute a weighted approximation to the desired characteristics so as to satisfy an attenuation quantity of a stop band in relation to the frequency response of the pre-filter which satisfies an attenuation quantity of the stop band, when the number of taps is fixed and band setting is changeable.

Also, a method of setting filter coefficients of an FIR filter of the present invention has a method in which the FIR filter's impulse response is expressed by using a finite time length, wherein this impulse response is equivalent to a filter coefficient of the FIR filter, and the FIR filter's number of taps is fixed, and whose band setting is changeable, the setting method of a filter coefficient of an FIR filter comprises the steps of: a first step for generating an interpolation polynomial equation for interpolating an amplitude characteristic from an extreme value point of the amplitude characteristic of the frequency; a second step for determining a new extreme value point from the amplitude characteristic obtained from the interpolation polynomial equation that is obtained in the first step; a third step for judging whether or not a position of the extreme value is approximated within a required range while repeating the first step and the second step; a fourth step for examining an attenuation quantity of a stop band from the approximated amplitude characteristic obtained in the third step; a fifth step for comparing the examined attenuation quantity with the attenuation quantity of the stop band thus designated to judge whether or not a result of the comparison satisfies a predetermined condition; a sixth step for changing the band setting when a result of the comparison of the fifth step does not satisfy the predetermined condition; and a seventh step for finding the filter coefficient from the amplitude characteristic thus approximated depending on the third step which satisfies the predetermined condition in the fifth step.

Also, a method of setting filter coefficients of an FIR filter of the present invention has a method, wherein there is provided an initial setting step for carrying out, at least, setting of the FIR filter, setting of the band, setting of a coefficient of a pre-filter, and setting of an initial extreme value point, before executing the first step.

Also, a method of setting filter coefficients of an FIR filter of the present invention has a method, in the fourth step, in which the minimum attenuation quantity in the stop band is examined.

Also, a method of setting filter coefficients of an FIR filter of the present invention, in the above described seventh step, has a step the filter coefficient is calculated by performing a weighted approximation with reference to the desired characteristics so as to satisfy an attenuation quantity of a stop band in relation to a frequency response of the pre-filter that satisfies the attenuation quantity of the stop band when the number of taps is fixed and the band setting is changeable.

Also, a method of setting filter coefficients of an FIR filter of the present invention has a method, in the above described seventh step, wherein the filter coefficient is calculated depending on an amplitude characteristic of an equalizer obtained in such a way as to execute a weighted approximation with reference to the desired characteristics so as to satisfy an attenuation quantity of a stop band in relation to a frequency response of the pre-filter that satisfies the attenuation quantity of the stop band when the number of taps is fixed and the band setting is changeable.

Also, an FIR filter of the present invention has a configuration in which the FIR filter's impulse response is expressed by using a finite time length, wherein this impulse response is equivalent to a filter coefficient of the FIR filter, the FIR filter has an arbitrary number of taps, and whose transfer function H (z) is related to a transfer function Z (z) of a pre-filter, wherein the filter coefficient is set in such a way as to execute a weighted approximation to the desired characteristics so as to satisfy an attenuation quantity of a stop band in relation to a frequency response of the pre-filter which satisfies an attenuation quantity of a stop band, when the number of taps is variable and band setting is changeable.

Also, an FIR filter of the present invention has a configuration in which the FIR filter's impulse response is expressed by using a finite time length, in which this impulse response is equivalent to a filter coefficient of the FIR filter, the FIR filter has arbitrary number of taps, and whose transfer function H (z) is related to a transfer function Z (z) of a pre-filter and a transfer function K (z) of an equalizer, wherein the filter coefficient is set on the basis of an amplitude characteristic of the equalizer obtained in such a way as to execute a weighted approximation to the desired characteristics so as to satisfy an attenuation quantity of a stop band in relation to a frequency response of the pre-filter which satisfies an attenuation quantity of a stop band, when the number of taps is variable and band setting is changeable.

Also, a method of setting filter coefficients of an FIR filter of the present invention has a way in which the FIR filter's impulse response is expressed by using a finite time length, wherein this impulse response is equivalent to a filter coefficient of the FIR filter, the FIR filter has arbitrary number of taps, and whose transfer function H (z) is related to a transfer function Z (z) of a pre-filter, wherein the filter coefficient is calculated by performing a weighted approximation to the desired characteristics so as to satisfy an attenuation quantity of a stop band in relation to the frequency response of the pre-filter which satisfies an attenuation quantity of the stop band, when the number of taps is variable and band setting is changeable.

Also, a method of setting filter coefficients of an FIR filter of the present invention has a way in which the FIR filter's impulse response is expressed by using a finite time length, wherein this impulse response is equivalent to a filter coefficient of the FIR filter, the FIR filter has an arbitrary number of taps, and whose transfer function H (z) is related to a transfer .function Z (z) of a pre-filter and a transfer function K (z) of an equalizer, wherein the filter coefficient is calculated depending on an amplitude characteristic of the equalizer obtained in such a way as to execute a weighted approximation to the desired characteristics so as to satisfy an attenuation quantity of a stop band in relation to the frequency response of the pre-filter which satisfies an attenuation quantity of the stop band, when the number of taps is variable and band setting is changeable.

Also, a method of setting filter coefficients of an FIR filter of the present invention has a way in which the FIR filter's impulse response is expressed by using a finite time length, wherein this impulse response is equivalent to a filter coefficient of the FIR filter, and the FIR filter's number of taps is variable, and whose band setting is changeable, the setting method of a filter coefficient of an FIR filter comprises the steps of: a first step for generating an interpolation polynomial equation for interpolating an amplitude characteristic from an extreme value point of the amplitude characteristic of the frequency; a second step for determining a new extreme value point from the amplitude characteristic obtained from the interpolation polynomial equation that is obtained in the first step; a third step for judging whether or not a position of the extreme value is approximated within a required range while repeating the first step and the second step; a fourth step for examining an attenuation quantity of a stop band from the approximated amplitude characteristic obtained in the third step; a fifth step for comparing the examined attenuation quantity with the attenuation quantity of the stop band thus designated to judge whether or not a result of the comparison satisfies a predetermined condition; a sixth step for changing the band setting when a result of the comparison of the fifth step does not satisfy the predetermined condition; a seventh step for judging whether or not the present number of taps are capable of satisfying the attenuation quantity of the stop band after changing of the band in the sixth step; an eighth step for changing the number of taps when a judgement is performed that the present number of taps do not satisfy the attenuation quantity of the stop band in the seventh step; and a ninth step for finding the filter coefficient from the amplitude characteristic thus approximated depending on the third step which satisfies the predetermined condition in the fifth step.

Also, a method of setting filter coefficients of an FIR filter of the present invention has a way, wherein there is provided at least an initial setting step for carrying out setting of the FIR filter, setting of the band, setting of coefficients of a pre-filter, and setting of an initial extreme value point, before executing the first step.

Also, a method of setting filter coefficients of an FIR filter of the present invention has a way, in the fourth step, in which the minimum attenuation quantity in the stop band is examined, and in the eighth step, the number of the taps is increased.

Also, a method of setting filter coefficients of an FIR filter of the present invention has a way, in the above described ninth step, wherein the filter coefficient is calculated by performing a weighted approximation with reference to the desired characteristics so as to satisfy an attenuation quantity of a stop band in relation to a frequency response of the pre-filter that satisfies the attenuation quantity of the stop band when the number of taps is variable and band setting is changeable.

Also, a method of setting filter coefficients of an FIR filter of the present invention has a way, in the above described ninth step, in which the filter coefficient is calculated depending on an amplitude characteristic of an equalizer obtained in such a way as to execute a weighted approximation with reference to the desired characteristics so as to satisfy an attenuation quantity of a stop band in relation to a frequency response of the pre-filter that satisfies the attenuation quantity of the stop band when the number of taps is variable and the band setting is changeable.

Also, an FIR filter of the present invention has a configuration in which the FIR filter's impulse response is expressed by using a finite time length, wherein this impulse response is equivalent to a filter coefficient of the FIR filter, the FIR filter has arbitrary number of taps, and whose transfer function H (z) is related to a transfer function Z (z) of a pre-filter, wherein the filter coefficient is set in such a way as to execute a weighted approximation to the desired characteristics so as to satisfy an attenuation quantity of a stop band in relation to a frequency response of the pre-filter through which the attenuation quantity of the designated frequency of a transition band is passed, and which satisfies an attenuation quantity of a stop band, when the number of taps is made fixed and a band setting is changeable.

Also, an FIR filter of the present invention has a configuration in which the FIR filter's impulse response is expressed by using a finite time length, so that this impulse response is equivalent to a filter coefficient of the FIR filter, the FIR filter has arbitrary number of taps, and whose transfer function H (z) is related to a transfer function Z (z) of a pre-filter and a transfer function K (z) of an equalizer, wherein the filter coefficient is set on the basis of an amplitude characteristic of the equalizer obtained in such a way as to execute a weighted approximation to the desired characteristics so as to satisfy an attenuation quantity of a stop band in relation to a frequency response of the pre-filter through which the attenuation quantity of the designated frequency of a transition band is passed, and which satisfies an attenuation quantity of a stop band, when the number of taps is fixed and band setting is changeable.

Also, a method of setting filter coefficients of an FIR filter of the present invention has a way in which the FIR filter's impulse response is expressed by using a finite time length, in which this impulse response is equivalent to a filter coefficient of the FIR filter, the FIR filter has an arbitrary number of taps, and whose transfer function H (z) is related to a transfer function Z (z) of a pre-filter, wherein the filter coefficient is calculated by performing a weighted approximation to the desired characteristics so as to satisfy an attenuation quantity of a stop band in relation to the frequency response of the pre-filter through which an attenuation quantity of the designated frequency of a stop band is passed, and which satisfies an attenuation quantity of the stop band, when the number of taps is fixed and band setting is changeable.

Also, a method of setting filter coefficients of an FIR filter of the present invention has a way in which the FIR filter's impulse response is expressed by using a finite time length, in which this impulse response is equivalent to a filter coefficient of the FIR filter, the FIR filter has an arbitrary number of taps, and whose transfer function H (z) is related to a transfer function Z (z) of a pre-filter and a transfer function K (z) of an equalizer, wherein the filter coefficient is calculated depending on an amplitude characteristic of the equalizer obtained in such a way as to execute a weighted approximation to the desired characteristics so as to satisfy an attenuation quantity of a stop band in relation to the frequency response of the pre-filter through which an attenuation quantity of the designated frequency of a stop band is passed, and which satisfies an attenuation quantity of the stop band, when the number of taps is fixed and band setting is changeable.

Also, a method of setting filter coefficients of an FIR filter of the present invention has a way in which the FIR filter's impulse response is expressed by using a finite time length, so that this impulse response is equivalent to a filter coefficient of the FIR filter, and the FIR filter's number of taps is fixed, and whose band setting is changeable, the setting method of a filter coefficient of an FIR filter comprises the steps of: a first step for generating an interpolation polynomial equation for interpolating an amplitude characteristic from an extreme value point of the amplitude characteristic of the frequency; a second step for determining a new extreme value point from the amplitude characteristic obtained from the interpolation polynomial equation that is obtained in the first step; a third step for judging whether or not a position of the extreme value is approximated within a required range while repeating the first step and the second step; a fourth step for examining an attenuation quantity of a stop band from the approximated amplitude characteristic obtained in the third step; a fifth step for comparing the examined attenuation quantity in the fourth step with the attenuation quantity of the stop band thus designated to judge whether or not a result of the comparison satisfies a predetermined condition; a sixth step for changing the band setting when a result of the comparison of the fifth step does not satisfy the predetermined condition; a seventh step for examining an attenuation quantity of the designated frequency of the transition band which attenuation quantity satisfies a predetermined condition in the fifth step; an eighth step for comparing the attenuation quantity of the designated frequency of the transition band that is examined in the seventh step with the attenuation quantity of the designated transition band, and for judging whether or not a result of the comparison satisfies a predetermined condition; a ninth step for changing setting of the band when a result of the comparison of the seventh step does not satisfy the predetermined condition; and a tenth step for finding the filter coefficient from the amplitude characteristic thus approximated depending on the seventh step which amplitude characteristic satisfies the predetermined condition.

Also, a method of setting filter coefficients of an FIR filter of the present invention has a way, wherein there is provided at least an initial setting step for carrying out setting of the FIR filter, setting of the band, setting of coefficient of a pre-filter, and setting of initial extreme value point, before executing the first step.

Also, a method of setting filter coefficients of an FIR filter of the present invention has a way, in the fourth step, wherein the minimum attenuation quantity in the stop band is examined.

Also, a method of setting filter coefficients of an FIR filter of the present invention has a way, in the above described tenth step, wherein the filter coefficient is calculated by performing a weighted approximation with reference to the desired characteristics so as to satisfy an attenuation quantity of a stop band in relation to a frequency response of the pre-filter that satisfies the attenuation quantity of the stop band, and that causes the attenuation quantity of the designated frequency of the transition band to pass when the number of taps is fixed and band setting is changeable.

Also, a method of setting filter coefficients of an FIR filter of the present invention has a way, in the above described tenth step, in which the filter coefficient is calculated depending on an amplitude characteristic of an equalizer obtained in such a way as to execute a weighted approximation with reference to the desired characteristics so as to satisfy an attenuation quantity of a stop band in relation to a frequency response of the pre-filter that satisfies the attenuation quantity of the stop band, and that causes the attenuation quantity of the designated frequency of the transition band to pass when the number of taps is fixed and the band setting is changeable.

Also, an FIR filter of the present invention has a configuration in which the FIR filter's impulse response is expressed by using a finite time length, wherein this impulse response is equivalent to a filter coefficient of the FIR filter, the FIR filter has an arbitrary number of taps, and whose transfer function H (z) is related to a transfer function Z (z) of a pre-filter, wherein the filter coefficient is set in such a way as to execute a weighted approximation to the desired characteristics so as to satisfy an attenuation quantity of a stop band in relation to a frequency response of the pre-filter through which the attenuation quantity of the designated frequency of a transition band is passed, and which satisfies an attenuation quantity of a stop band, when the number of taps is variable and band setting is changeable.

Also, an FIR filter of the present invention has a configuration in which the FIR filter's impulse response is expressed by using a finite time length, wherein this impulse response is equivalent to a filter coefficient of the FIR filter, the FIR filter has an arbitrary number of taps, and whose transfer function H (z) is related to a transfer function Z (z) of a pre-filter and transfer function K (z) of an equalizer, wherein the filter coefficient is set on the basis of an amplitude characteristic of the equalizer obtained in such a way as to execute a weighted approximation to the desired characteristics so as to satisfy an attenuation quantity of a stop band in relation to frequency response of the pre-filter through which the attenuation quantity of the designated frequency of a transition band is passed, and which satisfies attenuation quantity of a stop band, when the number of taps is variable and band setting is changeable.

Also, a method of setting filter coefficients of an FIR filter of the present invention has a way in which the FIR filter's impulse response is expressed by using a finite time length, wherein this impulse response is equivalent to a filter coefficient of the FIR filter, the FIR filter has an arbitrary number of taps, and whose transfer function H (z) is related to a transfer function Z (z) of a pre-filter, wherein the filter coefficient is calculated by performing a weighted approximation to the desired characteristics so as to satisfy an attenuation quantity of a stop band in relation to the frequency response of the pre-filter through which an attenuation quantity of the designated frequency of a stop band is passed, and which satisfies an attenuation quantity of the stop band, when the number of taps is variable and band setting is changeable.

Also, a method of setting filter coefficients of an FIR filter of the present invention has a way in which the FIR filter's impulse response is expressed by using a finite time length, wherein this impulse response is equivalent to a filter coefficient of the FIR filter, the FIR filter has an arbitrary number of taps, and whose transfer function H (z) is related to a transfer function Z (z) of a pre-filter and a transfer function K (z) of an equalizer, wherein the filter coefficient is calculated depending on an amplitude characteristic of the equalizer obtained in such a way as to execute a weighted approximation to the desired characteristics so as to satisfy an attenuation quantity of a stop band in relation to the frequency response of the pre-filter through which an attenuation quantity of the designated frequency of a stop band is passed, and which satisfies an attenuation quantity of the stop band, when the number of taps is variable and the band setting is changeable.

Also, a method of setting filter coefficients of an FIR filter of the present invention has a way in which the FIR filter's impulse response is expressed by using a finite time length, wherein this impulse response is equivalent to a filter coefficient of the FIR filter, and the FIR filter's number of taps is variable, and whose band setting is changeable, the setting method of a filter coefficient of an FIR filter comprises the steps of: a first step for generating an interpolation polynomial equation for interpolating an amplitude characteristic from an extreme value point of the amplitude characteristic of the frequency; a second step for determining a new extreme value point from the amplitude characteristic obtained from the interpolation polynomial equation that is obtained in the first step; a third step for judging whether or not a position of the extreme value is approximated within required range while repeating the first step and the second step; a fourth step for examining an attenuation quantity of a stop band from the approximated amplitude characteristic obtained in the third step; a fifth step for comparing the examined attenuation quantity in the fourth step with the attenuation quantity of the stop band thus designated to judge whether or not a result of the comparison satisfies predetermined condition; a sixth step for changing the band setting when result of the comparison of the fifth step does not satisfy the predetermined condition; a seventh step for judging whether or not the present number of taps is capable of satisfying attenuation quantity of a stop band after changing of the band in the sixth step; an eighth step for changing the number of taps when judgement is performed that the present number of taps can not satisfy the attenuation quantity in the seventh step; a ninth step for examining a attenuation quantity of the designated frequency of the transition band which attenuation quantity satisfies a predetermined condition in the fifth step; a tenth step for comparing the attenuation quantity of the designated frequency of the transition band that is examined in the ninth step with the attenuation quantity of the designated transition band, and for judging whether or not a result of comparison satisfies a predetermined condition; an eleventh step for changing a setting of the band when a result of comparison of the tenth step does not satisfy the predetermined condition; a twelfth step for judging whether or not the present number of taps causes the signal to pass the designated frequency of the stop band after changing the band in the eleventh step; a thirteenth step for changing the number of taps when a judgement is performed that the present number of taps does not enable the designated frequency to be passed in the twelfth step; and a fourteenth step for finding the filter coefficient from the amplitude characteristic thus approximated depending on the tenth step which are amplitude characteristic satisfies the predetermined condition.

Also, a method of setting filter coefficients of an FIR filter of the present invention has a way, wherein there is-provided at least an initial setting step for carrying out the setting of the FIR filter, setting of the band, setting of coefficient of a pre-filter, and setting of initial extreme value point, before executing the first step.

Also, a method of setting filter coefficients of an FIR filter of the present invention has a way, in the fourth step, wherein the minimum attenuation quantity in the stop band is examined, and both in the eighth step and in the thirteenth step, the number of the taps is increased.

Also, a method of setting filter coefficients of an FIR filter of the present invention has a way wherein, in the above described fourteenth step, the filter coefficient is calculated by performing a weighted approximation with reference to the desired characteristics so as to satisfy an attenuation quantity of a stop band in relation to frequency response of the pre-filter that satisfies the attenuation quantity of the stop band, and that causes the attenuation quantity of the designated frequency of the transition band to pass when the number of taps is variable and band setting is changeable.

Also, a method of setting filter coefficients of an FIR filter of the present invention has a way wherein, in the above described fourteenth step, the filter coefficient is calculated depending on an amplitude characteristic of an equalizer obtained in such a way as to execute a weighted approximation with reference to the desired characteristics so as to satisfy an attenuation quantity of a stop band in relation to a frequency response of the pre-filter that satisfies the attenuation quantity of the stop band, and that causes the attenuation quantity of the designated frequency of the transition band to pass when the number of taps is variable and the band setting is changeable.

According to the present invention, for instance, depending on the initial setting, the setting of the linear-phase FIR filter, the setting of the band, the setting of the coefficient of the pre-filter, and the setting of the extreme-value point are carried out.

Subsequently, an interpolation polynomial equation is generated for interpolating an amplitude characteristic from the present extreme value point of the amplitude characteristic of the frequency.

Next, a new extreme value point is determined from the amplitude characteristic obtained from the interpolation polynomial equation that is obtained in the first step.

Judgement is performed whether or not a position of the extreme value is approximated within a required range while repeating the first step and the second step.

Then, finding of the filter coefficient is performed from the approximated amplitude characteristic obtained.

Thus, the FIR filter, whose coefficient is set, is capable of possessing the weighted approximation error with equiripple, further in which gain of the pass band is maintained constant value.

BRIEF DESCRIPTION OF THE DRAWINGS

These and other objects and features of the present invention will become clearer from the following description of the preferred embodiments with reference to the accompanying drawings, in which:

FIGS. 3A to 3D are views illustrating an impulse response of four cases where the FIR filter possesses a linear-phase;

FIG. 4 is a view illustrating $Q(e^{j\omega})$ and R for four cases of the linear-phase FIR filter;

FIGS. 7A to 7C are views for explaining a determining method of a new extreme value of the weighted approximation error $E(e^{j\omega})$;

FIG. 8 is a view illustrating a frequency response of a low-pass filter which avoids the chessboard distortion designed according to the present invention;

FIGS. 15A and 15B are views illustrating a change of band setting in a loop after the second time and later;

FIGS. 19A to 19C are views illustrating a change of band setting in a loop of the first time;

FIGS. 27A to 27C are views illustrating change of band setting in loop of the first time;

FIGS. 28A and 28B are views illustrating a change of band setting in a loop after the second time and later;

DESCRIPTION OF THE PREFERRED EMBODIMENTS

Below, preferred embodiments will be described with reference to the accompanying drawings.

Preferred embodiments of the present invention will be explained with reference to the accompanying drawings below.

Figure 1:
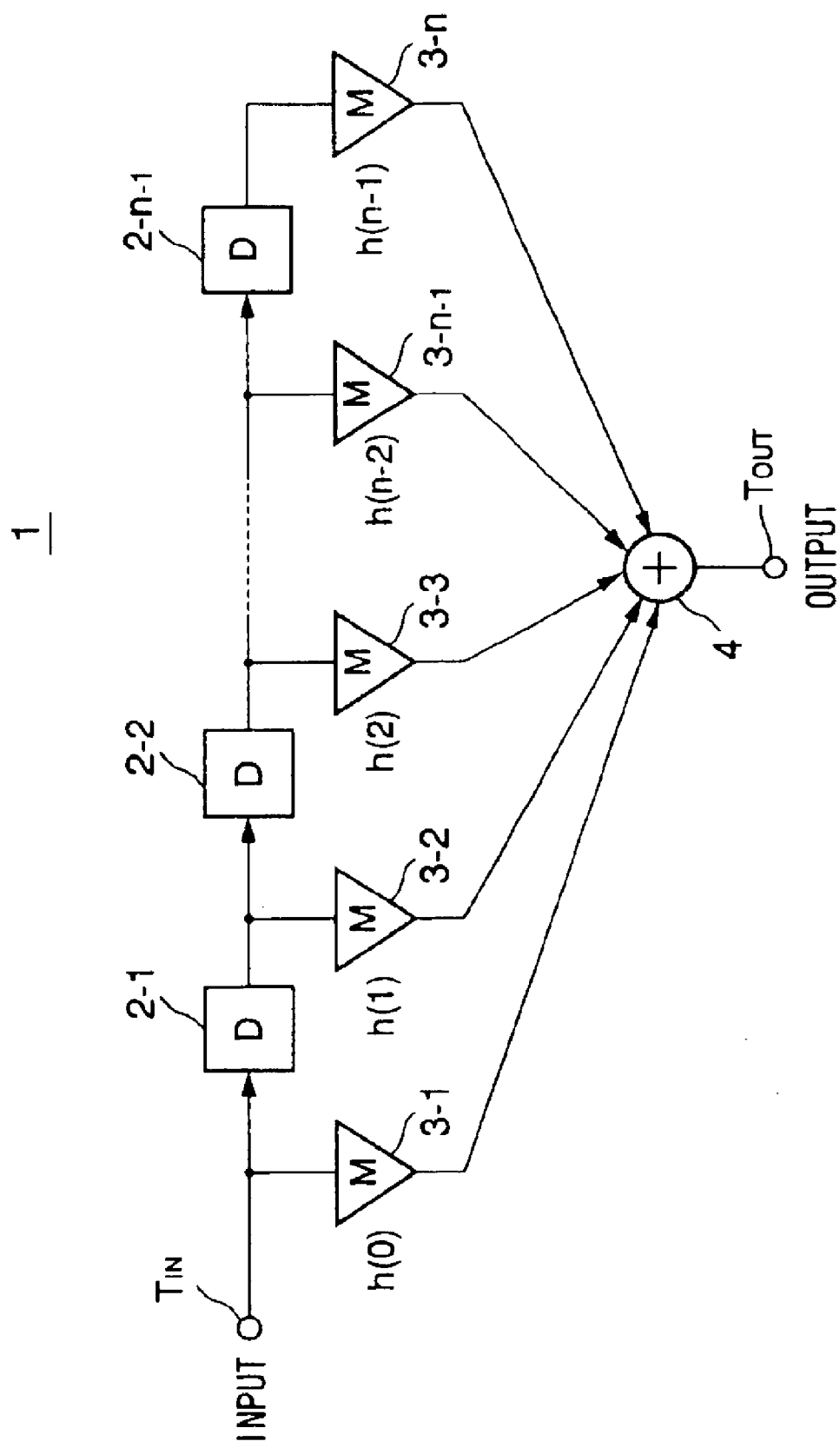
FIG. 1 is a view illustrating a transversal type circuit configuration of an FIR filter.
Figure 2A:
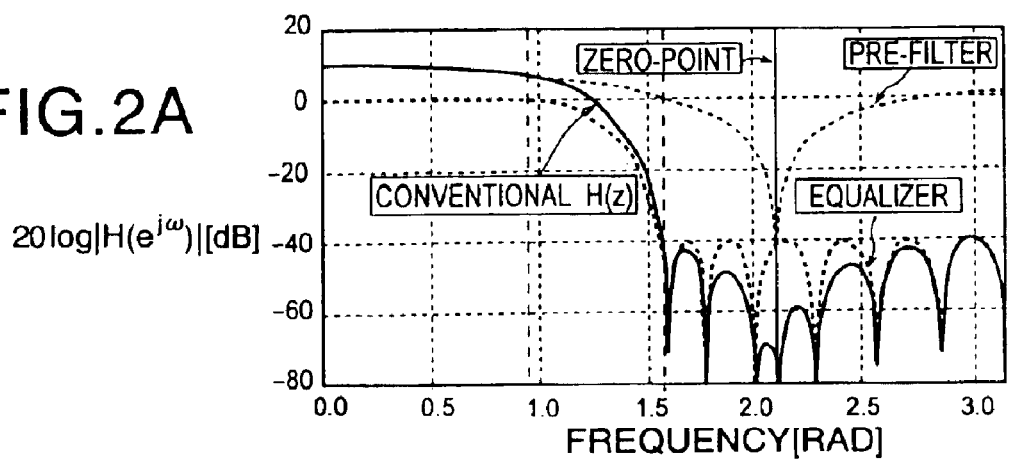
FIGS. 2A to 2C are views illustrating one example of frequency response and weighted approximation error in order to avoid the chessboard distortion in the conventional method;.
Figure 2B:
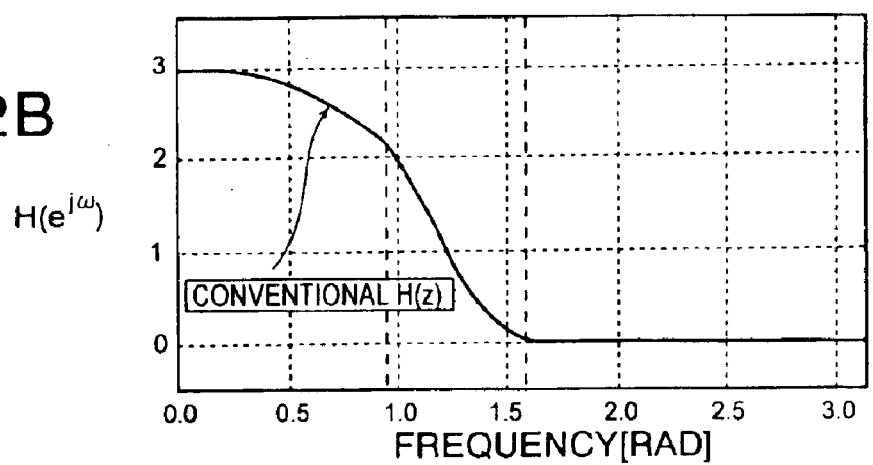
Figure 2C:
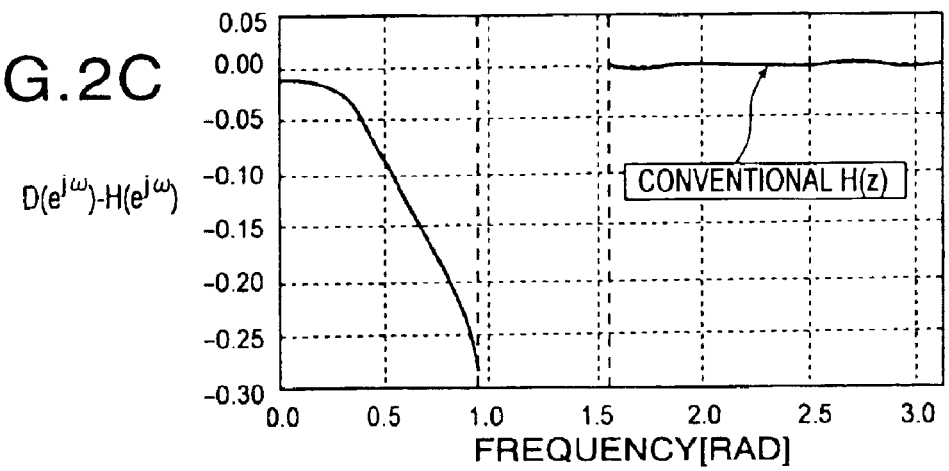

A linear-phase FIR filter according to the present invention is capable of equivalently adopting transversal type circuit configuration as illustrated in FIG. 1. The FIR filter includes n−1 series-connected unit time delay elements 2-1 to 2-n-1, n multipliers 3-1 to 3-n having filter coefficients h(0) to h(n−1), where (n−1) multipliers 3-1 to 3-n-1 are connected to input terminals of the corresponding unit time delay elements 2-1 to 2-n-1 and a n-th multiplier 3-n is connected to an output terminal of n-th unit time delay element 2-n-1, and an adder 4 connected to output terminals of the n multipliers 3-1 to 3-n. However, filter coefficients h, as described later in detail, can be obtained in such a way wherein the Remez Exchange algorithm is extended, and the desired amplitude characteristic is subjected to a Chebyshev approximation taking into account a frequency response of a pre-filter, and the filter coefficients h are obtained from the approximated amplitude characteristics.

Below, a concrete method for setting coefficients of the linear-phase FIR filter according to the present invention will be explained successively with reference to the drawings.

In equation (3), the transfer function H (z) of the linear-phase FIR filter having N-taps is defined as a filter which calculates the product of the transfer function Z (z) of the pre-filter and the transfer function of the equalizer.

$$H(z) = Z(z) \cdot K(z) \quad (3)$$

Here, the pre-filter is a U tap of the linear-phase FIR filter, and the equalizer is a N−(U−1) tap linear-phase FIR filter respectively. The transfer function of the pre-filter was previously given.

A design of a filter of the transfer function H (z) is the determination of the transfer function K (z) of the equalizer having N−(U−1) taps such that the amplitude characteristic H ($e^{j\omega}$) taps approaches to the desired amplitude characteristic D ($e^{j\omega}$).

In the present embodiment, in order to design the transfer function H (z) under consideration of the amplitude characteristic K ($e^{j\omega}$) of such pre-filter, a method si adopted in which the Remez Exchange algorithm is extended for solving a Chebyshev approximation problem.

The number of taps allocated to the equalizer of the transfer function K (z) is defined as L=N−(U−1).

The transfer function K (z) of the linear-phase FIR filter, as illustrated in FIGS. 3A to 3D, is categorized with four cases because the transfer function thereof has a linear-phase.

Concretely, it is categorized into four cases in which case 1; is a odd number of taps, and even symmetry as illustrated in FIG. 3A; case 2 is an even number of taps, and even symmetry as illustrated in FIG. 3B; case 3; is an odd number of taps, and odd symmetry as illustrated in FIG. 3C; and case 4 is an even number of taps, and odd symmetry.

With reference to the case 1, the amplitude characteristic function K ($e^{j\omega}$) is left as it is, and for the other cases 2 to 4, is rewritten as follows.

Case 1:

$$\sum_{n=0}^{} a(n)\cos(n\omega) \quad (4\text{-}1)$$

Case 2:

$$\sum_{n=1}^{L/2} b(n)\cos\left\{\left(n-\frac{1}{2}\right)\omega\right\} = \cos\left(\frac{\omega}{2}\right)\sum_{n=0}^{L/2-1} \tilde{b}(n)\cos(n\omega) \quad (4\text{-}2)$$

Case 3:

$$\sum_{n=1}^{L/2} c(n)\sin(n\omega) = \sin(\omega)\sum_{n=0}^{(L-3)/2} \tilde{c}(n)\cos(n\omega) \quad (4\text{-}3)$$

Case 4:

$$\sum_{n=1}^{L/2} d(n)\sin\left\{\left(n-\frac{1}{2}\right)\omega\right\} = \sin\left(\frac{\omega}{2}\right)\sum_{n=0}^{L/2} \tilde{d}(n)\cos(n\omega) \quad (4\text{-}4)$$

Namely, the amplitude characteristic function K ($e^{j\omega}$) is expressed by the product of the function Q ($e^{j\omega}$) of the fixed parameters as illustrated in FIG. 4 and a cosine series P ($e^{j\omega}$) including the design parameters. Hereinafter, the upper limit of a sum of the respective equations (4-1) to (4-4) is expressed as R−1. Namely, R is calculated as shown in FIG. 4.

Further, $a(n); \tilde{b}(n); \tilde{c}(n); \tilde{d}(n)$ are expressed generally as P (n).

When the desired amplitude characteristic is taken to be D ($e^{j\omega}$), and the weight to respective frequencies is taken to be W ($e^{j\omega}$), the weighted approximation error is defined as follows:

$$E(e^{j\omega})=W(e^{j\omega})\{D(e^{j\omega})-H(e^{j\omega})\} \quad (5)$$

$$H(e^{j\omega})=K(e^{j\omega})\cdot Z(e^{j\omega})=Q(e^{j\omega})\cdot P(e^{j\omega})\cdot Z(e^{j\omega}) \quad (6)$$

Substituting equation (6) into equation (5), the following equation is obtained.

$$E(e^{j\omega})=\hat{W}(e^{j\omega})\{\hat{D}(e^{j\omega})-P(e^{j\omega})\} \quad (7)$$

However, $\hat{W}(e^{j\omega})$, $\hat{D}(e^{j\omega})$ are expressed as follows:

$$\hat{W}(e^{j\omega})=W(e^{j\omega})\cdot Q(e^{j\omega})\cdot Z(e^{j\omega}) \quad (8)$$

$$\hat{D}(e^{j\omega}) = \frac{D(e^{j\omega})}{Q(e^{j\omega})\cdot Z(e^{j\omega})} \quad (9)$$

The equation (7) expresses the weighted approximation error of the linear-phase FIR filter in the four cases of case 1 to case 4.

The weighted Chebyshev approximation problem is to determine $a(n), \hat{b}(n), \hat{c}(n), \hat{d}(n)$ of the equations (4-1) to (4-4) that to brings the maximum value of $|E(e^{j\omega})|$
within a designated frequency band into a minimum, in the equation (5).

Hereinafter, these will be explained in relation to the concrete example.

Figure 5:
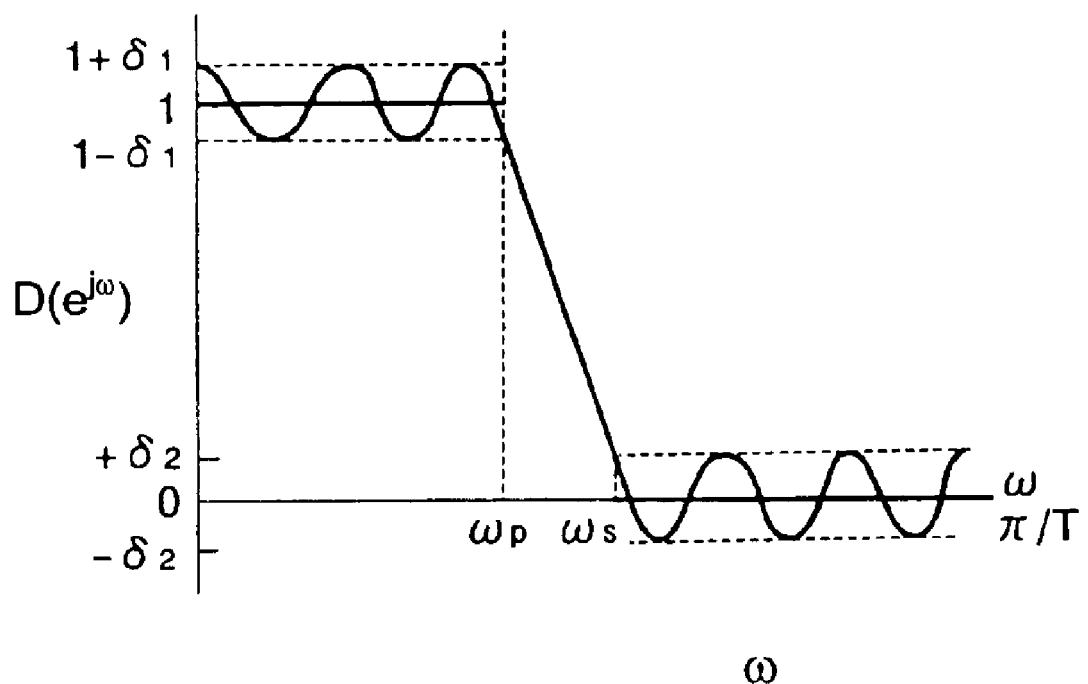
FIG. 5 is a view illustrating an example of a weighted Chebyshev approximation.

Here, the amplitude characteristic D $(e^{j\omega})$ is defined as illustrated in FIG. 5 and the following.

$$D(e^{j\omega})=1 \text{ (error within } \pm\sigma_1,\ 0<\omega<\omega_p)$$

$$D(e^{j\omega})=0 \text{ (error within } \pm\sigma_2,\ \omega_s<\omega<n) \quad (10)$$

Note, when R is given, values of $\sigma_1$, $\sigma_2$ cannot be designated arbitrarily, but it is possible to designate its ratio.

The W $(e^{j\omega})$ is taken to be a constant value W1 in the pass band, and to be W2 in the stop band, thus being selected in such a way that W1 $\sigma_1$=W2 $\sigma_2$ stands. For instance, W1=1, W2 =$\sigma_1/\sigma_2$ are made to select. At this time, next a alternating theorem stands.

Theorem

The necessary and sufficient condition in order that the cosine series P $(e^{j\omega})$ of (R-1) order is the best weighted Chebyshev approximation to the target characteristic within the section (0, n) of $\omega$ is as follows:

(1) E $(e^{j\omega})$ obtains the extreme value at least (R+1) times within the section (0, n). At this time, a frequency within which the extreme value is obtained is taken to be $\omega 0<\omega<\omega 2<\ldots<\omega(R-1)<\omega R$.

(2) The signs of the neighboring extreme values are different, and the absolute values of the whole extreme values are the same. Namely, the following conditions are satisfied.

$$E(e^{j\omega+1})\cdot E(e^{j\omega})<0\ (i=0, 1, \ldots, R-1)$$

$$|E(e^{j\omega})|=|E(e^{j\omega+1})|\ (i=0, 1, \ldots, R-1) \quad (11)$$

Consequently, $|E(e^{j\omega})|$ is equal to the maximum value of within the section.

There are known Remez Exchange algorithms on the basis of the alternating theorem as the technique for obtaining the best Chebyshev approximation (Rabiner, L. R., McClellan, J. H. and Parks, T. W.: *"FIR Digital Filter Design Techniques Using Weighted Chebyshev Approximation"*, Proc. IEEE, Vol 63, April, pp.595–610, 1975).

The Remez Exchange algorithms are algorithms in which the desired amplitude characteristic is carried out as a Chebyshev approximation within a frequency domain, and coefficients of the linear-phase FIR filter are obtained from the resultant approximated amplitude characteristic.

Figure 6:
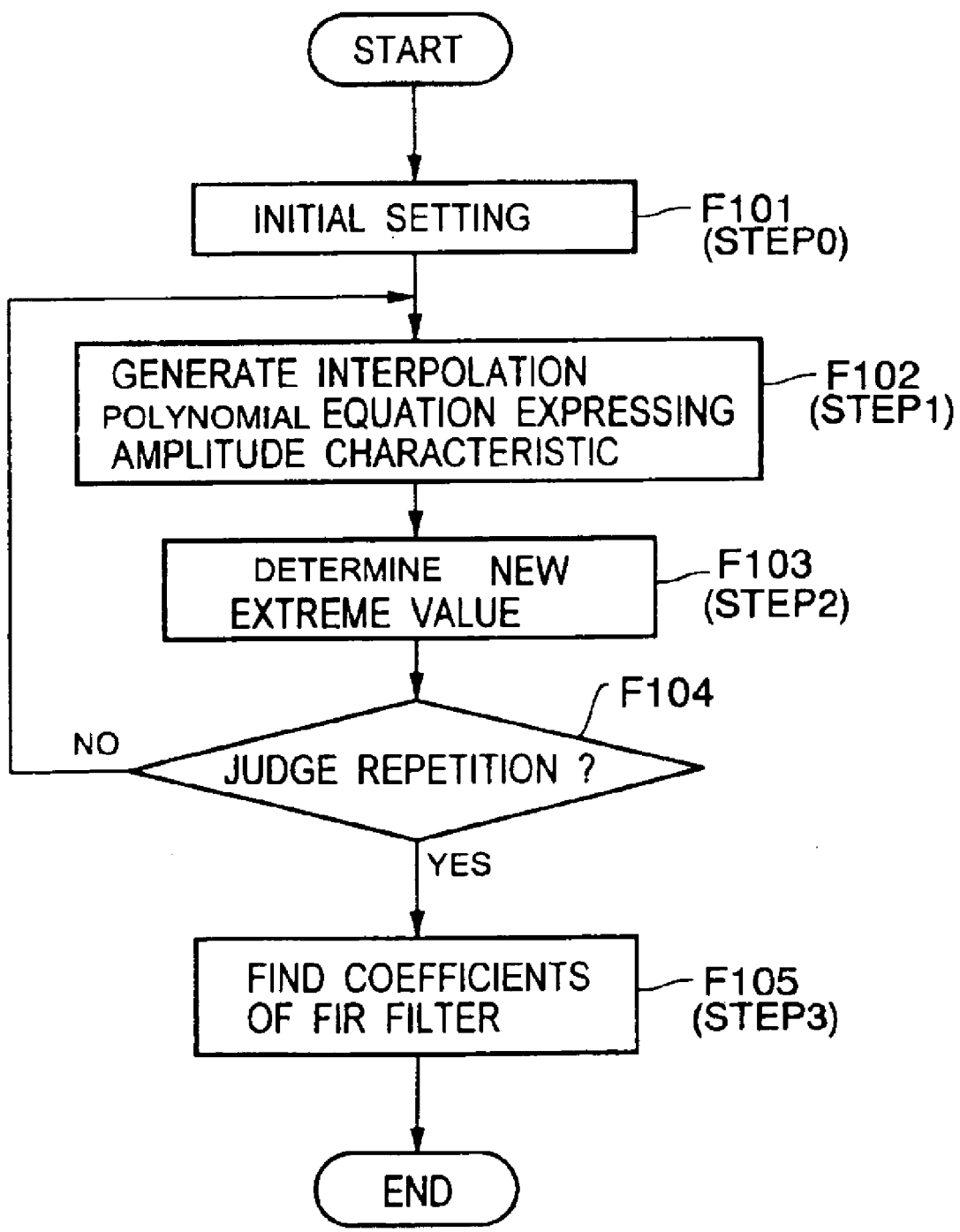
FIG. 6 is a flowchart of the Remez Exchange algorithms while taking into account a frequency response of the pre-filter according to the present invention.

FIG. 6 is a flowchart of the Remez Exchange algorithms while taking into account a frequency response of the pre-filter according to the present invention.

The Remez Exchange algorithm while taking into account the concrete frequency response of the pre-filter are as follows:

Step 0

As illustrated in FIG. 6, firstly, an initial setting is executed (F 101). In this initial setting, setting of the linear-phase FIR filter, setting of a band, setting of a coefficient of the pre-filter, and setting of an initial extreme point are carried out.

Items set concretely are as follows:

the number of taps, even symmetry or odd symmetry of the linear-phase FIR filter, the number of the band, the frequency of both ends of the respective bands, the desired amplitude value of the respective bands, weighting to the respective bands, coefficient of the pre-filter, the frequency $\omega^{(0)}=\omega_k^{(0)}(k=0, \ldots, R)$ that becomes the extreme value in the approximation band.

Note, the letter of a right shoulder (i) expresses the number of repetition.

Step 1

Next, LaGrange's interpolation polynomial equation is generated for interpolating an amplitude characteristic from the current extreme value point (F 102).

Above equation (5) indicates the target function of the Chebyshev approximation. The necessary and sufficient condition for obtaining the minimum value of the target function of the Chebyshev approximation is indicated by the alternating theorem. Accordingly, parameter p (n) of the following equation is found in such a way that, on the basis of the alternating theorem, the weighted approximation error $\delta^{(i)}$ from the desired amplitude characteristic at the respective frequency points are equal, and sign is alternated.

$$P(e^{j\omega}) = \sum_{n=0}^{R-1} p(n)\cos(n\omega) \quad (12)$$

Namely, the weighted approximation error of the equation (7) at the frequency points $\omega^{(1)}=\omega_k^{(1)}(k=0, \ldots, R)$ satisfies the following equation.

$$\hat{W}(e^{j\omega})\{\hat{D}(e^{j\omega})-P(e^{\omega l})\}=-(-1)\delta^{(i)}(k=0,1,\ldots,R) \quad (13)$$

Hereinafter, the right shoulder letter (i) is omitted for simplification. The equation is carried as follows.

$$P(e^{j\omega_k}) + \frac{(-1)^k \delta}{\hat{W}(e^{j\omega_k})} = \hat{D}(e^{j\omega_k}) \quad (14)$$

$$\sum_{n=0}^{R-1} p(n)\cos(n\omega_k) + \frac{(-1)^k \delta}{\hat{W}(e^{j\omega_k})} = \hat{D}(e^{j\omega_k})$$

$$(k = 0, 1, \ldots, R)$$

Matrix expression of the equation (14) is as follows:

$$\begin{bmatrix} 1 & \cos(\omega_0) & \cos(2\omega_0) & \cdots & \cos((R-1)\omega_0) & \frac{1}{\hat{W}(e^{j\omega_0})} \\ 1 & \cos(\omega_1) & \cos(2\omega_1) & \cdots & \cos((R-1)\omega_1) & \frac{-1}{\hat{W}(e^{j\omega_1})} \\ \vdots & \vdots & \vdots & \ddots & \vdots & \vdots \\ 1 & \cos(\omega_{R-1}) & \cos(2\omega_{R-1}) & \cdots & \cos((R-1)\omega_{R-1}) & \frac{(-1)^{R-1}}{\hat{W}(e^{j\omega_{R-1}})} \\ 1 & \cos(\omega_R) & \cos(2\omega_R) & \cdots & \cos((R-1)\omega_R) & \frac{(-1)^R}{\hat{W}(e^{j\omega_r})} \end{bmatrix} \begin{bmatrix} p(0) \\ p(1) \\ \vdots \\ p(R-1) \\ \delta \end{bmatrix} = \begin{bmatrix} \hat{D}(e^{j\omega_0}) \\ \hat{D}(e^{j\omega_1}) \\ \vdots \\ \hat{D}(e^{j\omega_{R-1}}) \\ \hat{D}(e^{j\omega_R}) \end{bmatrix} \quad (15)$$

However, since there are large amounts of calculation for calculating this equation (15), accordingly, δ is analytically found firstly.

$$\delta = \frac{\sum_{j=0}^{N} \alpha_j D(e^{j\omega_j})}{\sum_{j=0}^{N} (-1)^j \alpha_j / \hat{W}(e^{j\omega_j})} \quad (16)$$

$$\alpha_k = \prod_{\substack{j=0 \\ j \neq k}}^{R} \frac{1}{(X_k - X_j)} \quad (17)$$

This $\alpha_k$ is a surplus factor of a component of k-column (R+1)-row of the matrix F. Note, $\hat{W}(e^{j\omega})$ and $\hat{D}(e^{j\omega})$ use the equation (8) and the equation (9).

Next, the following equation is provided by using δ.

$$C_k = \hat{D}(e^{j\omega_k}) - (-1)^k \frac{\delta}{\hat{W}(e^{j\omega_k})} \quad (k = 0, \ldots, R-1) \quad (19)$$

In order to find the amplitude characteristic of the frequency except for the extreme value point, the LaGrange's interpolation polynomial expression is used as an interpolation polynomial expression for interpolating using the extreme value point. Namely, $P(e^{j\omega})$ is calculated in such a way that the interpolation is executed so as to obtain value $C_k$ at $\omega_k$ (k=0, . . . , R-1) by using the LaGrange's interpolation polynomial expression.

$$P(e^{j\omega}) = \frac{\sum_{k=0}^{R-1} C_k \left(\frac{\beta_k}{x - x_k}\right)}{\sum_{k=0}^{R-1} \left(\frac{\beta_k}{x - x_k}\right)} \quad (20)$$

$$\beta_k = \prod_{\substack{j=0 \\ j \neq k}}^{R-1} \frac{1}{(x - x_j)} \quad (21)$$

This result means the answer of the equation (15), and satisfies the equation (13) automatically at the point of ωr.

Step 2

The new extreme value point is determined from the amplitude characteristic obtained from the interpolation polynomial expression (F 103), before returning to processing of F 102. Judgement is executed repeatedly whether or not the optimum approximation is obtained after the position of the extreme value is not changed (F 104).

As above described, each extreme value point ωk as a result of Step 1 is not necessarily the extreme value of the weighted function $E(e^{j\omega})$; in some cases, the point which becomes $|E(e^{j\omega})| < \delta^{(i)}$ exists. Thus, the new extreme value $\omega^{(i+1)}$ is determined from the all point simultaneous replacement method.

All Point Simultaneous Replacement Method

On the basis of the following equation, the extreme value of weighted approximation error calculated from the extreme value used for the interpolation is searched over the whole approximation bands, and the searched extreme values are taken to be the new extreme values $\omega^{l+1} = \omega_k^{(l+1)}$ (k=0, 1, . . . , R), thus returning to Step 1.

$$E(e^{j\omega}) = \hat{W}(e^{j\omega})\{\hat{D}(e^{j\omega}) - P(e^{j\omega})\} \quad (23)$$

It is decided that when the position of the extreme value has not been changed, the optimum approximation is obtained. This is the condition of the termination of the repetition so that when the condition is satisfied, processing advances to next Step 3.

FIGS. 7A to 7C are conceptual views of the all point replacement method.

Explanation is made simply. The black dots in FIGS. 7A to 7C express the extreme value points used for the interpolation. The weighted approximation error $E(e^{j\omega})$ obtained from the extreme value points corresponds to the solid line.

As illustrated in FIG. 7A, values of the weighted approximation error at the extreme value points of the black dots become open circles. However, the actual extreme values are frequency indicated by black squares. Accordingly, the frequency indicated by the black squares is taken to be the new extreme value point, then returning to processing of Step 1.

Further, as illustrated in FIG. 7B, since a deviation of the frequency exists between the extreme value points used for the interpolation and the actual extreme value, the frequency indicated by the square is taken to be the new extreme value point, then returning to processing of Step 1.

Then, as illustrated in FIG. 7C, when the extreme value points used for the interpolation and the extreme value point (open circles) of the actual weighted approximation error becomes the same, the repetition processing terminates.

Step 3

Coefficients of the linear-phase FIR filter are found from the approximated amplitude characteristic (F 105).

When n-tap of impulse response h (n) is found from the optimum approximation function $P(e^{j\omega})$, the n-tap of impulse response is obtained from the following equation instead of P (n).

$$H(e^{j\omega}) = P(e^{j\omega}) \cdot Q(e^{j\omega}) \cdot Z(e^{j\omega}) \quad (24)$$

Case 1:

$$h(n) = \frac{1}{N}\left\{H(0) + 2\sum_{k=1}^{\frac{N-1}{2}}(-1)^k H\left(\frac{2\pi}{H}k\right)\cos\left(\frac{2\pi}{N}k\left(n+\frac{1}{2}\right)\right)\right\} \quad (25)$$

Case 2:

$$h(n) = \frac{2}{N}\sum_{k=0}^{\frac{N}{2}-1}(-1)^k H\left(\frac{2\pi}{N}\left(k+\frac{1}{2}\right)\right)\sin\left(\frac{2\pi}{N}\left(k+\frac{1}{2}\right)\left(n+\frac{1}{2}\right)\right) \quad (26)$$

Case 3:

$$h(n) = -\frac{2}{N}\sum_{k=0}^{\frac{N-1}{2}}(-1)^k H\left(\frac{2\pi}{N}k\right)\sin\left(\frac{2\pi}{N}k\left(n+\frac{1}{2}\right)\right) \quad (27)$$

Case 4:

$$h(n) = \frac{2}{N}\sum_{k=0}^{\frac{N}{2}-1}(-1)^k H\left(\frac{2\pi}{N}\left(k+\frac{1}{2}\right)\right)\cos\left(\frac{2\pi}{N}\left(k+\frac{1}{2}\right)\left(n+\frac{1}{2}\right)\right) \quad (28)$$

Further, when the impulse response k (n) of the equalizer of L=N−(U−1) tap is found, the following equation is calculated.

$$K(e^{j\omega}) = P(e^{j\omega}) \cdot Q(e^{j\omega}) \quad (29)$$

Case 1:

$$k(n) = \frac{1}{L}\left\{K(0) + 2\sum_{k=1}^{\frac{L-1}{2}}(-1)^k K\left(\frac{2\pi}{L}k\right)\cos\left(\frac{2\pi}{L}k\left(n+\frac{1}{2}\right)\right)\right\} \quad (30)$$

Case 2:

$$k(n) = \frac{2}{L}\sum_{k=0}^{\frac{L}{2}-1}(-1)^k K\left(\frac{2\pi}{L}\left(k+\frac{1}{2}\right)\right)\sin\left(\frac{2\pi}{L}\left(k+\frac{1}{2}\right)\left(n+\frac{1}{2}\right)\right) \quad (31)$$

Case 3:

$$k(n) = -\frac{2}{L}\sum_{k=0}^{\frac{L-1}{2}}(-1)^k K\left(\frac{2\pi}{L}k\right)\sin\left(\frac{2\pi}{L}k\left(n+\frac{1}{2}\right)\right) \quad (32)$$

Case 4:

$$k(n) = \frac{2}{L}\sum_{k=0}^{\frac{L}{2}-1}(-1)^k K\left(\frac{2\pi}{L}\left(k+\frac{1}{2}\right)\right)\cos\left(\frac{2\pi}{L}\left(k+\frac{1}{2}\right)\left(n+\frac{1}{2}\right)\right) \quad (33)$$

As to the pre-filter, when the transfer function Z (n) is I as indicated in the following equation, the Remez Exchange algorithm in question is substantially equal to a normal Remez Exchange algorithm.

$$Z(z) = 1 \quad (34)$$

Here, comparison between the conventional technique and the method of the present invention is carried out by taking a zero point for avoiding the Chessboard distortion to be the pre-filter.

The frequency response of the pre-filter is expressed as follows:

$$Z(e^{j\omega}) = (1 + e^{-j\omega} + e^{-2j\omega} + \ldots + e^{-j\omega(U-1)}) \quad (35)$$

$$= \begin{cases} 1 + \sum_{m=0}^{(U-1)/2} 2\cos(m\omega), & U : \text{odd} \\ \sum_{m=0}^{U/2} 2\cos\{(m+1/2)\omega\}, & U : \text{even} \end{cases}$$

The specification of the conventional technique and the present invention are indicated below.

Figure 9A:
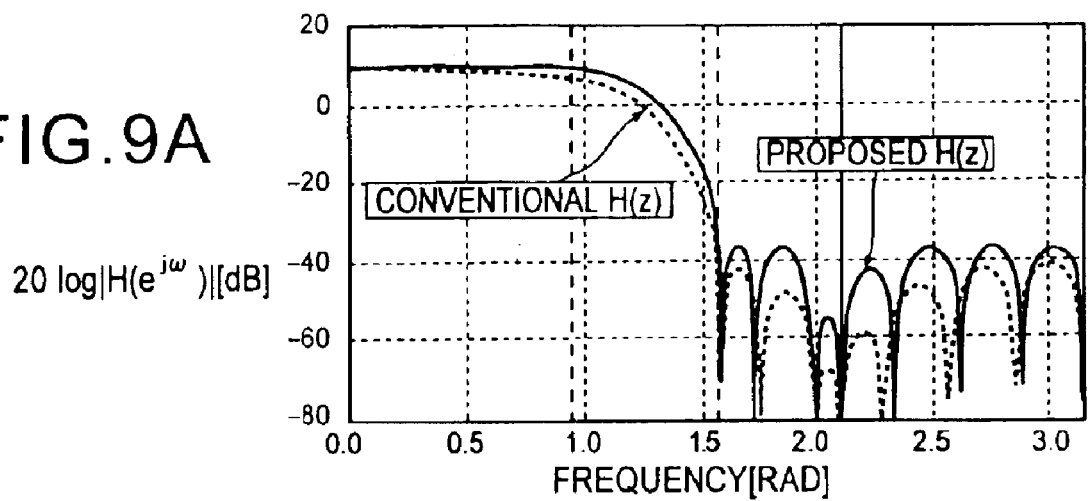
FIGS. 9A and 9B are views for comparing the frequency response of the low-pass filter designed by the conventional technique with the present invention respectively.
Figure 9B:
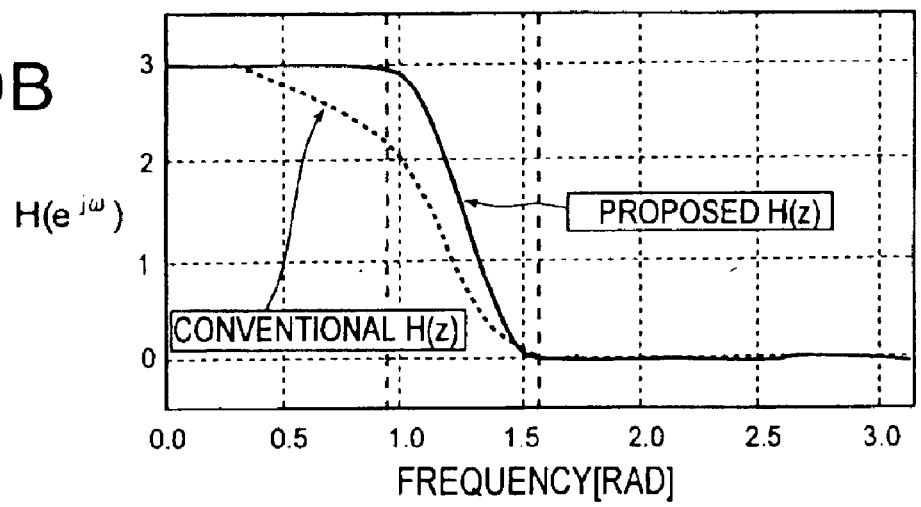
Figure 10:
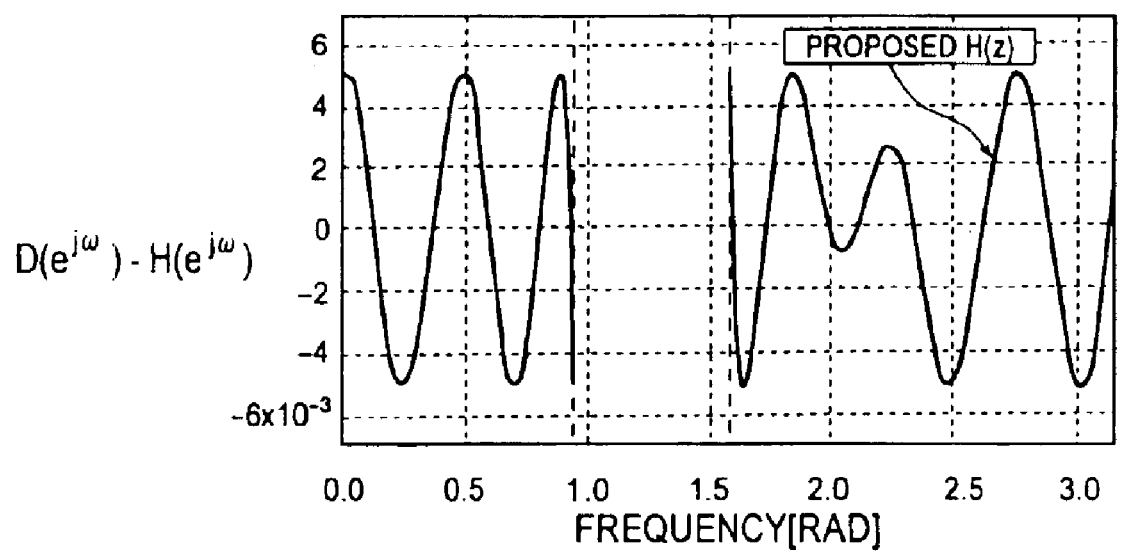
FIG. 10 is a view illustrating a weighted approximation error for the filter designed according to the present invention.

FIG. 8 is a view illustrating a frequency response of a low-pass filter which avoids the chessboard distortion designed depending on the present invention. FIGS. 9A and 9B are views for comparing the frequency response of the low-pass filter designed depending on the conventional technique with the present invention respectively. FIG. 10 is a view illustrating a weighted approximation error to the filter designed depending on the present invention.

Specification of the Conventional Technique
  Linear-Phase FIR Filter of Equalizer
  22 taps
  even symmetry
Method of Design
  The equalizer is made to design with the Remez Exchange algorithms; thus the pre-filter of zero point is folded into the linear-phase FIR filter in order to avoid the chessboard distortion of U=3. Finally, the linear-phase FIR filter with 24 taps is designed.

TABLE 1

| Band | | | |
|---|---|---|---|
| Band | Range of frequency | gain | weight |
| 1 | 0 ≤ ω ≤ 0.3π | 1 | 1 |
| 2 | 0.5π ≤ ω ≤ π | 0 | 1 |

In FIGS. 9A and 9B, the conventional technique is illustrated by dotted line written as "Conventional".

Specification of the Present Invention
  Linear-Phase FIR Filter
  24 taps
  even symmetry
  U=3
Method of Design
  Designing has been attempted with Remez Exchange algorithms by taking into account the frequency response of the pre-filter of zero point for avoiding the chessboard distortion.

TABLE 2

| Band | | | |
|---|---|---|---|
| Band | Range of frequency | gain | weight |
| 1 | 0 ≤ ω ≤ 0.3π | 1 | 1 |
| 2 | 0.5π ≤ ω ≤ π | 0 | 1 |

The dotted lines in FIG. 8 and FIGS. 9A and 9B indicate the frequency characteristic of the pre-filter and the frequency characteristics of the equalizer of the zero point for avoiding the chessboard distortion. The solid lines indicate both the frequency characteristic (Proposed H (z)) obtained finally and the frequency (Zero Point) that must be H (z)=0 for avoiding the chessboard distortion.

As seen from FIG. 8 to FIG. 10, the method of the present invention is capable of obtaining good frequency response characteristic compared with the conventional technique.

Next, as a modified example, an algorithm which satisfies an attenuation quantity of the designated stop band will be explained.

This algorithm is an algorithm satisfies the attenuation quantity (weighted approximation error) of the designated stop band in connection with the low-pass filter with 2 numbers of bands or the high-pass filter by using the Remez Exchange algorithms which take into account the frequency response of the pre-filter.

Further, in later explanation, description is made for the low-pass filter, however, when the algorithm is intended to apply to the high-pass filter, the pass-band and the block-band are inversely related.

As a method for satisfying an attenuation quantity of the stop band, there exists three kinds of approaches.

The first approach is that the end frequency ωp of the pass band is made variable, the starting frequency ωs of the stop band is made to be fixed, and the number of taps is made to be fixed.

The second approach is that the end frequency ωp of the pass band is made to be fixed, the starting frequency ωs of the stop band is made variable, and the number of taps is made to be fixed.

The third approach is that the end frequency up of the pass band is made to be fixed, the starting frequency us of the stop band is made to be fixed, and the number of taps is made variable.

The first, the second, and the third approaches are explained below with reference to the accompanying drawings successively.

First Approach

In the first approach, the maximum end frequency ωp of the pass band that satisfies the attenuation quantity dBs of the designated stop band is found.

Figure 11:
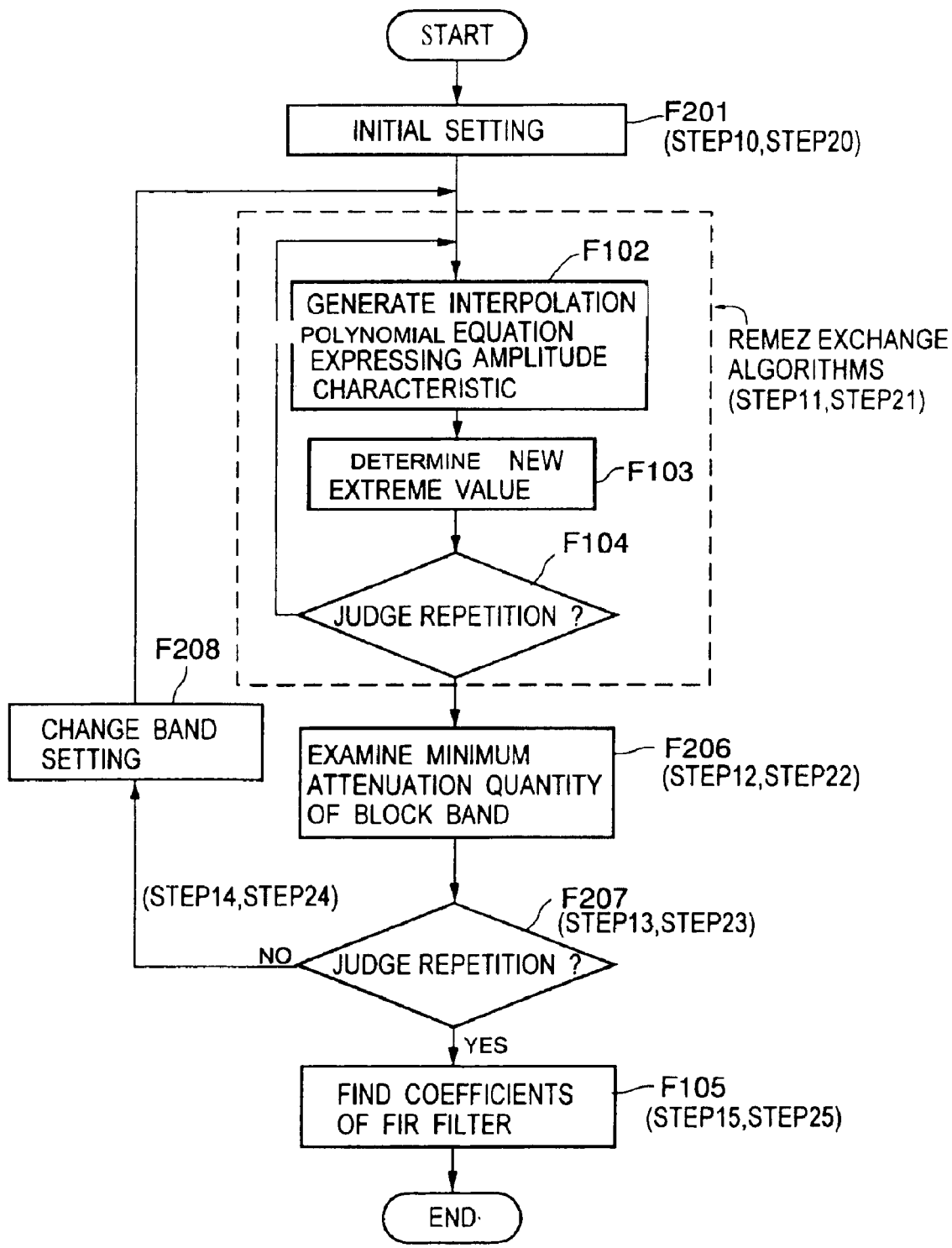
FIG. 11 is a view illustrating a flowchart of algorithms for finding a filter which satisfies an attenuation quantity of the stop band.

FIG. 11 is a view illustrating a flowchart of algorithms for finding a filter that satisfies the attenuation quantity of the stop band.

Figure 12:
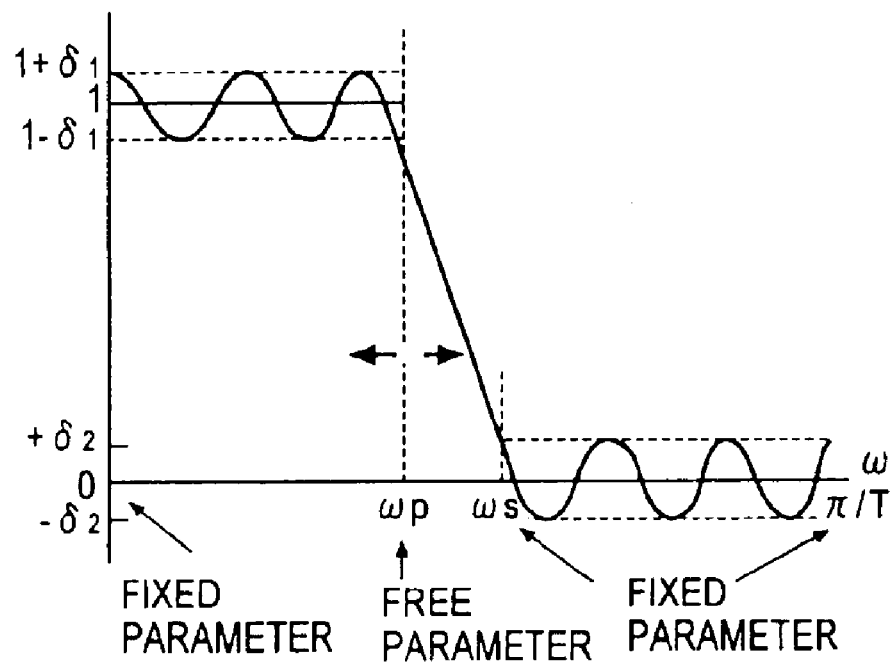
FIG. 12 is a view illustrating a parameter in the algorithms for finding a filter that satisfies the attenuation quantity of the stop band and has the maximum end frequency of the pass band.

FIG. 12 is a view illustrating a flowchart of algorithms for finding a filter that has the maximum end frequency of the pass band, which end frequency satisfies the attenuation quantity of the stop band, in which free parameters (variable) and fixed parameters (variable) are expressed.

Here, free parameters in the algorithms, object, and the principle of the algorithms are enumerated as follows:

Free parameters: end frequency ωp of the pass band.

Object: it is an object to obtain a filter that has the maximum end frequency ωp of the pass band, which end frequency satisfies the attenuation quantity of the designated stop band.

Principle: the starting frequency of the pass band and the frequencies of both ends of the stop band are fixed, and the end frequency of the pass band is the free parameter. In the Chebyshev approximation according to the Remez Exchange algorithms, the end frequency ωp of the pass band moves far away rather than the starting frequency ωs;

→the attenuation quantity of the stop band becomes large;

the end frequency ωp of the pass band approaches the starting frequency ωs of the stop band →the attenuation quantity of the stop band becomes small.

Namely, ωp$^{(cur)}$ is made to prepare at the frequency (in the vicinity of ω=0) which is far from the starting frequency ωs of the stop band. While, ωp$^{(pre)}$ which is close to the starting frequency of the stop band is made to prepare as initial frequency. Then, the position ωp of the maximum end frequency is found within the pass band that satisfies the designated attenuation quantity while utilizing the dichotomizing method.

Further, the golden section method is the most efficient method in the line search methods of such parameter. However, the dichotomizing (two branching) method is adopted here. The dichotomizing method has the algorithms which are easy to understand.

FIG. 11 and contents of each step processing F 102, F 103, F 104, F 105 of the algorithms described hereinafter are the same as the Remez Exchange algorithms when taking into account the frequency response of the pre-filter described in relation to FIG. 6. Accordingly, the same signs as that of FIG. 6 are used in connection with these processing.

Step 10

As illustrated in FIG. 11, firstly, initial setting is executed (F 201). In this initial setting, setting of the linear-phase FIR filter, setting of the band, setting of the coefficient of the pre-filter, setting of the initial extreme value point, designation of the attenuation quantity of the stop band, and setting of the initial frequency of the dichotomizing method are executed.

Concrete items thus set are as follows:

the number of taps linear-phase FIR filter with even symmetry or odd symmetry the number of the band is two the starting frequency of the pass band gain of the pass band frequencies of both ends of the stop band gain of the stop band weighting in connection with the pass band and the stop band coefficients of the pre-filter attenuation quantity dBs (namely, pointing largeness δ2 of ripple of the stop band)

frequency $\omega^{(0)}=\omega_k^{(0)}$ (k=0, . . . , R) that becomes the extreme value in the approximation band. Provided letter of right shoulder (i) expresses the number of repetition.

Figure 13:
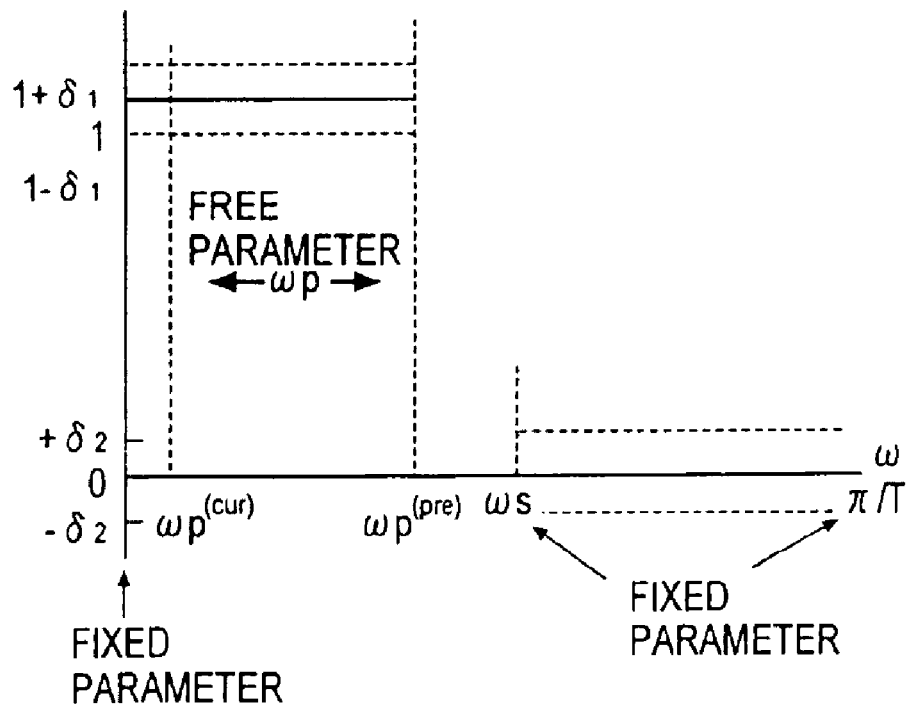
FIG. 13 is a view illustrating an initial frequency of the dichotomizing method in the algorithms for finding a filter having the maximum end frequency of the pass band which filter satisfies the attenuation quantity of the stop band.

Also, FIG. 13 is a view illustrating initial frequency of the dichotomizing method in the algorithms for finding a filter having the maximum end frequency of the pass band that satisfies the attenuation quantity of the stop band.

As illustrated in FIG. 13, in the present example, the following values are given as the initial frequencies of the dichotomizing method.

$\omega_p^{(pre)[0]}$=the vicinity of starting frequency of the stop band (37)

$\omega_p^{(cur)[0]}$=the vicinity of starting frequency of the pass band (38)

Portion of [t] at the back of ωp expresses the number of cycle.

Here, the Remez Exchange algorithms taking into account the frequency response of the pre-filter are executed to the frequency $\omega_p^{(pre)}$[ ], thus the minimum of the attenuation quantity dB$^{(pre)}$[0] in the stop band is found. The following steps are explained on the basis of the assumption.

Step 11

The Remez Exchange algorithm taking into account the frequency response of the pre-filter is executed (F 102, F 103, F 104).

Concretely, in the processing F 102, the interpolation polynomial expression is generated for interpolating the amplitude characteristic from the extreme value point at the time of $\omega_p^{cur}[t]$.

Subsequently, in the processing F 103, the new extreme value point is determined from the amplitude characteristic obtained from the interpolation polynomial expression.

Then, in the processing F 104, the repetition judgement of the Remez Exchange algorithm is executed.

Step 12

Next, the attenuation quantity of the stop band is examined (F 206).

The minimum attenuation quantity (the maximum weighted approximation error δ2) $dB_s^{(cur)}[t]$ is examined in the stop band by using the interpolation polynomial expression founded in the processing F 102.

Step 13

Next, comparison is attempted in connection with the attenuation quantity of the designated stop band (F 207).

Concretely, in the case that the result of the comparison satisfies the following equations (39) or (40) while comparing with the attenuation quantity dBs of the designated stop band, processing is moved to processing of Step 15 (F 105). While when the result of the comparison does not satisfy equations (39) or (40), processing is moved to processing of Step 14 (F 208).

$$|dB_s^{(pre)}[t] - dB_s|<E_1 \tag{39}$$

$$|\omega_p^{(cur)}[t] - \omega_p^{(pre)}[t]|<\epsilon_2 \tag{40}$$

Provided that $\epsilon 1$ and $\epsilon 2$ are extremely small values.

Step 14

Setting of the band is changed when the result of the comparison does not satisfy equations (39) or (40), in the comparison to the attenuation quantity dBs of the designated stop band (F 208).

Concretely, the end frequency $\omega_p^{cur}[t+1]$ of a new pass band is made to set. Explanation is made while dividing into two cases of the first loop and the second loop as the setting method.

Figure 14A:
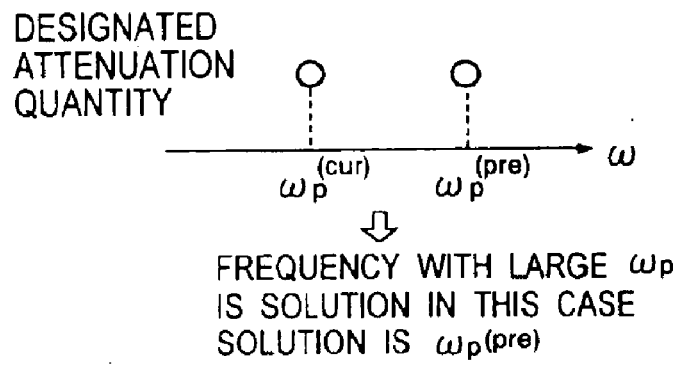
FIGS. 14A to 14C are views illustrating a change of band setting in a loop of the first time.
Figure 14B:
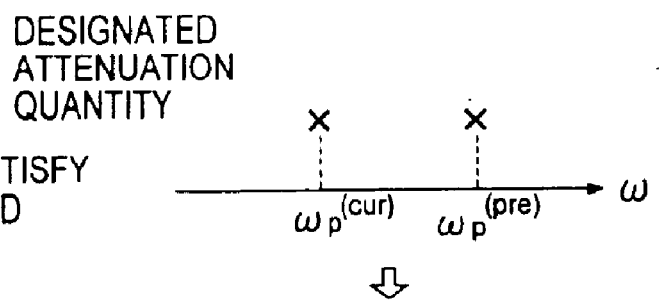
Figure 14C:
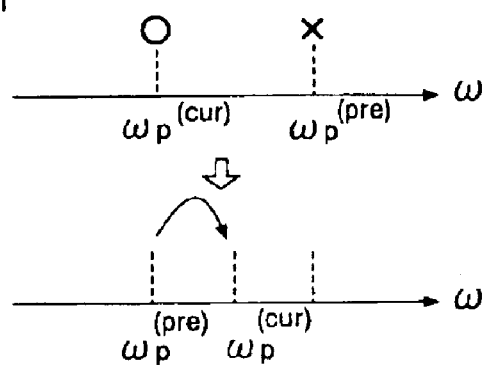

First time:

In the case of the first time, there are three cases illustrated in FIGS. 14A to 14C.

Namely, cases illustrated in FIG. 14A, FIG. 14B, and FIG. 14C are considered in connection with the frequencies $\omega_p^{(pre)}[0]$, $\omega_p^{(cur)}[0]$.

The case illustrated in FIG. 14A is one in which both do not satisfy the designated attenuation quantity. In this case, the frequency $\omega_p^{(pre)}[0]$ close to the starting frequency $\omega s$ of the stop band is taken to be a solution, thus advancing toward to the processing of Step 15.

The case illustrated in FIG. 14B is one in which both do not satisfy the designated attenuation quantity. In this case, the present number of taps cannot realize the designated attenuation quantity. Accordingly, that effect is indicated to end processing.

The case illustrated in FIG. 14C is one in which only one side satisfies the designated attenuation quantity. In this case, processing is moved to Step 11 in such a way as following equation (41).

Further, in the present method for giving an initial frequency point, there is no case in which $\omega_p^{(pre)}[0]$ is satisfied and $\omega_p^{(cur)}[0]$ is not satisfied.

$$\omega_p^{(pre)}[1]=\omega_r^{(cur)}[0]\omega_p^{(cur)}[1]=0.5\times(\omega_p^{cur}[0]+\omega_r^{(pre)}[0])dB^{(pre)}[1]=dB^{(cur)}[0] \tag{41}$$

Second Time and Later:

In the case of a second time and later, two cases indicated in FIGS. 15A and 15B are considered. In the determining method of the new frequency in the second time and later, the frequency which satisfies the designated attenuation quantity dBs is preserved invariably within $\omega_p^{(pre)}[t+1]$. The case illustrated in FIG. 15A, FIG. 15B is considered in connection with the frequencies $\omega_p^{(pre)}[t]\omega_p^{(cur)}[t]$.

The case illustrated in FIG. 15A is one in which one side satisfies the designated attenuation quantity. In this case, the processing is moved to next step 11 in such a way as the following equation (42).

Further, since the frequency which satisfies the designated attenuation quantity always conforms to $\omega_p^{(pre)}[t]$, there does not exist the case that does not satisfy.

$$\omega_p^{(pre)}[l+1]=\omega_p^{(pre)}[t]\omega_p^{(cur)}[t+1]=0.5\times(\omega_p^{(cur)}[t]+\omega_r^{(pre)}[l])dB^{(pre)}[l+1]=dB^{pre}[t] \tag{42}$$

The case illustrated in FIG. 15B is one in which both satisfy the designated attenuation quantity. In this case, the processing is moved to next step 11 in such a way as the following equation (43).

$$\omega_p^{(pre)}[t+1]=\omega_p^{(cur)}[t]\omega_p^{(cur)}[t+1]=\omega_p^{(cur)}[t]+0.5\times(\omega_p^{(cur)}[t]-\omega_p^{(pre)}[t])\ dB^{(pre)}[t+1]=dB^{(cur)}[t] \tag{43}$$

Step 15

The coefficients of the linear-phase FIR filter are obtained from the approximated amplitude characteristic (F 105).

Namely, the coefficients of the linear-phase FIR filter are obtained from the amplitude characteristic obtained finally.

Figure 16:
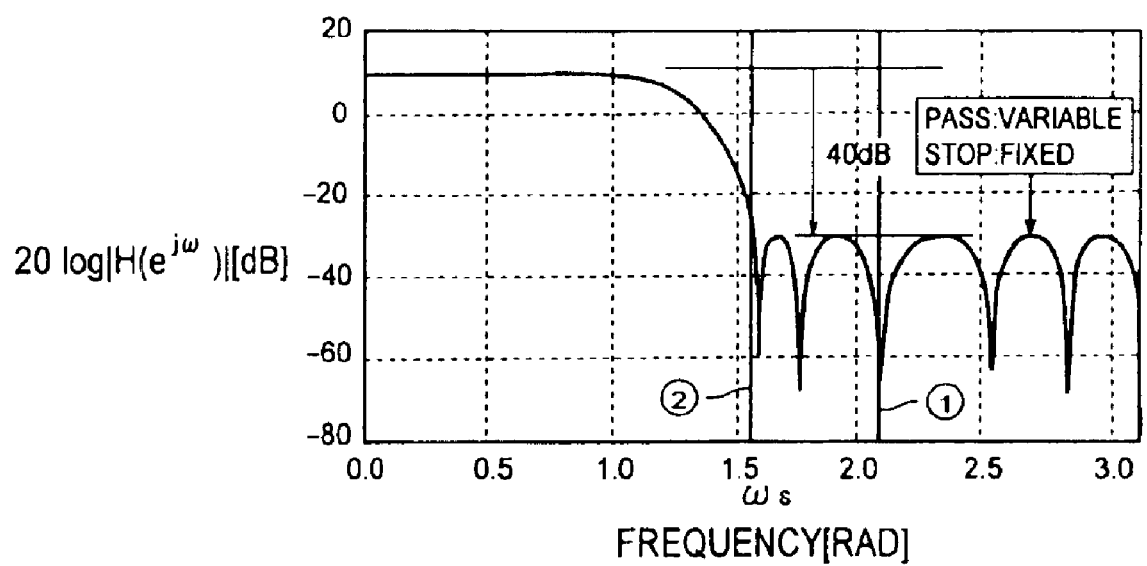
FIG. 16 is a view illustrating a frequency response of the filter having the maximum end frequency of pass band which filter satisfies an attenuation quantity of the stop band.

FIG. 16 is a view illustrating frequency response characteristic of the low-pass filter obtained from the algorithms for obtaining "filter having the maximum end frequency of the pass band that satisfies the attenuation quantity of the stop band" while taking the filter of the zero point for avoiding the chessboard distortion.

Fundamental algorithms, variable intended to find, and band of this case are as follows:

Fundamental Algorithms

It is the Remez Exchange algorithms taking into account a frequency characteristic of the pre-filter.

24 taps 24 taps even symmetry

U=3 (filter coefficient is executed U times such that DC gain becomes U)

attenuation quantity of the stop band is not more than −40 dB

Variable Intended to Find

It is the end frequency ωp of the pass band.

TABLE 3

| | Band | | |
|---|---|---|---|
| band | Frequency region | gain | weight |
| Pass band | $0 \leq \omega \leq \omega_p$ | 1 | 1 |
| Stop band | $0.5\pi \leq \omega \leq \pi$ | 0 | 1 |

Further, in FIG. 16, the solid line indicates frequency response of a low-pass filter that has the maximum end frequency of the pass band which satisfies the attenuation quantity of the stop band. Furthermore, the dotted line indicated by ① indicates frequency which becomes zero point for avoiding the chessboard distortion, and the dotted line indicated by ② indicates a period of the band given beforehand.

As seen from FIG. 16, the low-pass filter which is obtained from the algorithms for finding a "filter having the maximum end frequency of the pass band which satisfies the attenuation quantity of the stop band" according to the present invention has a good frequency response characteristic.

Second Approach

Next, in the second approach, the minimum starting frequency ωs of the stop band that satisfies the attenuation quantity dBs of the designated stop band is found.

The flowchart for this attempt is equivalent to that of FIG. 11 referred to in the first approach.

Figure 17:
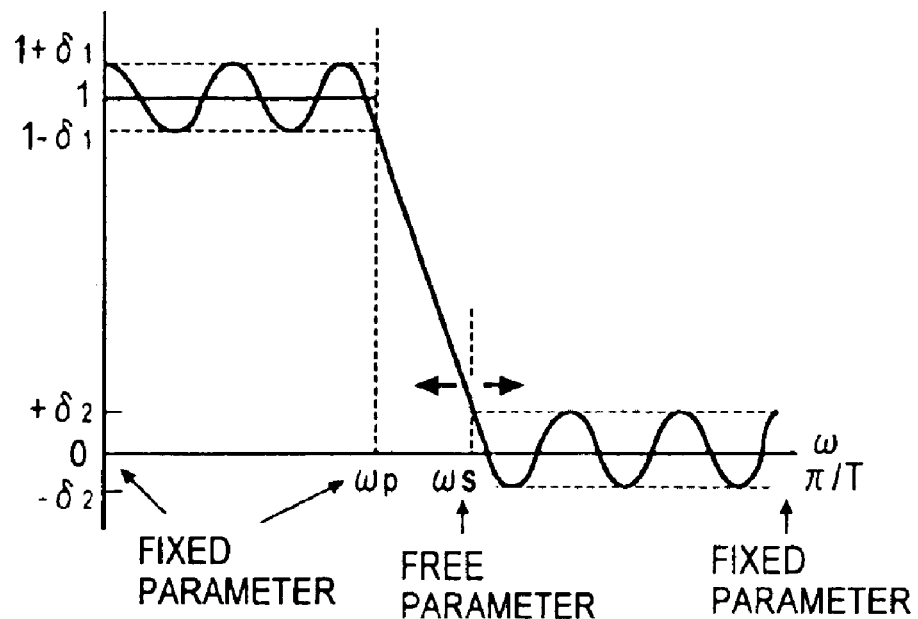
FIG. 17 is a view illustrating a parameter in the algorithms for finding filter having the minimum starting frequency of the stop band which a filter satisfies an attenuation quantity of the stop band.

FIG. 17 shows a free parameter (variable) and a fixed parameter (variable) in the algorithms for finding a filter having the minimum starting frequency of the stop band that satisfies the attenuation quantity of the stop band.

Here, the free parameters of these algorithms, objects, and the principle of the algorithms thus enumerated are as follows:

free parameter: it is the starting frequency as of the stop band.

objects: it is an object to obtain a filter having the minimum starting frequency ωs of the stop band that satisfies an attenuation quantity of the designated stop band.

principle: the end frequency of the stop band and the frequencies of both ends of the pass band are fixed, and the starting frequency of the stop band is the free parameter. In the Chebyshev approximation according to the Remez Exchange algorithms, the starting frequency ωs of the stop band moves far away rather than the end frequency ωp of the pass band→the attenuation quantity of the stop band becomes large.

the starting frequency ωs of the stop band approaches the end frequency ωp of the pass band→the attenuation quantity of the stop band becomes small.

Namely, $\omega_s^{(pre)}$ is made to prepare that is far from the end frequency of the pass band, while $\omega_s^{(cur)}$ which is close to the end frequency of the pass band is made to prepare as initial frequencies. Then, a position ωs of the minimum starting frequency is found within the stop band that satisfies the designated attenuation quantity while utilizing the dichotomizing method.

Further, the golden section method is the most efficient method in the line search methods of such parameter. However, the dichotomizing method is adopted here. The dichotomizing method has the algorithms which are easy to understand.

Also, FIG. 11 and contents of each step processing F 102, F 103, F 104, F 105 of the algorithms described hereinafter are the same as the Remez Exchange algorithms while taking into account the frequency response of the pre-filter described in relation to FIG. 6 in the same way as the case of the first approach. Accordingly, the same signs as that of FIG. 6 are used in connection with these processing.

Step 20

As illustrated in FIG. 11, firstly, an initial setting is executed (F 201). In this initial setting, setting of the linear-phase FIR filter, setting of the band, setting of a coefficient of the pre-filter, setting of the initial extreme value point, designation of attenuation quantity of the stop band, and setting of initial frequency of dichotomizing method are executed.

Concrete items thus set are as follows:

the number of taps linear-phase FIR filter with even symmetry or odd symmetry the number of the bands is two the starting frequency of the pass band gain of the pass band frequencies of both ends of the stop band gain of the stop band weighting to the pass band and the stop band coefficients of the pre-filter attenuation quantity dBs (namely, pointing largeness δ2 of ripple of the stop band)

frequency $\omega^{(0)}=\omega_k^{(0)}$ (k=0, . . . , R) that becomes the extreme value in the approximation band. The provided letter of right shoulder (i) expresses the number of repetition.

Figure 18:
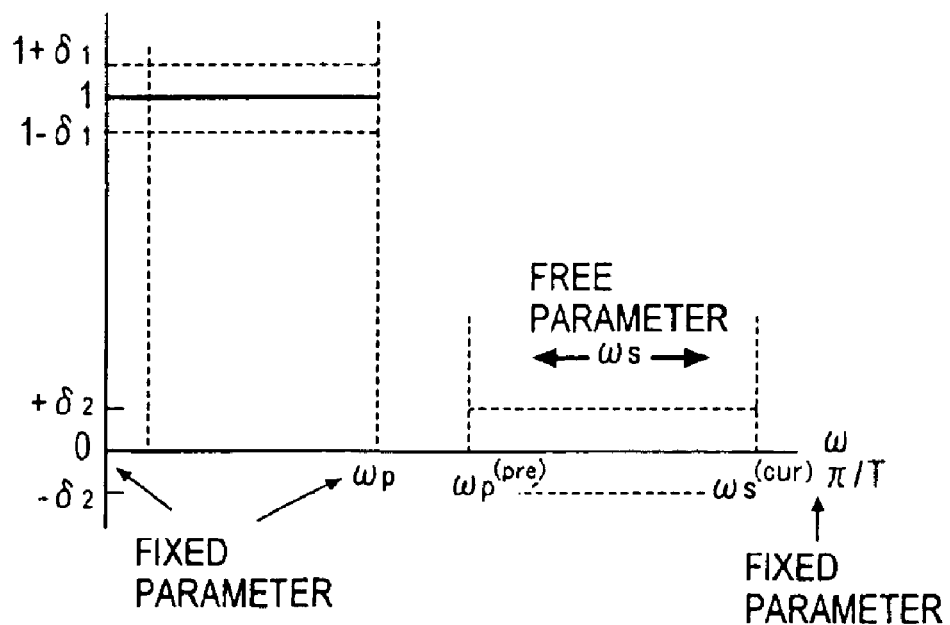
FIG. 18 is a view illustrating an initial frequency of the dichotomizing method in the algorithms for finding a filter having the minimum starting frequency of the pass band which filter satisfies the attenuation quantity of the stop band.

Also, FIG. 18 is a view illustrating initial frequency of the dichotomizing method in the algorithms for finding a filter having the minimum starting frequency of the stop band that satisfies the attenuation quantity of the stop band.

As illustrated in FIG. 18, in the present example, the following values are given as the initial frequencies of the dichotomizing method.

$$\omega_s^{(pre)}[0] = \text{the vicinity of end frequency of the pass band} \quad (44)$$

$$\omega_s^{(cur)}[0] = \text{the vicinity of end frequency of the stop band} \quad (45)$$

A portion of [t] at the back of as expresses the number of cycle.

Here, the Remez Exchange algorithms taking into account the frequency response of the pre-filter are executed to the frequency $\omega_s^{(pre)}[0]$, thus the minimum of the attenuation quantity $dB^{(pre)}[0]$ in the stop band is found. The following steps are explained on the basis of this assumption.

Step 21

The Remez Exchange algorithms taking into account the frequency response of the pre-filter are executed (F 102, F 103, F 104).

Concretely, in the processing F 102, the interpolation polynomial expression is generated for interpolating an amplitude characteristic from the extreme value point at the time of $\omega_s^{(cur)}[0]$.

Subsequently, in the processing F 103, the new extreme value point is determined from the amplitude characteristic obtained from the interpolation polynomial expression.

Then, in the processing F 104, repetition judgement of the Remez Exchange algorithms is executed.

Step 22

Next, the attenuation quantity of the stop band is examined (F 206).

The minimum attenuation quantity (the maximum weighted approximation error δ2) $dB_s^{(cur)}[t]$ is examined in the stop band while using the interpolation polynomial expression founded in the processing F 102.

Step 23

Next, comparison to the attenuation quantity of the designated stop band is executed (F 207).

Concretely, in the case that result of the comparison satisfies following equations (46) or (47) while comparing with the attenuation quantity dBs of the designated stop band, processing is moved to processing of Step 25 (F 105). While when result of the comparison does not satisfy equations (46) or (47), processing is moved to processing of Step 24 (F 208).

$$|dB_s^{(cur)}[t] - dB_s| < \epsilon_1 \quad (47)$$

$$|\omega_s^{(cur)}[t] - \omega_s^{(pre)}[t]| < \epsilon_2 \quad (47)$$

Provided that ε1 and ε2 are extremely small values.

Step 24

Setting of the band is changed when the result of the comparison does not satisfy equations (46) or (47), in the comparison to the attenuation quantity dBs of the designated stop band (F 208).

Concretely, the starting frequency $\omega_s^{(cur)}[t+1]$ of a new stop band is made to set. Explanation is made while dividing into two cases of the first loop and the second loop as the setting method.

First Time:

In the case of the first time, there are three cases illustrated in FIGS. 19A to 19C.

Namely, cases illustrated in FIG. 19A, FIG. 19B, and FIG. 19C are considered to frequencies $\omega_s^{(pre)}[0]$, $\omega_s^{(cur)}[0]$.

The case illustrated in FIG. 19A is one in which the both satisfy the designated attenuation quantity. In this case, the frequency $\omega_s^{(pre)}[0]$ close to $\omega=0$ is taken to be solution, thus advancing toward to the processing of Step 25.

The case illustrated in FIG. 19B is one in which the both do not satisfy the designated attenuation quantity. In this case, the present number of taps can not realize the designated attenuation quantity. Accordingly, that effect is indicated to end.

The case illustrated in FIG. 19C is one in which only one side satisfies the designated attenuation quantity. In this case, processing is moved to Step 21 in such a way as in the following equation (48).

Further, in the present method for giving an initial frequency point, the case in which $\omega_s^{(pre)}[0]$ is satisfied and $\omega_s^{(cur)}[0]$ is not satisfied does not exist.

$$\omega_s^{(pre)}[1]=\omega_s^{(cur)}[0]\omega_s^{(cur)}[1]=0.5\times(\omega_s^{(cur)}[0]+\omega_s^{(pre)}[0])\ dB_s^{(pre)}[1]=dB_s^{(cur)}[0] \quad (48)$$

Figure 20A:
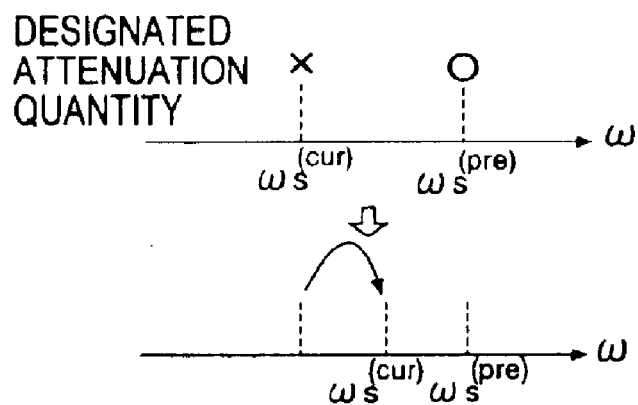
FIGS. 20A and 20B are views illustrating a change of band setting in a loop after the second time and later.
Figure 20B:
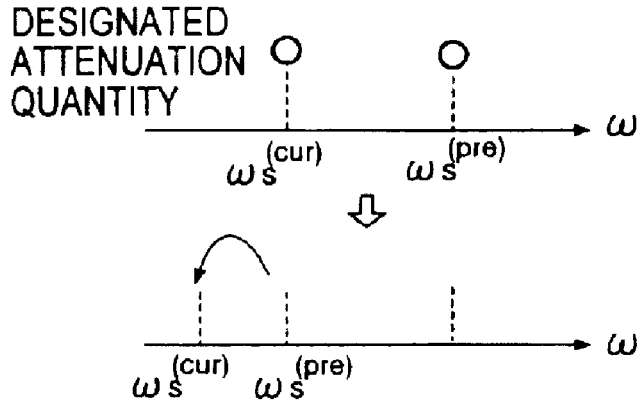

Second Time and Later:

In the case of second time and later, two cases indicated in FIGS. 20A and 20B are considered. In the determining method of the new frequency in the second time and later, the frequency which satisfies the attenuation quantity dBs thus designated is preserved invariably within $\omega_s^{(pre)}[t+1]$. The case illustrated in FIG. 20A, FIG. 20B is considered to the frequencies $\omega_s^{(pre)}[t],\omega_s^{(cur)}[t]$.

The case illustrated in FIG. 20A is one in which one side satisfies the designated attenuation quantity. In this case, the processing is moved to next step 21 in such a way as the following equation (49).

Further, since the frequency which satisfies the designated attenuation quantity always conforms to $\omega_s^{(pre)}[t]$, the case that $\omega_s^{(pre)}[t]$ does not satisfy does not exist.

$$\omega_s^{(pre)}[l+1]=\omega_s^{(pre)}[l]\omega_s^{(cur)}[l+1]=0.5\times(\omega_s^{(cur)}[l]+\omega_s^{(pre)}[t])\ dB^{(pre)}[l+1]=dB_s^{(cur)}[t] \quad (49)$$

The case illustrated in FIG. 20B is one in which the both satisfies the designated attenuation quantity. In this case, the processing is moved to next step 21 in such a way as the following equation (50).

$$\omega_s^{(pre)}[t+1]=\omega_s^{(cur)}[t]\omega_s^{(cur)}[t+1]=\omega_s^{(cur)}[t]+0.5\times(\omega_s^{(cur)}[t]-\omega_s^{(pre)}[t])\ dB_s^{(pre)}[t+1]=dB_s^{(cur)}[t] \quad (50)$$

Step 25

The coefficients of the linear-phase FIR filter are found from the approximated amplitude characteristic (F 105).

Namely, the coefficients of the linear-phase FIR filter are found from the amplitude characteristic obtained finally.

Figure 21:
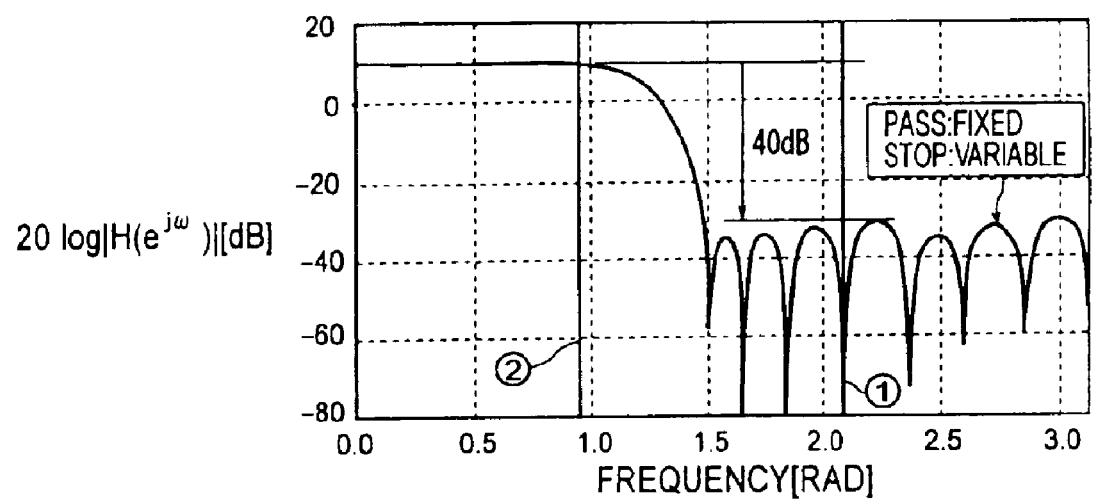
FIG. 21 is a view illustrating a frequency response of the filter having the minimum starting frequency of a stop band which filter satisfies an attenuation quantity of the stop band.

FIG. 21 is a view illustrating a frequency response characteristic of the low-pass filter obtained from the algorithms for finding "filter having the minimum starting frequency of stop band which filter satisfies the attenuation quantity of the stop band" while taking the filter of the zero point for avoiding the chessboard distortion.

Fundamental algorithms, variables intended to find, and band of this case are as follows:

Fundamental Algorithms

It is the Remez Exchange algorithms taking into account frequency characteristic's of the pre-filter.

24 taps even symmetry

U=3 (filter coefficient is executed U times such that DC gain becomes U)

attenuation quantity of the stop band is not more than −40 dB

Variable Intended to Find

It is the starting frequency $\omega s$ of the stop band.

TABLE 4

| | Band | | |
|---|---|---|---|
| band | Frequency region | gain | weight |
| Pass band | $0 \leq \omega \leq 0.3\pi$ | 1 | 1 |
| Stop band | $\omega_s \leq \omega \leq \pi$ | 0 | 1 |

Further, in FIG. 21, the solid line indicates a frequency response of a low-pass filter that has the minimum starting frequency of the stop band which satisfies the attenuation quantity of the stop band. Furthermore, the dotted line indicated by ① indicates a frequency which becomes a zero point for avoiding the chessboard distortion, and the dotted line indicated by ② indicates a period of the band given beforehand.

As seen from FIG. 21, the low-pass filter which is obtained from the algorithms for finding a "filter having the minimum starting frequency of the stop band which satisfies attenuation quantity of the stop band" according to the present invention has a good frequency response characteristic.

Third Approach

Finally, in the third approach, the minimum number N of taps that satisfies the attenuation quantity dBs of the designated stop band is found.

Figure 22:
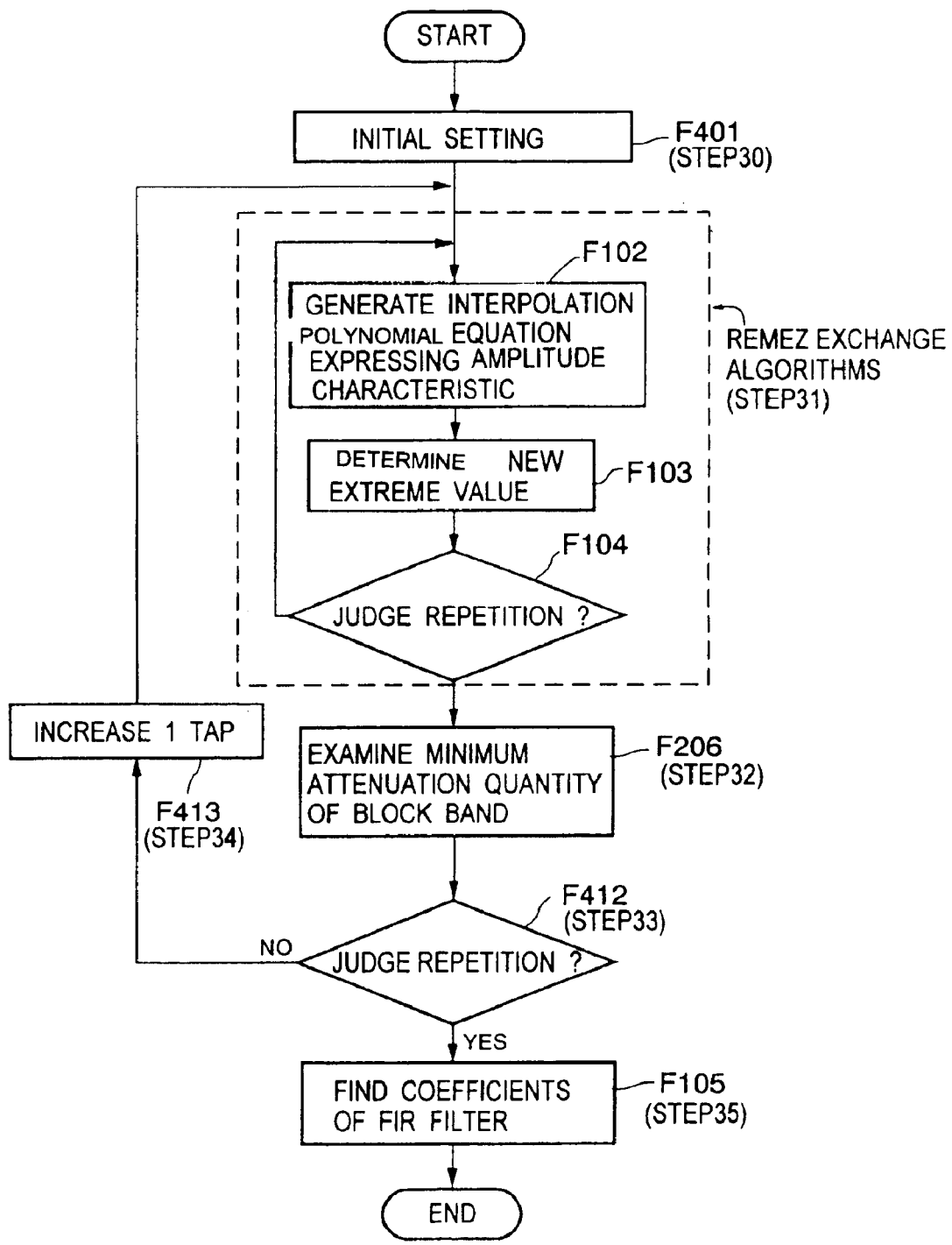
FIG. 22 is a view illustrating a flowchart of the algorithms for finding a filter with the minimum number of taps that satisfies an attenuation quantity of the stop band.

FIG. 22 is a view illustrating a flowchart of the algorithms for finding a filter with the minimum number of tap that satisfies the attenuation quantity of the stop band.

Here, free parameters of these algorithms, objects, and the principle of the algorithms thus enumerated are as follows:

free parameters: it is the number of taps objects: it is an object to obtain a filter having the minimum number of taps that satisfies attenuation quantity of the designated stop band.

principle: since variable of the band is fixed, when it is impossible to satisfy the attenuation quantity of the designated stop band, the number of taps is increased by one tap.

Also, FIG. 22 and contents of each step processing F 102, F 103, F 104, F 105 of the algorithms described hereinafter are the same as the Remez Exchange algorithms while taking into account the frequency response of the pre-filter described in relation to FIG. 6 in the same way as the case of the first approach. Further, contents of processing F 206 is the same as the processing explained in relation to FIG. 11 in the same way as the case of the second approach. Accordingly, the same signs as that of FIG. 6 and FIG. 11 are used in connection with these processing.

Step 30

As illustrated in FIG. 22, firstly, an initial setting is executed (F 401). In this initial setting, setting of linear-phase FIR filter, setting of band, setting of coefficient of the pre-filter, setting of the initial extreme value point, and designation of attenuation quantity of the stop band, are executed.

Concrete items thus set are as follows:
the number of initial taps
linear-phase FIR filter with even symmetry or odd symmetry
the number of the band is two
the starting frequency and end frequency of respective bands
gain of respective bands
weighting of respective bands
coefficient of the pre-filter
attenuation quantity dBs (namely, pointing largeness δ2 of ripple of the stop band)
frequency $\omega^{(0)} = \omega_k^{(0)}$ (k=0, ..., R) that becomes the extreme value in the approximation band. Provided letter of right shoulder (i) expresses the number of repetition.

Step 31

The Remez Exchange algorithms taking into account the frequency response of the pre-filter are executed (F 102, F 103, F 104).

Concretely, in the processing F 102, the interpolation polynomial expression is generated for interpolating an amplitude characteristic from the extreme value point at the time of $\omega_p^{(cur)}[t]$.

Subsequently, in the processing F 103, the new extreme value point is determined from the amplitude characteristic obtained from the interpolation polynomial expression.

Then, in the processing step F 104, repetition judgement of the Remez Exchange algorithms is executed.

Step 32

Next, the attenuation quantity of the stop band is examined (F 206).

The minimum attenuation quantity (the maximum weighted approximation error δ2) $dB_s^{(cur)}[t]$ is examined in the stop band while using the interpolation polynomial expression founded in the processing F 102.

Step 33

Next, comparison to the attenuation quantity of the designated stop band is executed (F 412).

Concretely, in the case that the result of the comparison satisfies the following equations (51) while comparing with the attenuation quantity dBs of the designated stop band, processing is moved to processing of Step 35 (F 105). When the result of the comparison does not satisfy equations (51), processing is moved to processing of Step 34 (F 413).

$$|dB_s^{(cur)}[t]| < |dB_s| \quad (51)$$

Step 34

One tap is increased (F 413).

Namely, one tap is increased in addition to the present number of taps, thus processing is moved to processing of Step 31.

Step 35

The coefficients of the linear-phase FIR filter is found from the approximated amplitude characteristic (F 105).

Namely, the coefficients of the linear-phase FIR filter is found from the amplitude characteristic obtained finally.

Figure 23:
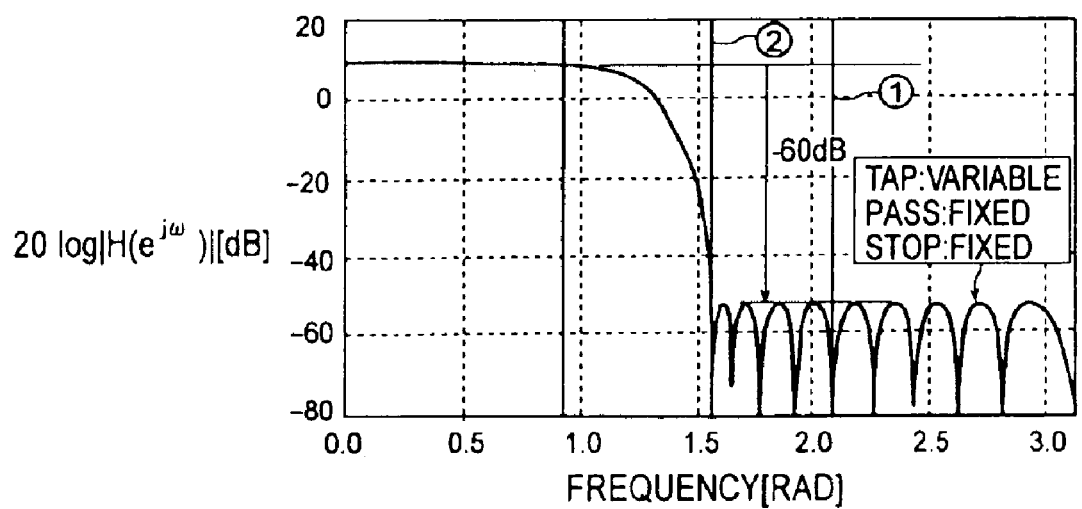
FIG. 23 is a view illustrating a frequency response of the filter with the minimum number of taps that satisfies an attenuation quantity of the stop band.

FIG. 23 is a view illustrating a frequency response characteristic of the low-pass filter obtained from the algorithms for finding "the minimum number of taps that satisfies attenuation quantity of the stop band" while taking the filter of the zero point for avoiding the chessboard distortion.

Fundamental algorithms, variables intended to find, and band of this case are as follows:

Fundamental Algorithms

It is the Remez Exchange algorithms taking into account frequency characteristic of the pre-filter.

the number of initial taps is 10 taps
even symmetry
U=3 (filter coefficient is executed U times such that DC gain becomes U)
attenuation quantity of the stop band is not more than −60 dB Variables Intended to Find
It is the number N of taps.

TABLE 5

| band | Band Frequency region | gain | weight |
| --- | --- | --- | --- |
| Pass band | $0 \leq \omega \leq 0.3\pi$ | 1 | 1 |
| Stop band | $0.5\pi \leq \omega \leq \pi$ | 0 | 1 |

Further, in FIG. 23, the solid line indicates a frequency response of a low-pass filter of the minimum number of taps (36 taps) in which the attenuation quantity of the stop band becomes not more than −60 dB. Furthermore, the dotted line indicated by ① indicates frequency which becomes a zero point for avoiding the chessboard distortion, and the dotted line indicated by ② indicates a period of the band given beforehand.

As known from FIG. 23, the low-pass filter which is obtained from the algorithms for finding "the minimum number of tap which realizes attenuation quantity of the stop band" according to the present invention has a good frequency response characteristic.

Subsequently, as the second modified example, explanation is provided about algorithms for finding a filter that causes the signal to pass a frequency point of a transition band that satisfies an attenuation quantity of the stop band.

Here, the following are free parameter in the algorithms, object, and the principle of the algorithms.

Free parameter: end frequency ωp of the pass band and starting frequency ωs of the stop band.

Object: it is an object to determine a band that satisfies attenuation quantity dBs and makes attenuation quantity dBc with a frequency ωc of a transition band pass through. Namely, it is an object to obtain the maximum end frequency ωp of the pass band and the minimum starting frequency ωs of the stop band by which the attenuation quantity dBc is realized with specific frequency ωc of the transition band.

Principle: the starting frequency of the pass band and the end frequency of the stop band are fixed, and the end frequency ωp of the pass band and the starting frequency ωs of the stop band are the free parameters. Since there are two free parameters, it is impossible to determine appropriately if moving simultaneously. Accordingly, one side of the parameter is fixed, while the other side of parameter that satisfies attenuation quantity of the stop band is found. When the band does not make the attenuation quantity dBc with the frequency ωc of the transition band pass through, it causes the fixed parameter to be changed. The above repetition is carried out so that the band which makes the attenuation quantity dBc with the frequency ωc of the transition band pass through is determined.

In the method for finding a parameter that satisfies the attenuation quantity of the stop band, there are two kinds of approaches.

Namely, the first approach is that a filter which has the minimum starting frequency of the stop band that satisfies the attenuation quantity of the stop band is found.

The second approach is that a filter which has the maximum end frequency of the pass band that satisfies the attenuation quantity of the stop band is found.

Algorithms on the basis of the above two kinds of approaches are explained successively.

Figure 24:
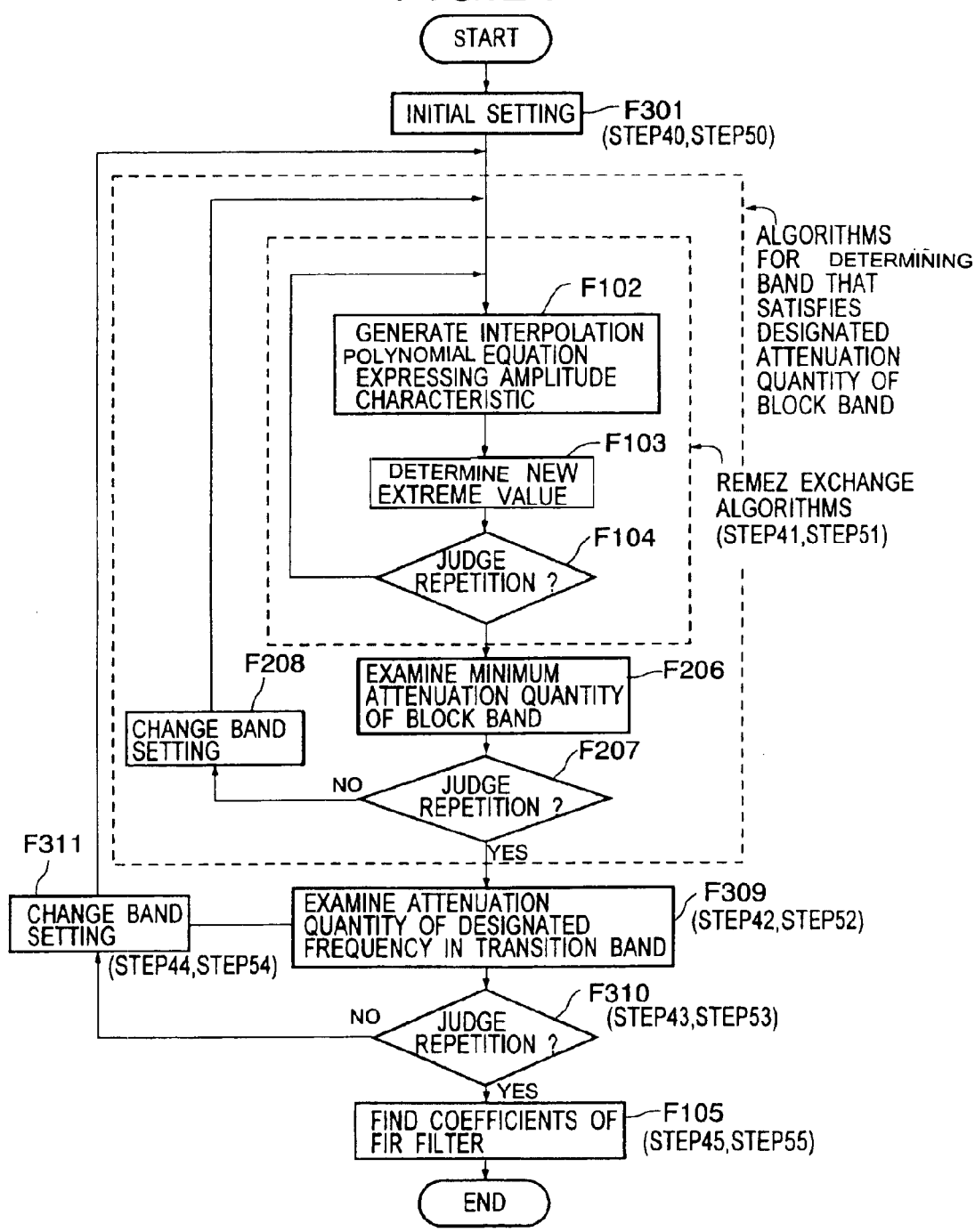
FIG. 24 is a view illustrating a flowchart of the algorithms for finding a filter that satisfies the attenuation quantity of the stop band and that enables the signal to be passed through the frequency point of the transition band.

FIG. 24 is a flowchart of algorithms for finding filter that satisfies the attenuation quantity of the stop band and that enables the signal to be passed through the frequency point of the transition band.

The algorithms on the basis of the filter having the minimum starting frequency of the stop band that satisfies the attenuation quantity of the stop band will be explained in relation to FIG. 24 to FIG. 29.

Namely, the present algorithms utilize the algorithms for finding a "filter having the minimum starting frequency of the stop band that satisfies the attenuation quantity of the stop band".

Figure 25:
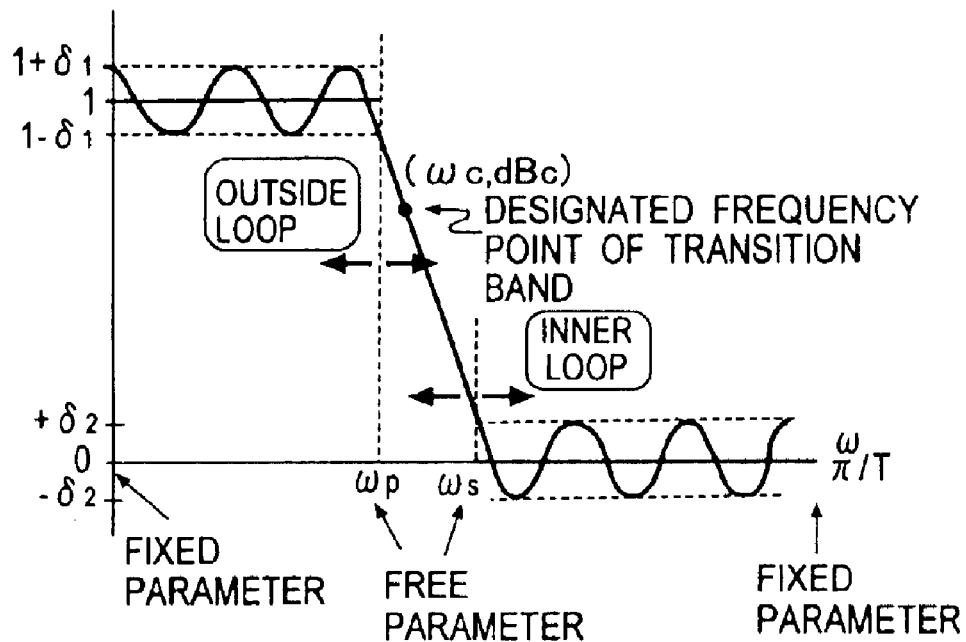
FIG. 25 is a view illustrating algorithms (1) for finding a filter that satisfies the attenuation quantity of the stop band and that enables the signal to be passed through the frequency point of the transition band.

During the concrete course of the algorithms, as illustrated in FIG. 25, ωs is obtained with the aforementioned algorithms as an inner loop, and a further loop for finding ωp is put on an outside thereof to determine parameter of the band. Namely, the outside loop causes the end frequency ωp of the pass band to be fixed, while the inner loop causes the starting frequency ωs of the stop band to be found that satisfies the attenuation quantity dBs of the stop band.

When the amplitude characteristic thus found does not pass through the designated point (ωc, dBc) of the transition band, ωp is searched while using a dichotomizing method like the case of searching for a "filter having the maximum end frequency of the pass band that satisfies the attenuation quantity of the stop band".

Hereinafter, concrete algorithms are indicated: however, since the algorithms for finding a "filter having the minimum starting frequency of the stop band that satisfies the attenuation quantity of the stop band" to be the inner loop is the same as that described above, thus description thereof is omitted.

Also, the content of FIG. 24 and each step processing F 102, F 103, F 104, and F 105 of the algorithms explained below, like the case of the first approach, is the same as the Remez Exchange algorithms taking into account the frequency response of the pre-filter explained in relation to FIG. 6. Further, the content of each processing F 206, F 207, F 208, like the case of the second approach, is the same as the processing explained in relation to FIG. 11 namely the algorithms of a "filter having the minimum starting frequency of the stop band that satisfies the attenuation quantity of the stop band". Accordingly, as for this processing, the same marks as FIG. 6 and FIG. 11 are used.

Step 40

As illustrated in FIG. 24, firstly, an initial setting is executed (F 301). In this initial setting, setting of a linear-phase FIR filter, setting of a band, setting of a coefficient of the pre-filter, setting of the initial extreme value point, designation of attenuation quantity of the stop band, and setting of initial frequency of dichotomizing method are executed.

Concrete items thus set are as follows:

the number of taps linear-phase FIR filter with even symmetry or odd symmetry the number of the band is two the starting frequency of the pass band ω=0 gain of the pass band the end frequency of the stop band ω=n gain of the stop band weighting to the pass band and the stop band coefficient of the pre-filter attenuation quantity dBs of the stop band (namely, pointing largeness δ2 of ripple of the stop band)

frequency ωc of the transition band and attenuation quantity dBc thereof frequency $\omega^{(0)} = \omega_k^{(0)}$ (k=0, ... , R) that becomes the extreme value in the approximation band. The provided letter of the right shoulder (i) expresses the number of repetition.

Figure 26:
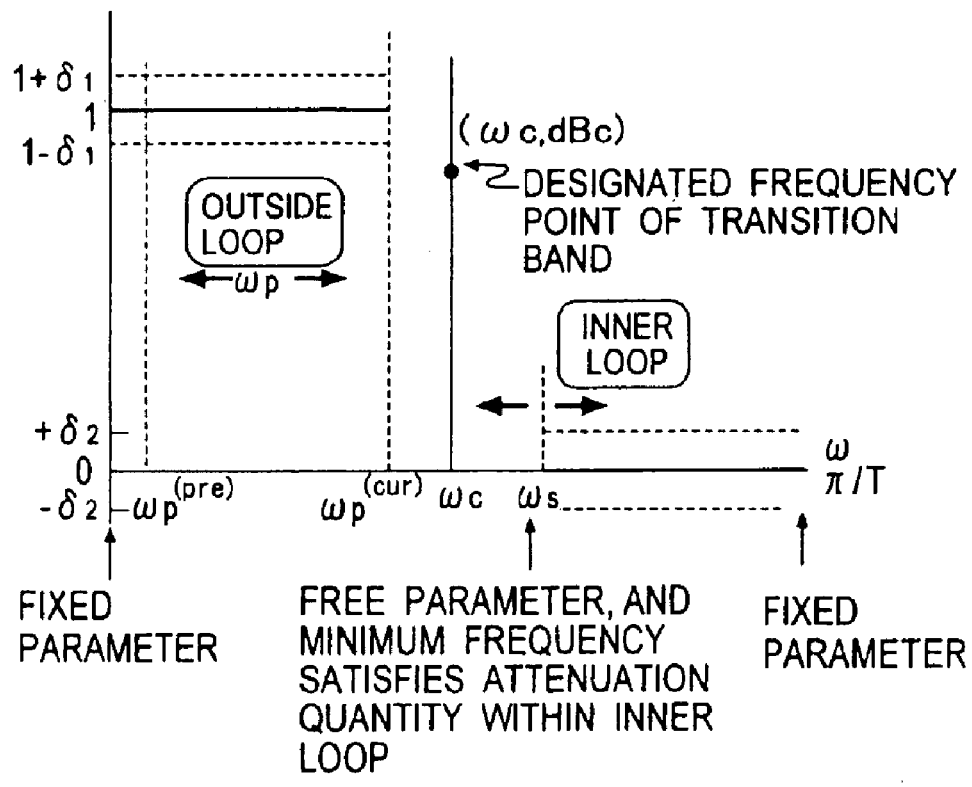
FIG. 26 is a view illustrating an initial frequency of the dichotomizing method in the algorithms for finding a filter that satisfies the attenuation quantity of the stop band and that enables the signal to be passed through the frequency point of the transition band.

Also, FIG. 26 is a view illustrating initial frequency of the dichotomizing method in the algorithms for finding a filter that causes the signal to pass the frequency point of the transition band, and that satisfies the attenuation quantity of the stop band.

As illustrated in FIG. 26, in the present example, the following values are given as the initial frequencies of the dichotomizing method.

$\omega_p^{(pre)}[0]$=the vicinity of a starting frequency of the pass band (52)

$\omega_p^{(cur)}[0]$=the vicinity of ωc (53)

A portion of [t] at the back of sop expresses the number of cycle.

Here, the Remez Exchange algorithms taking into account the frequency response of the pre-filter are executed to the frequency $\omega_p^{(pre)}[0]$; thus the minimum starting frequency $\omega_s^{(pre)}[0]$ of the stop band that satisfies the designated attenuation quantity dBs in me stop band is found, the gain $dB_c^{(cur)}[0]$ corresponding to ωc at this time is found. The following steps are explained on the basis of this assumption.

Step 41

The algorithms for finding a "filter having the minimum starting frequency of the stop band that satisfies the attenuation quantity of the stop band" is executed (F 102, F 103, F 104, F 206, F 207, F 208).

Concretely, in the processing F 102, an interpolation polynomial expression is generated for interpolating an amplitude characteristic from the extreme value point at the time of $\omega_p^{(cur)}[t]$.

Subsequently, in the processing F 103, the new extreme value point is determined from the amplitude characteristic obtained from the interpolation polynomial expression.

Then, in the processing F 104, repetition judgement of the Remez Exchange algorithms is executed.

Next, in the processing F 206, the minimum attenuation quantity is found in the stop band.

Next, in the processing F 201, an end condition of the algorithms for finding a filter having the minimum starting frequency (ωs of the stop band that satisfies the attenuation quantity of the stop band is obtained.

Also, in the processing F 208, setting of the starting frequency $\omega_s^{(cur)}$ of the new stop band is executed.

Step 42

Next, the attenuation quantity of the frequency that is designated as the transition band (F 309) is examined.

In the processing F 102, the attenuation quantity $dB_c^{(cur)}[t]$ to the frequency ωc which is designated as the transition band while using LaGrange's interpolation polynomial expression found finally with the algorithms for finding "the minimum starting frequency of the stop band that satisfies the attenuation quantity of the stop band" is examined.

Step 43

Comparison to the designated attenuation quantity of the transition band is executed (F 310).

Concretely, in the case that the result of the comparison satisfies following equations (54) or (55) processing is moved to processing of Step 45 (F 105). While when the result of the comparison does not satisfy equations (54) or (55), processing is moved to processing of Step 44 (F 311).

$$|dB_r^{(cur)}[t] - dB_c| \le \epsilon_1 \quad (54)$$

$$|\omega_p^{(cur)}[t] - \omega_p^{(pre)}[t]| \le \epsilon_2 \quad (55)$$

Provided that $\epsilon 1$ and $\epsilon 2$ are extremely small values.

Step 44

Setting of the band is changed when the result of the comparison does not satisfy equations (54) or (55), in the comparison between the frequency $\omega c$ of the transition band and the attenuation quantity dBc (F 311)

Concretely, the end frequency $\omega_p^{(cur)}[t+1]$ of a new pass band is set. Explanation is performed while dividing into two cases of the first loop and the second loop as the setting method.

First Time:

In the case of the first time, there are three cases illustrated in FIGS. 27A to 27C.

Namely, cases illustrated in FIG. 27A, FIG. 27B, and FIG. 27C are considered to frequencies $\omega_p^{(pre)}[0]$, $\omega_p^{(cur)}[0]$.

The case illustrated in FIG. 27A is one in which both satisfy the designated attenuation quantity dBc. In this case, the large frequency $\omega_p^{cur}[0]$ is taken to be solution, thus advancing toward the processing of Step 45.

The case illustrated in FIG. 27B is one in which both do not satisfy the designated attenuation quantity. In this case, the present number of taps cannot realize the designated attenuation quantity. Accordingly, that effect is indicated to end.

The case illustrated in FIG. 27C is one in which only one side satisfies the designated attenuation quantity. In this case, processing is moved to Step 41 in such a way as following equation (56).

Further, in the present method for giving initial frequency point, there does not exist the case in which $\omega_p^{(cur)}[0]$ is satisfied and $\omega_p^{(pre)}[0]$ is not satisfied.

$$\omega_p^{(pre)}[1]=\omega_p^{(cur)}[0] \omega_p^{(cur)}[1]=0.5 \times (\omega_p^{(cur)}[0]+\omega_p^{(pre)}[0]) \; dB_p^{(pre)}[1]=dB_c^{(pre)}[0] \quad (56)$$

Second Time and Later:

In the case of a second time and later, two cases indicated in FIGS. 28A and 28B are considered. In the determining method of the new frequency $\omega_p^{(cur)}[t+1]$ in the second time and later, the frequency which satisfies the attenuation quantity aBc thus designated is preserved invariably within $\omega_p^{(pre)}[t+1]$. The case illustrated in FIG. 28A, the characteristic shown in FIG. 28B is considered to the frequencies $\omega_p^{(pre)}[t]$, $\omega_p^{(cur)}[t]$ The case illustrated in FIG. 28A is one in which one side satisfies the designated attenuation quantity. In this case, the processing is moved to next the step 41 in such a way as the following equation (57).

Further, since the frequency which satisfies the designated attenuation quantity always conforms to 15 $\omega_p^{(pre)}[t]$, the case that $\omega_p^{(pre)}[t]$ does not satisfy does not exist.

$$\omega_p^{(pre)}[t+1]=\omega_p^{(pre)}[t] \omega_p^{(cur)}[t+1]=0.5 \times (\omega_p^{(cur)}[t]+\omega_p^{(pre)}[t]) \; dB_p^{(pre)}[t+1]=dB_c^{(pre)}[t] \quad (57)$$

The case illustrated in FIG. 28B is one in which the both satisfies the designated attenuation quantity. In this case, the processing is moved to next step 41 in such a way as the following equation (58).

$$\omega_p^{(pre)}[t+1]=\omega_p^{(cur)}[t] \omega_p^{(cur)}[t+1]=\omega_p^{(cur)}[t]+0.5 \times (\omega_p^{(cur)}[t]-\omega_p^{(pre)}[t]) \; i \; dB_c^{(pre)}[t+1]=dB_c^{(cur)}[t] \quad (58)$$

Step 45

The coefficients of the linear-phase FIR filter is found from the approximated amplitude characteristic (F 105).

Namely, the coefficients of the linear-phase FIR filter are found from the amplitude characteristic obtained finally.

Figure 29:
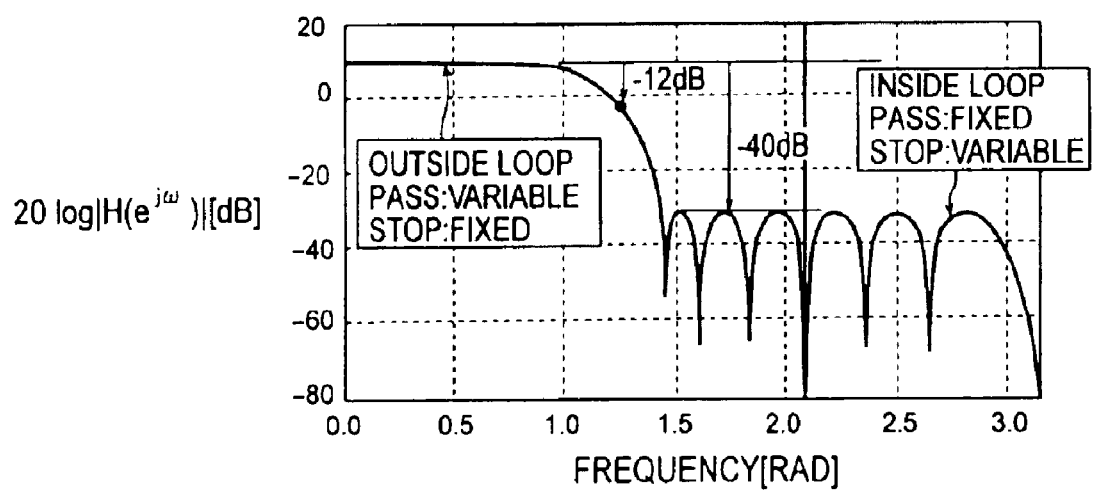
FIG. 29 is a view illustrating a frequency response (1) of the filter that satisfies the attenuation quantity of the stop band and that enables the signal to be passed through the frequency point of the transition band.

FIG. 29 is a view illustrating a frequency response characteristic of the low-pass filter obtained from the algorithms for finding a "filter that satisfies the attenuation quantity of the stop band and that causes the signal to pass the frequency point of the transition band" on the basis of the algorithms for finding a "filter having the minimum starting frequency of the stop band while taking the filter of the zero point for avoiding the chessboard distortion".

Fundamental algorithms, variables intended to find, and band of this case are as follows:

Fundamental Algorithms

It is the Remez Exchange algorithms for finding the minimum starting frequency of the stop band that satisfy the attenuation quantity of the stop band.

passing through (0.4 n, 12 dB)

24 taps even symmetry

U=3 (filter coefficient is executed U times such that DC gain becomes U)

attenuation quantity of the stop band is not more than −40 dB

Variables Intended to Find

It is the end frequency $\omega p$ of the pass band and the starting frequency $\omega s$ of the stop band.

TABLE 6

| | Band | | |
|---|---|---|---|
| band | Frequency region | gain | weight |
| Pass band | $0 \le \omega \le \omega_p$ | 1 | 1 |
| Stop band | $\omega_s \le \omega \le \pi$ | 0 | 1 |

Further, in FIG. 29, the solid line satisfies the attenuation quantity of the stop band and indicates a frequency response of a low-pass filter causing the frequency point of the transition band to pass through.

Furthermore, the black circle indicates the designated frequency point. Also, the dotted line indicates a frequency which becomes zero point for avoiding the chessboard distortion.

As known from FIG. 29, the low-pass filter which is obtained from the algorithms for finding a "filter that causes the signal to pass the frequency point of the transition band and that satisfies the attenuation quantity of the stop band" on the basis of a "filter having the minimum starting frequency of the stop band" has good frequency response characteristic.

Subsequently, as for algorithms on the basis of the algorithms for finding a filter having the maximum end frequency of the pass band that satisfies the attenuation quantity of the stop band, explanation is made in relation to FIG. 24, FIG. 30 to FIGS. 33A and 33B.

The flowchart of this case is equivalent to. FIG. 24 which is referred to in the algorithms for finding a filter that causes the signal to pass the frequency point of the transition band and that satisfies the attenuation quantity of the stop band.

Namely, the present algorithms utilize the algorithms for finding a "filter having the maximum end frequency of the pass band that satisfies the attenuation quantity of the stop band".

Figure 30:
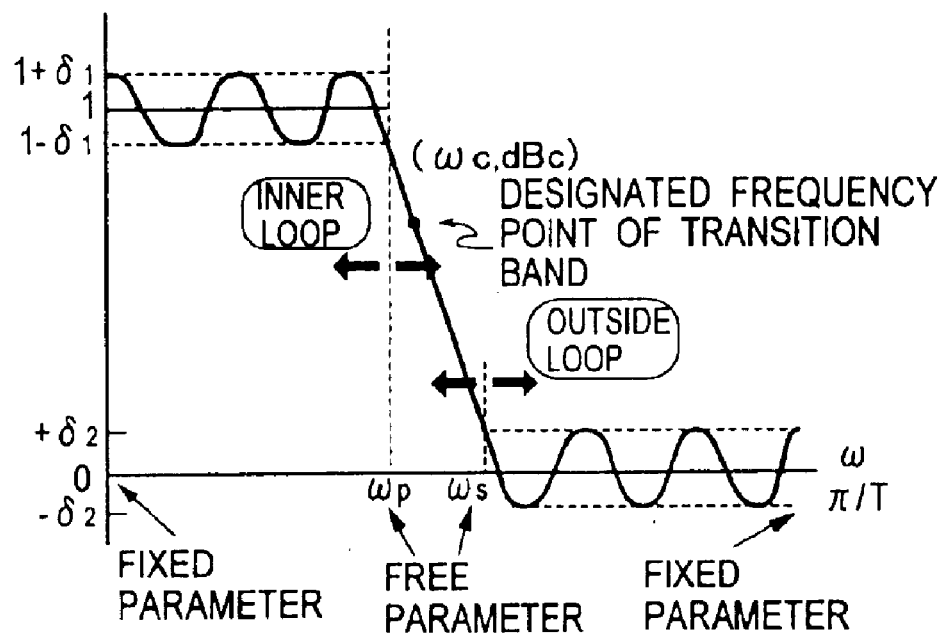
FIG. 30 is a view illustrating algorithms (2) for finding a filter that satisfies the attenuation quantity of the stop band and that enables the signal to be passed through the frequency point of the transition band.

In the concrete course of the algorithms, as illustrated in FIG. 30, ωp is obtained with the aforementioned algorithms as an inner loop, and a further loop for finding ωs is put on outside thereof to determine parameter of the band.

Namely, the outside loop causes the starting frequency ωs of the stop band to be fixed, while the inner loop causes the end frequency ωp of the pass band to be found that satisfies the attenuation quantity dBs of the stop band.

When the amplitude characteristic thus found does not pass through the designated point (ωc, dBc) of the transition band, ωs is searched while using dichotomizing method like the case of searching a "filter having the minimum starting frequency of the stop band that satisfies the attenuation quantity of the stop band".

Hereinafter, concrete algorithms are indicated, however, since the algorithms for finding a "filter having the maximum end frequency of the pass band that satisfies the attenuation quantity of the stop band" to be the inner loop is the same as that described above; thus description thereof is omitted.

Also, the content of FIG. 24 and each step processing F 102, F 103, F 104, and F 105 of the algorithms explained below, like the case of the first approach, is the same as the Remez Exchange algorithms taking into account the frequency response of the pre-filter explained in relation to FIG. 6. Further, the content of each processing F 206, F 207, F 208, like the case of the second approach, is the same as processing explained in relation to FIG. 11 namely the algorithms of a "filter having the minimum starting frequency of the stop band that satisfies the attenuation quantity of the stop band". Accordingly, as for this processing, the same marks as FIG. 6 and FIG. 11 are used.

Step 50

As illustrated in FIG. 24, firstly, an initial setting is executed (F 301). In this initial setting, setting of the linear-phase FIR filter, setting of the band, setting of the coefficient of the pre-filter, setting of the initial extreme value point, designation of the attenuation quantity of the stop band, and setting of the initial frequency of dichotomizing method are executed.

Concrete items thus set are as follows:
the number of taps
linear-phase FIR filter with even symmetry or odd symmetry
the number of the band is two
the starting frequency of the pass band ω=0
gain of the pass band
the end frequency of the stop band ω=n
gain of the stop band
weighting to the pass band and the stop band
coefficient of the pre-filter
attenuation quantity dBs of the stop band (namely, pointing largeness δ2 of ripple of the stop band)
frequency ωc of the transition band and attenuation quantity dBc thereof
frequency $\omega^{(0)}=\omega_k^{(0)}(k=0, \ldots, R)$ that becomes the extreme value in the approximation band. The provided letter of right shoulder (i) expresses the number of repetition.

Figure 31:
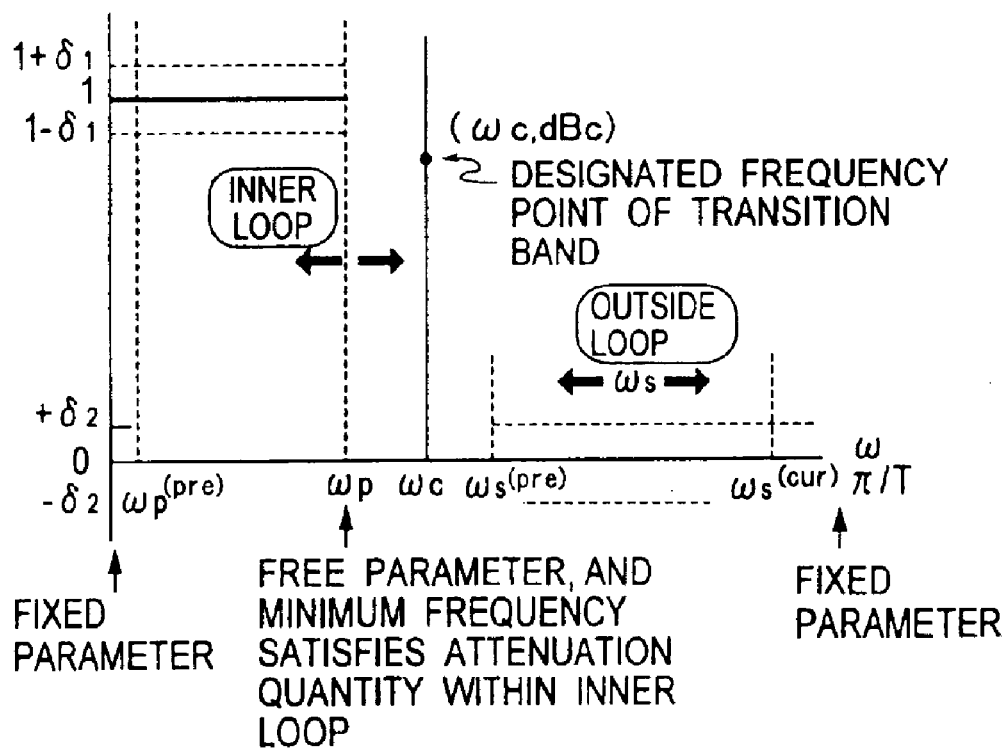
FIG. 31 is a view illustrating an initial frequency of the dichotomizing method in the algorithms for finding a filter that satisfies the attenuation quantity of the stop band and that enables the signal to be passed through the frequency point of the transition band.

Also, FIG. 31 is a view illustrating an initial frequency of the dichotomizing method in the algorithms for finding filter that causes the signal to pass through the frequency point of the transition band, and that satisfies the attenuation quantity of the stop band.

As illustrated in FIG. 31, in the present example, the following values are given as the initial frequencies of the dichotomizing method.

$$\omega_s^{(cur)}[0]=\text{the vicinity of end frequency of the block band} \quad (59)$$

The other side of $\omega_s^{(pre)}[0]$ is one which is found with the algorithms for searching a "filter having the minimum starting frequency of the stop band that satisfies the attenuation quantity of the stop band" as the value described later. Namely, ωs which is found by the above algorithms is taken to be $\omega_p^{(pre)}[0]$=the vicinity of starting frequency of the pass band +tm (60)

It should be noted that ωp should be made to search as later described in equation (61) essentially, however, ωp that satisfies the attenuation quantity of the stop band can not be found. Accordingly, since the minimum value of the cap is degree of 0.01, the starting frequency ωs of the stop band that satisfies the attenuation quantity of the stop band at this time is taken to be the initial frequency.

$$\omega_s^{(cur)}[0]=\text{the vicinity of } \omega c \quad (61)$$

The portion of [t] at the back of ωs expresses the number of cycle.

Here, the Remez Exchange algorithms taking into account the frequency response of the pre-filter are executed to the frequency $\omega_s^{(pre)}[0]$, thus the maximum end frequency $\omega_p^{(pre)}[0]$ of the pass band that satisfies the designated attenuation quantity dBs in the stop band is found, and the gain $dB_c^{(cur)}[0]$ corresponding to ωc at this time is found. The following steps are explained on the basis of this assumption.

Step 51 The algorithms for finding a "filter having the maximum end frequency of the pass band that satisfies the attenuation quantity of the stop band" is executed (F 102, F 103, F 104, F 206, F 207, F 208).

Concretely, in the processing F 102, an interpolation polynomial expression is generated for interpolating an amplitude characteristic from the extreme value point at the time of $\omega_s^{(cur)}[t]$.

Subsequently, in the processing F 103, the new extreme value point is determined from the amplitude characteristic obtained from the interpolation polynomial expression.

Then, in the processing F 104, repetition judgement of the Remez Exchange algorithms is executed.

Next, in the processing F 206, the minimum attenuation quantity is found in the stop band.

Next, in the processing F 207, an end condition of the algorithms for finding a filter having the minimum starting frequency ωs of the stop band that satisfies the attenuation quantity of the stop band is obtained.

Also, in the processing F 208, setting of the starting frequency $\omega_p^{(cur)}$ of the new stop band is executed.

Step 52

Next, the attenuation quantity of the frequency that is designated as the transition band (F 309) is examined.

In the processing F 102, the attenuation quantity to the frequency ωc which is designated as the transition band while using LaGrange's interpolation polynomial expression found finally with the algorithms for finding "the maximum end frequency of the stop band that satisfies the attenuation quantity of the stop band" is examined.

Step 53 Comparison to the designated attenuation quantity of the transition band is executed (F 310).

Concretely, in the case that result of the comparison satisfies the following equations (62) or (63) processing is moved to processing of Step 55 (F 105). When the result of the comparison does not satisfy equations (62) or (63), processing is moved to processing of Step 54 (F 311).

$$|\omega_p^{(cur)}[t] - \omega_p^{(pre)}[t]| < \epsilon_2 \quad (63)$$

Provided that $\epsilon_1$ and $\epsilon_2$ are extremely small values.

Step 44

Setting of the band is changed when the result of the comparison does not satisfy equations (62) or (63), in the comparison between the frequency ωc of the transition band and the attenuation quantity dBc (F 311).

Concretely, the end frequency $\omega_s^{(cur)}[t]$ of a new pass band is made to set. Explanation is provided while dividing into two cases of the first loop and the second loop as the setting method.

Figure 32A:
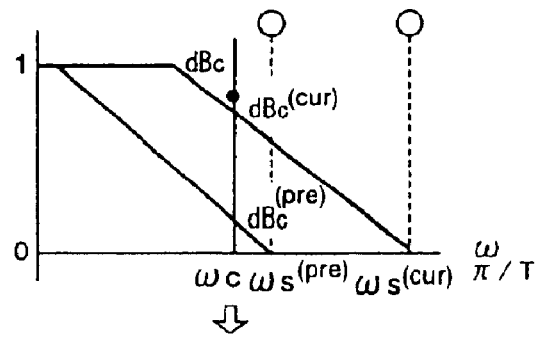
FIGS. 32A to 32C are views illustrating a change of band setting in a loop of the first time.
Figure 32B:
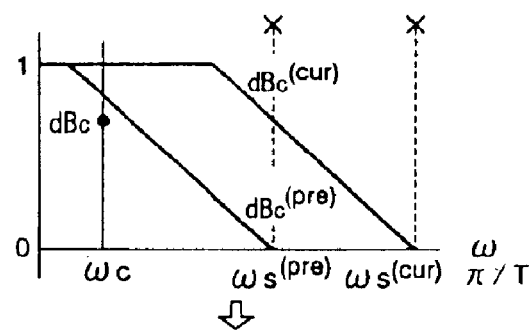
Figure 32C:
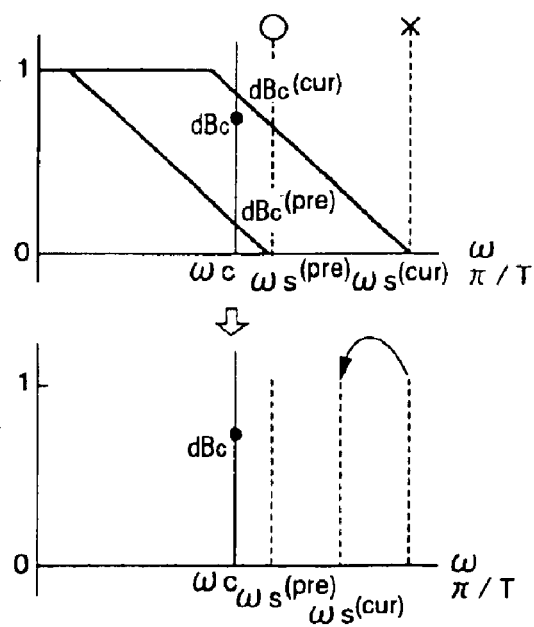

First Time:

In the case of the first time, there are three cases illustrated in FIGS. 32A to 32C.

Namely, cases illustrated in FIG. 32A, FIG. 32B, and FIG. 32C are considered to frequencies $\omega_s^{(pre)}[0], \omega_s^{(cur)}[0]$ The case illustrated in FIG. 32A is one in which both satisfy the designated attenuation quantity dBc. In this case, the large frequency $\omega_s^{(cur)}[0]$ is taken to be a solution, thus advancing toward the processing of Step 55.

The case illustrated in FIG. 32B is one in which both do not satisfy the designated attenuation quantity. In this case, the present number of taps cannot realize the designated attenuation quantity. Accordingly, that effect is indicated to end.

The case illustrated in FIG. 32C is one in which only one side satisfies the designated attenuation quantity. In this case, processing is moved to Step 51 in such a way as following equation (64).

Further, in the present method for giving an initial frequency point, the case does not exist in which $\omega_s^{(cur)}[0]$ is satisfied and $\omega_s^{(pre)}[0]$ is not satisfied.

$$\omega_s^{(pre)}[1] = \omega_s^{(cur)}[0]\omega_s^{(pre)}[0] = 0.5 \times (\omega_s^{(cur)}[0] + \omega_s^{(pre)}[0]) \ dB_s^{(pre)}[1] = dB_c^{(pre)}[0] \quad (64)$$

Figure 33A:
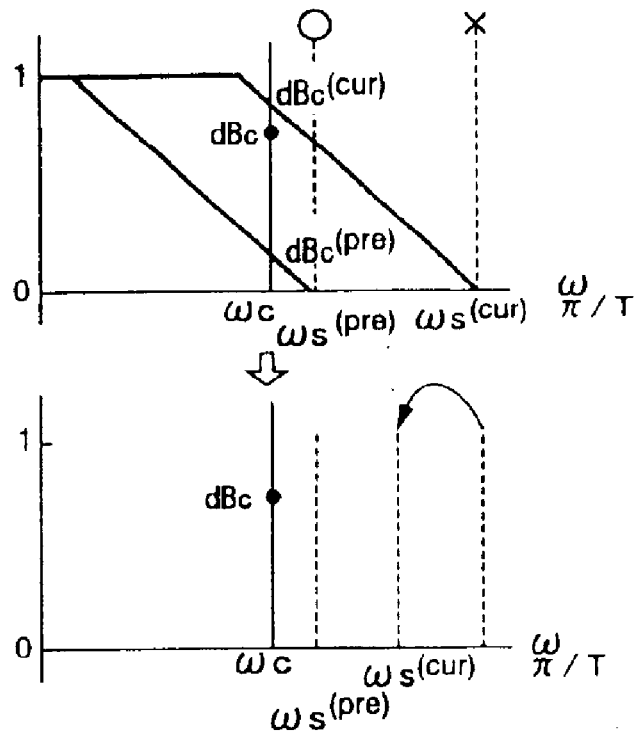
FIGS. 33A and 33B are views illustrating a change of band setting in a loop after the second time and later.
Figure 33B:
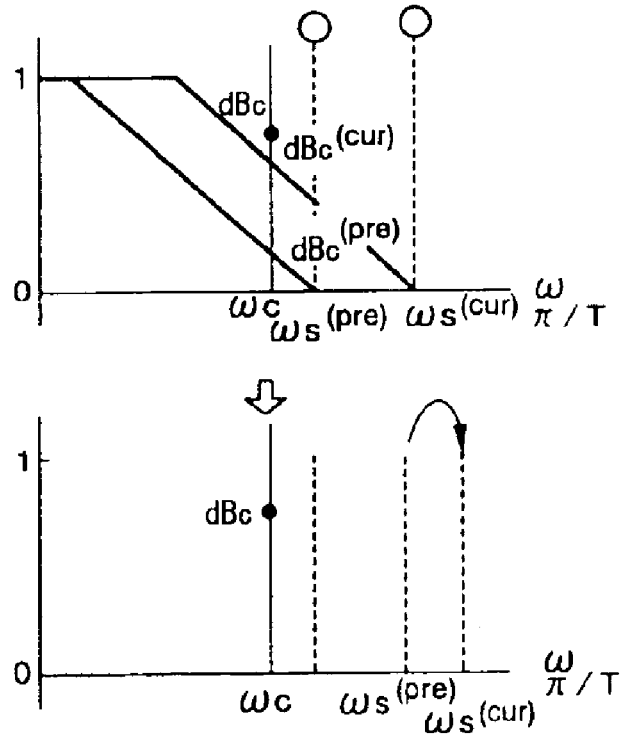

Second Time and Later:

In the case of a second time and later, two cases indicated in FIGS. 33A and 33B are considered. In the determining method of the new frequency $\omega_s^{(cur)}[t+1]$ in the second time and later, the frequency which satisfies the attenuation quantity dBc thus designated is preserved invariably within $\omega_s^{(pre)}[t+1]$. The case illustrated in FIG. 33A, FIG. 33B is considered to the frequencies $\omega_s^{(pre)}[t], \omega_s^{(cur)}[t]$. The case illustrated in FIG. 33A is one in which one side satisfies the designated attenuation quantity. In this case, the processing is moved to a next step 51 in such a way as the following equation (65).

Further, since the frequency that satisfies the designated attenuation quantity always conforms to 5 $\omega_s^{(cur)}[t]$, the case that $\omega_s^{(pre)}[t]$ does not satisfy does not exist.

$$\omega_s^{(pre)}[t+1] = \omega_s^{(pre)}[t]\omega_s^{(cur)}[t+1] = 0.5 \times (\omega_s^{(cur)}[t] + \omega_s^{(pre)}[t]) \ dB_s^{(pre)}[t+1] = dB_c^{(pre)}[t] \quad (65)$$

The case illustrated in FIG. 33B is a case that both satisfy the designated attenuation quantity. In this case processing is moved to next step 51 in accordance with following equation (66).

$$\omega_s^{(pre)}[t+1] = \omega_s^{(cur)}[t]\omega_p^{(cur)}[t+1] = \omega_s^{(cur)}[t] + 0.5 \times (\omega_s^{(cur)}[t] - \omega_s^{(pre)}[t]) \ dB_c^{(pre)}[t+1] = dB_c^{(cur)}[t] \quad (66)$$

Step 55 The coefficients of the linear-phase FIR filter are found from the approximated amplitude characteristic (F 105).

Namely, the coefficients of the linear-phase FIR filter are found from the amplitude characteristic obtained finally.

Figure 34:
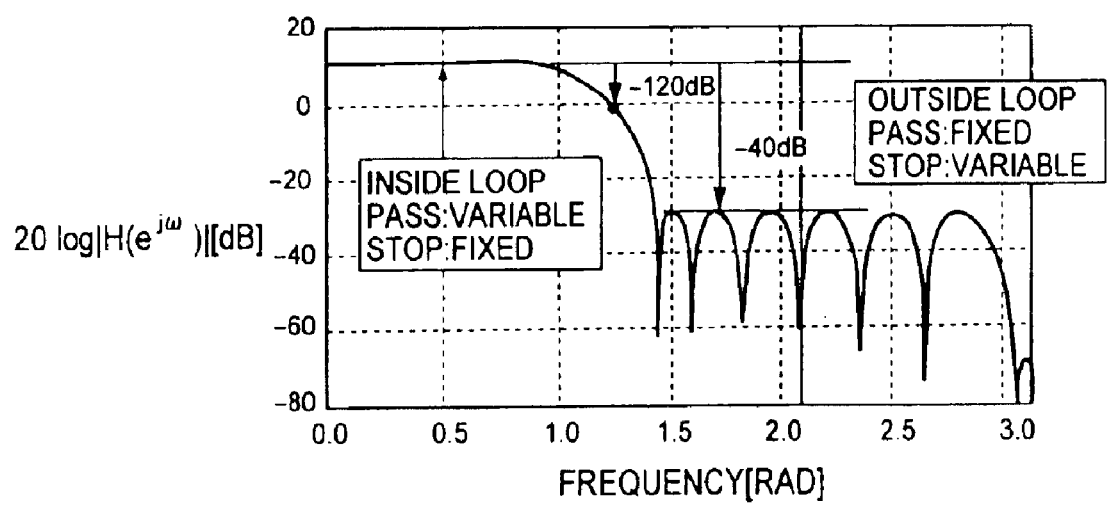
FIG. 34 is a view illustrating a frequency response (2) of the filter that satisfies the attenuation quantity of the stop band and that enables the signal to be passed through the frequency point of the transition band.

FIG. 34 is a diagram illustrating frequency response characteristic of the low-pass filter obtained from the algorithms for finding a "filter that satisfies the attenuation quantity of the stop band and that enables the signal to be passed through the frequency point of the transition band" on the basis of the algorithms for finding a "filter having the maximum end frequency of the pass band" with the filter of zero point for avoiding the chessboard distortion to be the pre-filter.

Fundamental algorithms, variables intended to find, and band of this case are as follows:

Fundamental Algorithms

It is the Remez Exchange algorithms for finding the minimum starting frequency of the stop band that satisfies the attenuation quantity of the stop band.

passing through (0.4 n, 12 dB)

24 taps even symmetry

U=3 (filter coefficient is executed U times such that DC gain becomes U)

attenuation quantity of the stop band is not more than −40 dB

Variables Intended to Find

It is the end frequency (ωωof the pass band and the starting frequency of the stop band.

TABLE 7

| band | Frequency region | gain | weight |
|---|---|---|---|
| Pass band | $0 \leq \omega \leq \omega_p$ | 1 | 1 |
| Stop band | $\omega_s \leq \omega \leq \pi$ | 0 | 1 |

Further, in FIG. 34, the solid line satisfies the attenuation quantity of the stop band and indicates a frequency response of a low-pass filter causing the signal to be passed through the frequency point of the transition band.

Furthermore, the black circle indicates the designated frequency point. Also, dotted line indicates a frequency which becomes a zero point for avoiding the chessboard distortion.

As known from FIG. 34, the low-pass filter which is obtained from the algorithms for finding a "filter that causes the signal to be passed through the frequency point of the transition band and that satisfies the attenuation quantity of the stop band" on the basis of a "filter having the minimum starting frequency of the stop band" has good frequency response characteristic.

Subsequently, the algorithms for designing of filter in order to find filter with the minimum number of tap that satisfies attenuation quantity of the stop band will be explained against the Remez Exchange algorithms with a changeable band.

Here, the algorithms for obtaining a filter having the minimum number of taps that satisfies an attenuation quantity of the designated stop band will be explained against the algorithms for obtaining a filter that has the maximum end frequency op of the pass band, which end frequency satisfies an attenuation quantity of the stop band and against the algorithms for obtaining a filter having the minimum starting frequency ωs of the stop band that satisfies the attenuation quantity of the stop band.

Figure 35:
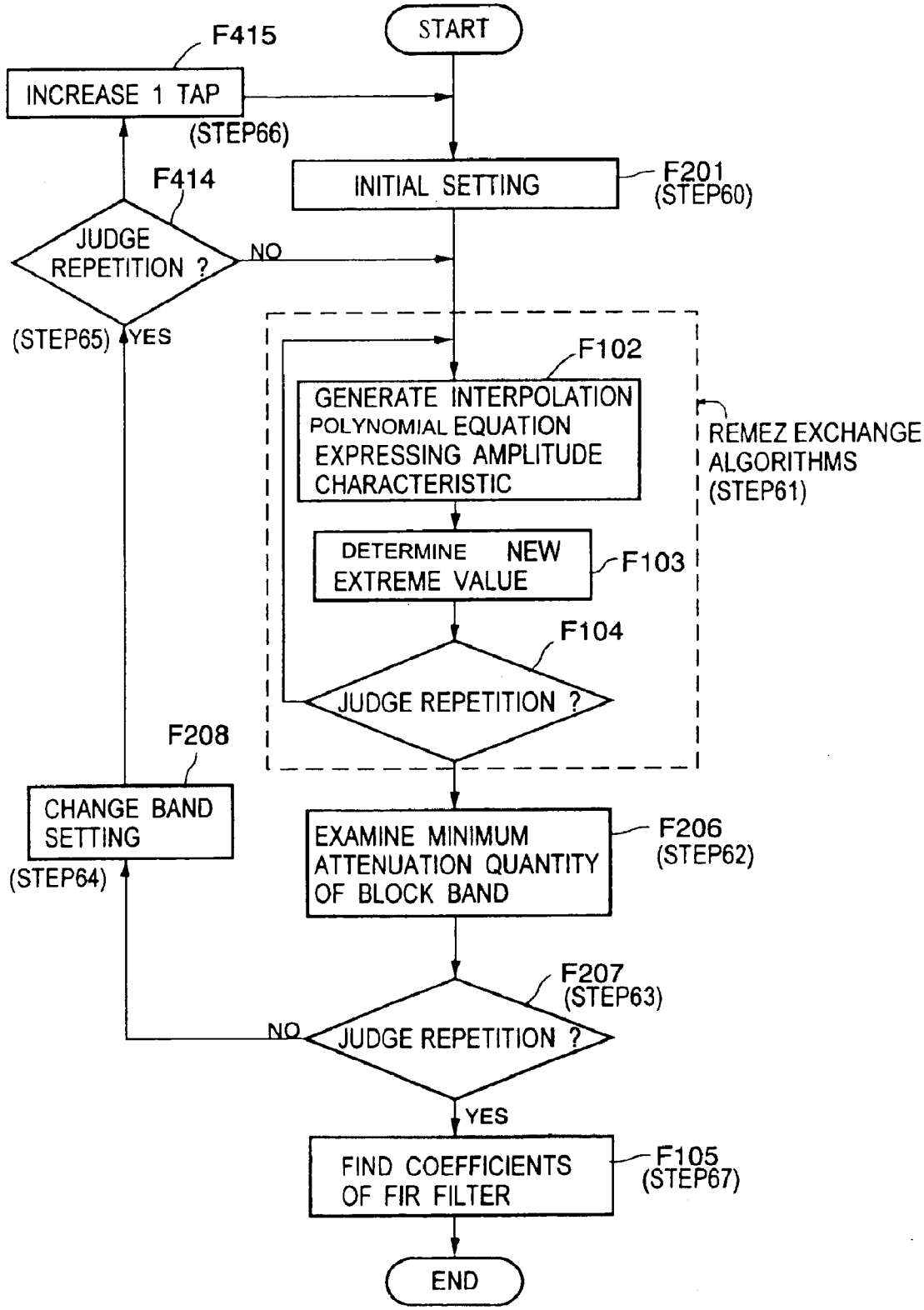
FIG. 35 is a view illustrating a flowchart of the algorithms for finding a filter with the minimum number of taps that satisfies an attenuation quantity of the stop band.

FIG. 35 is a view illustrating a flowchart of the algorithms for finding a filter with the minimum number of taps that realizes an attenuation quantity of the stop band.

Here, a free parameter of this algorithms, an object, and a principle of the algorithms thus enumerated are as follows:

free parameter:

it is the number of taps there exists two kinds of approaches.

Firstly, the end frequency ωp of the pass band is made to be variable, and the starting frequency ms of the stop band is made to be fixed.

Secondly, the end frequency ωp of the pass band is made to be fixed, and the starting frequency ωs of the stop band is made to be variable.

object: it is an object to obtain a filter having the minimum number of taps that satisfies an attenuation quantity dBs of the designated stop band to the algorithms in which one of the variables of the band is variable.

principle: When being given no-solution in one time of loop, it is impossible to satisfy the attenuation quantity of the designated stop band because the number of taps is short, an attempt is executed while increasing the number of tap by one.

Also, the content of FIG. 35 and each step processing F 102, F 103, F 104, and F 105 of the algorithms explained below, like the case of the first approach, is the same as the Remez Exchange algorithms taking into account the frequency response of the pre-filter explained in relation to FIG. 6. Further, the content of each processing F 201, F 206, F 207, F 208, like the case of the second approach, is the same as processing explained in relation to FIG. 11 namely the algorithms of a "filter having the maximum end frequency of the pass band that satisfies the attenuation quantity of the stop band" and the algorithms of a "filter having the minimum starting frequency of the stop band that satisfies the attenuation quantity of the stop band". Accordingly, as for this processing, the same marks as FIG. 6 and FIG. 11 are used.

Step 60 As illustrated in FIG. 35, firstly, an initial setting is executed (F 201). In this initial setting, setting of linear-phase FIR filter, setting of band, setting of coefficient of the pre-filter, setting of the initial extreme value point, designation of attenuation quantity of the stop band, and setting of initial frequency of dichotomizing method are executed.

Concrete items thus set are as follows:

the number of taps linear-phase FIR filter with even symmetry or odd symmetry the number of the bands is two the starting frequency of the pass band ω=0 end frequency ωp of the pass band in the case of the algorithms for finding a "filter having the minimum starting frequency of the stop band that satisfies the attenuation quantity of the stop band".

gain of the pass band the end frequency of the stop band ω=n starting frequency ωs of the stop band in the case of the algorithms for finding a "filter having the maximum end frequency of the pass band that satisfies the attenuation quantity of the stop band".

gain of the stop band weighting in connection with the pass band and the stop band coefficient of the pre-filter attenuation quantity dBs of the stop band (namely, pointing largeness δ2 of ripple of the stop band)

frequency $\omega^{(0)} = \omega_k^{(0)}$ (k=0, . . . , R) that becomes the extreme value in the approximation band. The provided letter of the right shoulder (i) expresses the number of repetition.

input of initial frequency of dichotomizing method

Step 61

The Remez Exchange algorithms taking into account the frequency response of the pre-filter are executed (F 102, F 103, F 104).

Concretely, in the processing F 102, the interpolation polynomial expression is generated for interpolating an amplitude characteristic from the extreme value point.

Subsequently, in the processing F 103, the new extreme value point is determined from the amplitude characteristic obtained from the interpolation polynomial expression.

Then, in the processing F 104, repetition judgement of the Remez Exchange algorithms is executed.

Step 62

Next, the minimum attenuation quantity (the maximum weighted approximation error) of the stop band is obtained (F 206).

Step 63

Discrimination is executed whether or not the end condition of the search of the frequency that satisfies the attenuation quantity of the designated stop band holds (F 207).

When the end condition holds, processing is moved to Step 67 (F 105), while when the end condition does not hold, processing is moved to Step 64 (F 208).

Step 64 When the end condition does not hold in connection with the search algorithms of the frequency that satisfies the attenuation quantity of the designated stop band, the setting of the band is changed (F 208).

Step 65

Next, comparison to the attenuation quantity of the designated stop band is executed (F 414).

In the setting change of the band in the processing F 208, in the case of no solution at the one time loop processing is moved to processing of Step 66 (F 414). While with the exception of the aforementioned case, processing is returned to processing of Step 61.

Step 66

One tap is increased (F 415).

One tap is increased in addition to the present number of taps, thus processing is moved to initial setting processing of Step 60 (F 201).

Step 67

The coefficients of the linear-phase FIR filter is found from the approximated amplitude characteristic (F 105).

Figure 36:
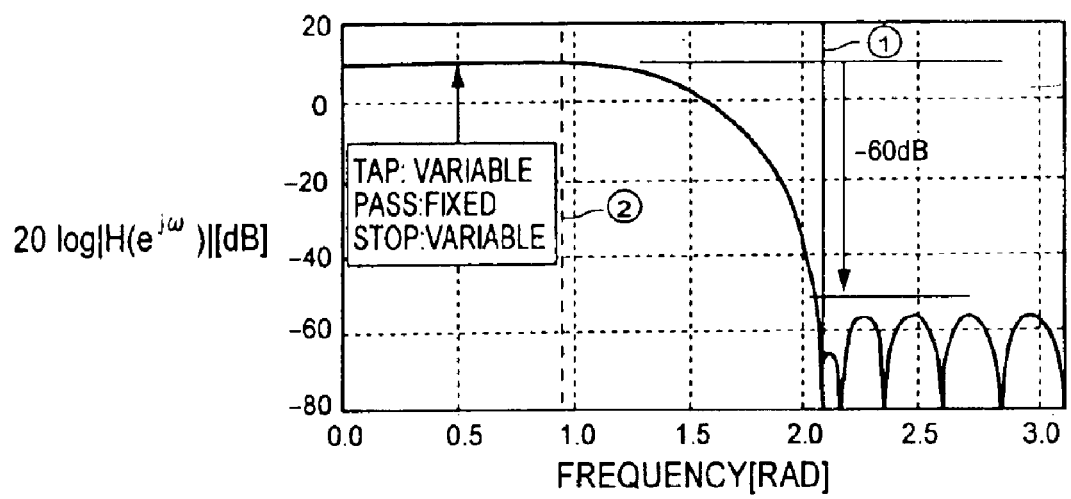
FIG. 36 is a view illustrating a frequency response of the filter with the minimum number of taps that satisfies an attenuation quantity of the stop band.

FIG. 36 is a view illustrating a frequency response characteristic of the low-pass filter obtained from the algorithms for finding "the minimum number of taps that satisfies attenuation quantity of the stop band" while taking the filter of the zero point for avoiding the chessboard distortion.

Fundamental algorithms, variable intended to find, and bands of this case are as follows:

Fundamental Algorithms

It is the Remez Exchange algorithms taking into account frequency characteristic of the pre-filter for finding the filter which has the minimum starting frequency of the stop band that satisfies the attenuation quantity of the stop band.

even symmetry

U=3 (filter coefficient is executed U times such that DC gain becomes U)

attenuation quantity of the stop band is not more than −60 dB Variable intended to find it is the number N of tap.

the starting frequency ωs of the stop band.

TABLE 8

| band | Band Frequency region | gain | weight |
|---|---|---|---|
| Pass band | $0 \leq \omega \leq 0.3\pi$ | 1 | 1 |
| Stop band | $\omega_s \leq \omega \leq \pi$ | 0 | 1 |

Further, in FIG. 36, the solid line indicates a frequency response of a low-pass filter of the minimum number of taps (14 taps) in which the attenuation quantity of the stop band becomes not more than −60 dB. Furthermore, the dotted line indicated by ① indicates frequency which becomes zero point for avoiding the chessboard distortion, and the dotted line indicated by ② indicates period of the band given beforehand.

As seen from FIG. 36, the low-pass filter which is obtained from the algorithms for finding "the minimum number of tap which realizes attenuation quantity of the stop band" has a good frequency response characteristic.

Figure 37:
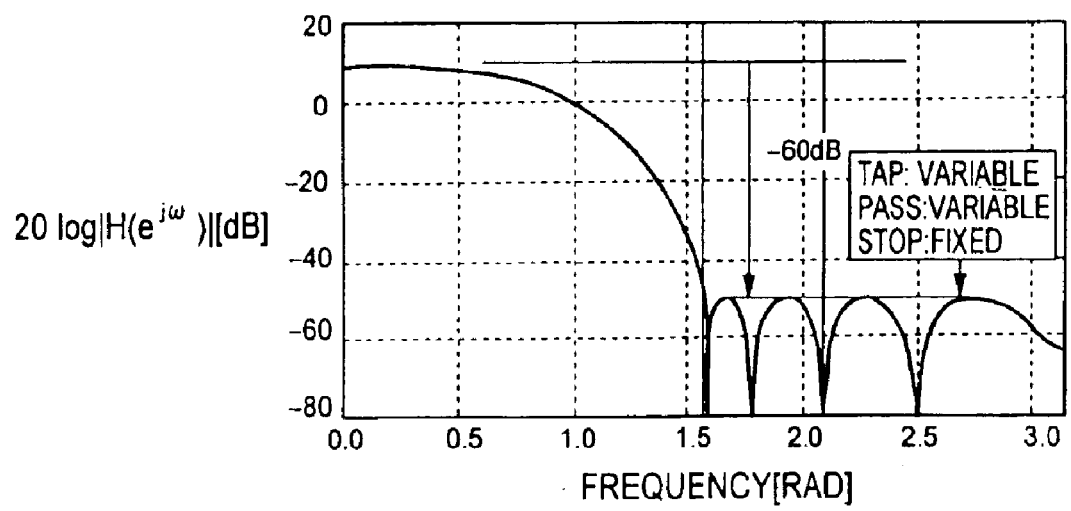
FIG. 37 is a view illustrating a frequency response of the filter with the minimum number of taps that satisfies an attenuation quantity of the stop band.

Furthermore, FIG. 37 is a view illustrating frequency response characteristic of the low-pass filter obtained from the algorithms for finding "the minimum number of tap that satisfies attenuation quantity of the designated stop band" while taking the filter of the zero point for avoiding the chessboard distortion.

Fundamental algorithms, variable intended to find, and band of this case are as follows:

Fundamental Algorithms

It is the Remez Exchange algorithms taking into account frequency characteristic of the pre-filter for finding the filter which has the maximum end frequency of the pass band that satisfies the attenuation quantity of the stop band.

even symmetry

U=3 (filter coefficient is executed U times such that DC gain becomes U)

attenuation quantity of the stop band is not more than −60 dB

Variable Intended to Find it is the number N of tap.

the starting frequency ωs of the stop band.

TABLE 9

| band | Frequency region | gain | weight |
|---|---|---|---|
| Pass band | $0 \leq \omega \leq \omega_p$ | 1 | 1 |
| Stop band | $0.5\pi \leq \omega \leq \pi$ | 0 | 1 |

Further, in FIG. 37, the solid line indicates a frequency response of a low-pass filter of the minimum number of taps (15 taps) in which the attenuation quantity of the stop band becomes not more than −60 dB. Furthermore, the dotted line indicated by ① indicates a frequency which becomes a zero point for avoiding the chessboard distortion, and the dotted line indicated by ② indicates a period of the band given beforehand.

As known from FIG. 37, the low-pass filter which is obtained from the algorithms for finding "the minimum number of taps which realizes attenuation quantity of the designated stop band" has a good frequency response characteristic.

Subsequently, as the second modified example, explanation is provided about algorithms for finding a filter with the minimum numbers of taps that enables the signal to be pass through frequency point of transition band that satisfies attenuation quantity of the stop band.

Here, algorithms for finding a filter with the minimum number of taps that satisfies the attenuation quantity of the block band and and that enables the signal to be passed through a frequency point of a transition band and to the algorithms for finding a "filter that satisfies the attenuation quantity of the block band and and that enables the signal to be passed through the frequency point of the transition band".

Figure 38:
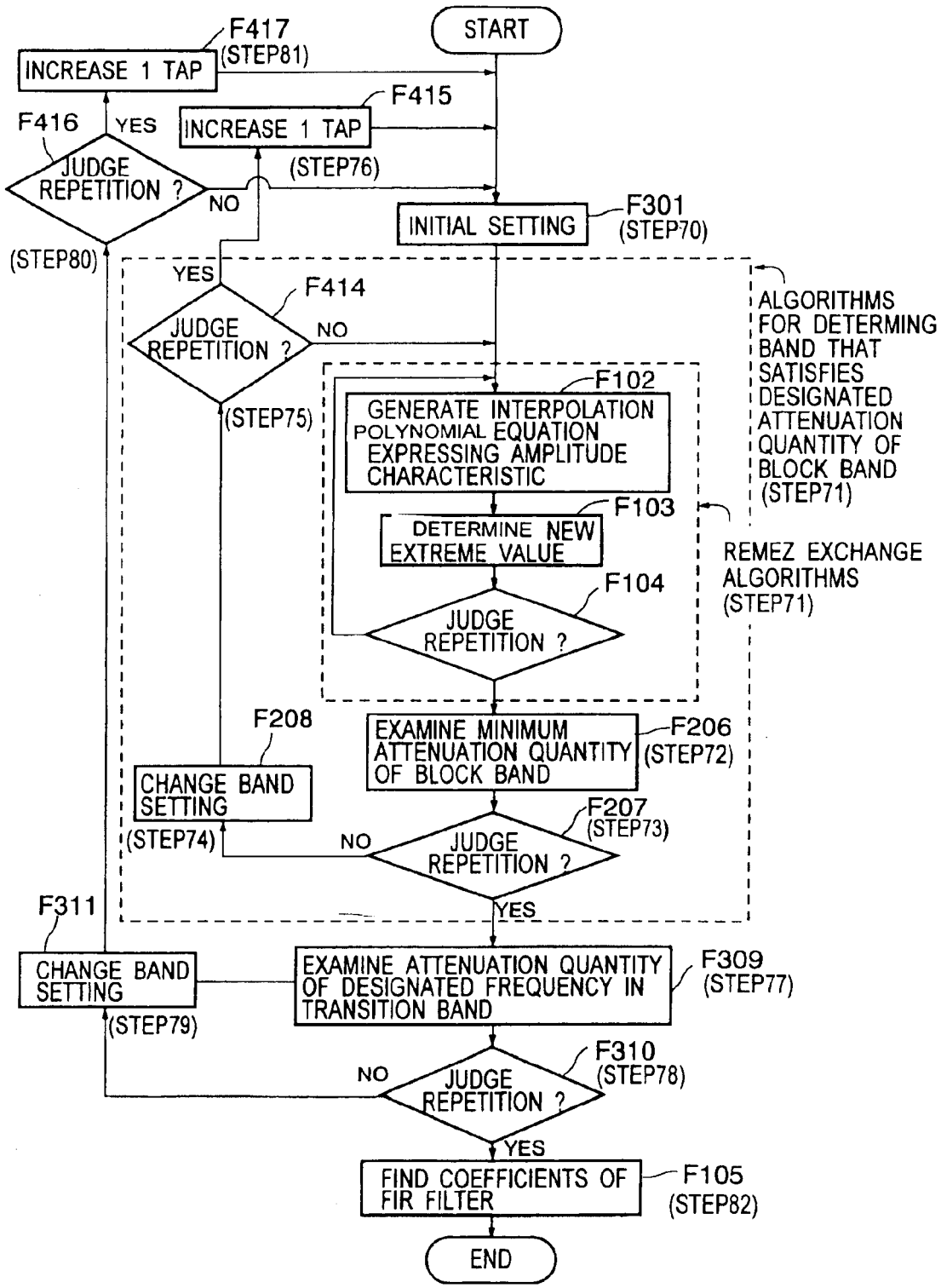
FIG. 38 is a view illustrating a flowchart of the algorithms for finding a filter with the minimum number of taps that satisfies the attenuation quantity of the stop band and that enables the signal to be passed through the frequency band of the transition band.

FIG. 38 is a view illustrating a flowchart of the algorithms for finding a filter with the minimum number of taps that satisfies the attenuation quantity of the stop band and that enables the signal to be passed through the frequency band of the transition band.

Here, a free parameter of this algorithm, an object, and principle of the algorithms thus enumerated arc as follows:

free parameter:

it is the number of taps the end frequency cop of the pass band.

the starting frequency ωs of the stop band object: it is an object to obtain a filter having the minimum number of taps that satisfies an attenuation quantity dBs of the designated stop band and that the attenuation quantity dBc is passed at the frequency ωc of the transition band. Namely, the maximum end frequency ωp of the pass band so as to become the attenuation quantity dBc at the designated frequency ωc of the transition band and the minimum starting frequency ωs of the stop band are determined to obtain the filter with the minimum number of taps.

principle: When being given no-solution in one time of a loop, it is impossible to satisfy the attenuation quantity because the number of taps is short, attempt is executed while increasing the number of taps by one. Further, in cases where it is impossible to realize the frequency point of the transition band, an attempt is executed while increasing the number of taps by one.

Also, the content of FIG. 38 and each step processing F 103, F 104, and F 105 of the algorithms explained below, like the case of the first approach, is the same as the Remez Exchange algorithms taking into account the frequency response of the pre-filter explained in relation to FIG. 6. Further, the content of each processing F 201, F 206, F 207, F 208, like the case of the second approach, is the same as processing explained in relation to FIG. 11, namely the algorithms of a "filter having the maximum end frequency of the pass band that satisfies the attenuation quantity of the stop band" or the algorithms of a "filter having the minimum starting frequency of the stop band that satisfies the attenuation quantity of the stop band". Further, the contents of the processing F 301, F 309, F 310, and F 311 are the same as the processing explained in relation to FIG. 24, namely, the same as the algorithms for finding the filter that satisfies the attenuation quantity, and, in which a designated attenuation quantity is passed through at the designated frequency of the transition band. Accordingly, as for this processing, the same marks as FIG. 6 FIG. 11 and FIG. 24 are used.

Step 70

As illustrated in FIG. 38, firstly, initial setting is executed (F 301). Concretely, initial setting of the algorithms is executed for finding the filter that satisfies the attenuation quantity of the stop band, and in which designated attenuation quantity is passed through of the transition band.

Concrete items thus set are as follows:
the number of tap
linear-phase FIR filter with even symmetry or odd symmetry
the number of the band is two
the starting frequency of the pass band $\omega=0$
gain of the pass band
the end frequency of the stop band $\omega=n$
gain of the stop band
weighting to the pass band and the stop band
coefficient of the pre-filter
attenuation quantity dBs of the stop band (namely, pointing largeness $\delta 2$ of ripple of the stop band)
frequency $\omega c$ of the transition band and attenuation quantity dBc thereof
frequency $\omega^{(0)}=\omega_k^{(0)}(k=0, \ldots, R)$ that becomes the extreme value in the approximation band. Provided letter of right shoulder (i) expresses the number of repetition.
input of initial frequency of dichotomizing method.

Step 71

The Remez Exchange algorithms taking into account the frequency response of the pre-filter is executed (F 102, F 103, F 104).

Concretely, in the processing F 102, interpolation polynomial expression is generated for interpolating an amplitude characteristic from the extreme value point.

Subsequently, in the processing F 103, the new extreme value point is determined from the amplitude characteristic obtained from the interpolation polynomial expression.

Then, in the processing F 104, repetition judgement of the Remez Exchange algorithms is executed.

Step 72

Next, the minimum attenuation quantity (the maximum weighted approximation error) of the stop band is obtained (F 206).

Step 73

Discrimination is executed whether or not the end condition of the search of the frequency that satisfies the attenuation quantity of the designated stop band holds (F 207).

When the end condition holds, processing is moved to Step 77 (F 309), while when the end condition does not hold, processing is moved to Step 74 (F 208).

Step 74 When the end condition does not hold in connection with the search algorithms of the frequency that satisfies the attenuation quantity of the designated stop band, setting of the band is changed (F 208).

Step 75

Next, comparison between the attenuation quantity of the designated stop band and obtained attenuation quantity is executed (F 414). In change of the setting of the band in the processing F 208, in the case of no solution at the one time of the loop, processing is moved to processing of Step 76 (F 415). In the cases with the exception of the aforementioned case, processing is returned to processing of Step 71.

Step 76

One tap is increased (F 415).

One tap is increased in addition to the present number of tap, thus processing is moved to initial setting processing of Step 70 (F 301).

Step 77

When the end condition of the search algorithms of the frequency that satisfies designated attenuation quantity of the stop band holds, attenuation quantity of the frequency which is designated to the transition band is examined (F 309).

Comparison between the attenuation quantity of the designated stop band and obtained attenuation quantity is performed (F 414). When the end condition holds, processing is moved to Step 82 (F 105), while when the end condition does not hold, processing is moved to Step 79 (F 311).

Step 79 When the end condition does not hold, setting of the band is changed (F 311).

Step 80 Next, comparison between the attenuation quantity of the designated stop band and obtained attenuation quantity is executed (F 416).

In change of the setting of the band in the processing F 311, in the case of no solution at the one time of the loop, processing is moved to processing of Step 81 (F 417). In the cases with the exception of the aforementioned case, processing is returned to processing of Step 71.

Step 81

One tap is increased (F 417).

One tap is increased in addition to the present number of tap, thus processing is moved to initial setting processing of Step 70 (F 301).

Step 83

The coefficients of the linear-phase FIR filter is found from the approximated amplitude characteristic (F 105).

Figure 39:
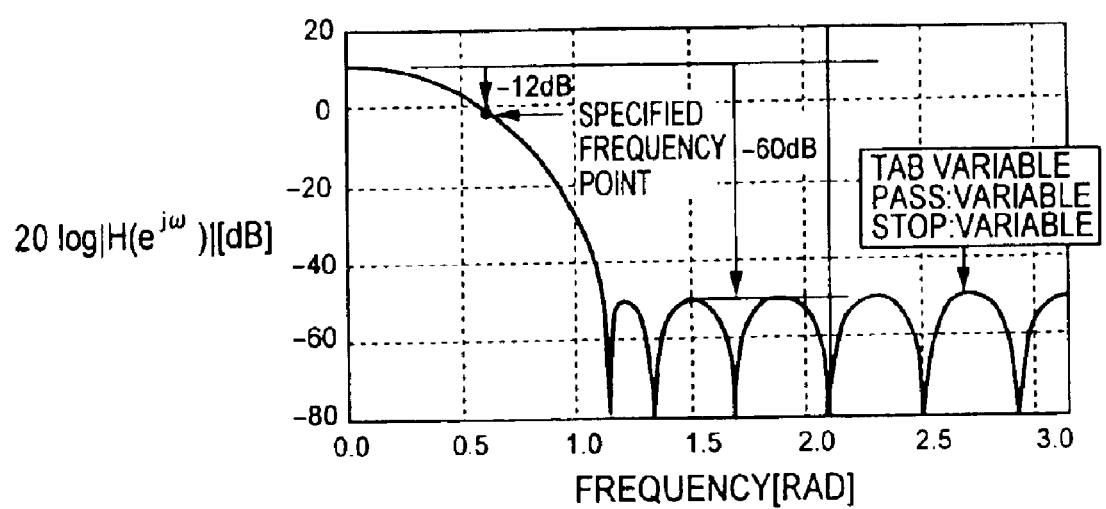
FIG. 39 is a diagram illustrating a frequency response of the filter with the minimum number of taps which filter satisfies the attenuation quantity of the stop band, and which filter enables the signal to be passed through the frequency point of the transition band.

FIG. 39 is a diagram illustrating frequency response characteristic of the low-pass filter obtained from the algorithms for finding "filter with the minimum number of taps which filter satisfies the attenuation quantity of the stop band, and which filter enables the signal to be passed through the frequency point of the transition band" with the filter of zero point for avoiding the chessboard distortion to be the pre-filter.

Fundamental algorithms, variable intended to find, and band of this case are as follows:

Fundamental Algorithms

It is the Remez Exchange algorithms for obtaining a filter that enables the signal to be passed through the frequency point of the transition band on the basis of the algorithms for obtaining the filter that satisfies the attenuation quantity of the stop band that has the maximum end frequency of the pass band.

passing through (0.4 n, 12 dB)
even symmetry
U=3 (filter coefficient is executed U times such that DC gain becomes U)
attenuation quantity of the stop band is not more than −60 dB Variable Intended to Find
it is the number of taps N.
the end frequency cop of the pass band.
the starting frequency $\omega s$ of the stop band.

TABLE 10

| band | Frequency region | gain | weight |
|---|---|---|---|
| Pass band | $0\omega \leq \omega \leq \omega_p$ | 1 | 1 |
| Stop band | $\omega_s \leq \omega \leq \pi$ | 0 | 1 |

Further, in FIG. 39, the solid line indicates frequency response of low-pass filter of the minimum number of tap (17 taps) in which the attenuation quantity of the stop band becomes not more than −60dB, and the attenuation quantity becomes not more than −12 dB on the frequency 0.4 n of the transition band. Further, dotted line indicates the frequency that becomes zero point in order to avoid the chessboard distortion, the black circle indicates the designated frequency point of the transition band.

As seen from FIG. 39, the low-pass filter which is obtained from the algorithms for finding "filter with the minimum number of taps which filter satisfies attenuation quantity of the stop band, and which filter enables the signal to be passed through the frequency point of the transition band" has good frequency response characteristic.

As described-above, according to the present invention, there is an advantage that is possible to stably preserve weighted approximation error in such a way that equi-ripple is not broken in comparison with the conventional method. Further, there is an advantage that is possible to preserve gain of the pass band into a constant value in comparison with the conventional method.

While the invention has been described with reference to specific embodiment chosen for purpose of illustration, it should be apparent that numerous modifications could be made thereto by those skilled in the art without departing from the basic concept and scope of the invention.

What is claimed is:

1. A FIR filter comprising n-1 series-connected unit time delay elements, n multipliers having filter coefficients, (n-1) multipliers being connected to input terminals of the corresponding unit time delay elements and an n-th multiplier being connected to an output terminal of an n-th time unit time delay element, and an adder connected to output terminals of the n multipliers, said filter having an impulse response expressed by using a finite time length, the impulse response being equivalent to the filter coefficients of the FIR filter, and a transfer function H (z) related to a transfer function Z (z) of a pre-filter, wherein the filter coefficients are set by a weighted approximation to the desired characteristics in relation to the frequency response of the pre-filter.

2. A FIR filter comprising n-1 series-connected unit time delay elements, n multipliers having filter coefficients, (n-1) multipliers being connected to input terminals of the corresponding unit time delay elements and an n-th multiplier being connected to an output terminal of an n-th time unit time delay element, and an adder connected to output terminals of the n multipliers, said filter having an impulse response expressed by using a finite time length, the impulse response being equivalent to the filter coefficients of the FIR filter, and a transfer function H (z) related to a transfer function Z (z) of a pre-filter and a transfer function K (z) of an equalizer, wherein the filter coefficients are set on the basis of an amplitude characteristic of the equalizer which is obtained by a weighted approximation to the desired characteristics in relation to the frequency response of the pre-filter.

3. A method of setting filter coefficients of an FIR filter comprising n-1 series-connected unit time delay elements, n multipliers having the filter coefficients, (n-1) multipliers being connected to input terminals of the corresponding unit time delay elements and an n-th multiplier being connected to an output terminal of an n-th time unit time delay element, and an adder connected to output terminals of the n multipliers, said filter having an impulse response expressed by using a finite time length, the impulse response being equivalent to the filter coefficients of the FIR filter, and a transfer function H (z) related to a transfer function Z (z) of a pre-filter, wherein the filter coefficients are calculated by performing a weighted approximation to the desired characteristics in relation to the frequency response of the pre-filter.

4. A method of setting filter coefficients of an FIR filter according to claim 3, wherein the weighted approximation is performed to the desired characteristics using Remez Exchange algorithms taking into account a frequency response of the pre-filter.

5. A method of setting filter coefficients of an FIR filter comprising n-1 series-connected unit time delay elements, n multipliers having the filter coefficients, (n-1) multipliers being connected to input terminals of the corresponding unit time delay elements and an n-th multiplier being connected to an output terminal of an n-th time unit time delay element, and an adder connected to output terminals of the n multipliers, said filter having an impulse response expressed by using a finite time length, the impulse response being equivalent to the filter coefficients of the FIR filter, and a transfer function H (z) related to a transfer function Z (z) of a pre-filter and a transfer function K (z) of an equalizer, wherein the filter coefficients are calculated depending on an amplitude characteristic of the equalizer, which is obtained by performing a weighted approximation to the desired characteristics in relation to the frequency response of the pre-filter.

6. A method of setting filter coefficients of an FIR filter according to claim 5, wherein the weighted approximation is performed to the desired characteristics using Remez Exchange algorithms taking into account frequency response of a pre-filter.

7. A method of setting filter coefficients of an FIR filter comprising n-1 series-connected unit time delay elements, n multipliers having the filter coefficients, (n-1) multipliers being connected to input terminals of the corresponding unit time delay elements and an n-th multiplier being connected to an output terminal of an n-th time unit time delay element, and an adder connected to output terminals of the n multipliers, said filter having an impulse response expressed by a finite time length, and the impulse response is equivalent to the filter coefficients, comprising:

a first step of generating an interpolation polynomial equation for interpolating an amplitude characteristic from an extreme value point of the amplitude characteristic of the frequency;

a second step for determining a new extreme value point from the amplitude characteristic obtained from the interpolation polynomial equation that is generated in the first step;

a third step for judging whether or not a position of the extreme value is approximated within a required range by repeating the operations of the first step and the second step; and a fourth step for finding the filter coefficients from the approximated amplitude characteristic obtained in the third step.

8. A method of setting filter coefficients of an FIR filter according to claim 7, further comprising an initial setting step for carrying out, at least, setting of the FIR filter, setting of the bandwidth, setting of coefficients of a pre-filter, and setting of an initial extreme value point, before executing the operation in the first step.

9. A method of setting filter coefficients of an FIR filter according to claim 7, wherein in the second step and the third step, the extreme-value of weighted approximation error calculated from the extreme-value point used for the interpolation is searched to the entire approximation, an obtained extreme-value is defined as a new extreme-value point, and it is judged that the optimum approximation is obtained when the position of the extreme-value is not changed.

10. A method of setting filter coefficients of an FIR filter according to claim 7, wherein in the fourth step, the filter coefficients are calculated by performing a weighted approximation to the desired characteristics in relation to a frequency response of the pre-filter.

11. A method of setting filter coefficients of an FIR filter according to claim 10, wherein the weighted approximation is performed to the desired characteristics using Remez Exchange algorithms taking into account a frequency response of the pre-filter.

12. A method of setting filter coefficients of an FIR filter according to claim 7, wherein in the fourth step, the filter coefficients are calculated depending on an amplitude characteristic of the equalizer obtained by performing the weighted approximation to the desired characteristics in relation to a frequency response of the pre-filter.

13. A method of setting filter coefficients of an FIR filter according to claims 12, wherein the weighted approximation is performed to the desired characteristics using Remez Exchange algorithms taking into account a frequency response of the pre-filter.

14. A FIR filter comprising n-1 series-connected unit time delay elements, n multipliers having filter coefficients, (n-1) multipliers being connected to input terminals of the corresponding unit time delay elements and an n-th multiplier being connected to an output terminal of an n-th time unit time delay element, and an adder connected to output terminals of the n multipliers, said filter having an impulse response expressed by using a finite time length, the impulse response being equivalent to the filter coefficients of the FIR filter, the FIR filter having an arbitrary number of taps, and a transfer function H (z) related to a transfer function Z (z) of a pre-filter,
wherein the filter coefficients are set by a weighted approximation to the desired characteristics so as to satisfy an attenuation quantity of a stop band in relation to a frequency response of the pre-filter which satisfies the attenuation quantity of the stop band, when the number of taps is variable and the bandwidth is fixed.

15. A FIR filter comprising n-1 series-connected unit time delay elements, n multipliers having filter coefficients, (n-1) multipliers being connected to input terminals of the corresponding unit time delay elements and an n-th multiplier being connected to an output terminal of an n-th time unit time delay element, and an adder connected to output terminals of the n multipliers, said filter having an impulse response expressed by using a finite time length, the impulse response being equivalent to the filter coefficients of the FIR filter, the FIR filter having an arbitrary number of taps, and a transfer function H (z) related to a transfer function Z (z) of a pre-filter and transfer function K (z) of an equalizer,
wherein the filter coefficients are set on the basis of an amplitude characteristic of the equalizer obtained by performing a weighted approximation to the desired characteristics so as to satisfy an attenuation quantity of a stop band in relation to frequency response of the pre-filter which satisfies the attenuation quantity of the stop band, when the number of taps is variable and the bandwidth is fixed.

16. A method of setting filter coefficients of an FIR filter comprising n-1 series-connected unit time delay elements, n multipliers having the filter coefficients, (n-1) multipliers being connected to input terminals of the corresponding unit time delay elements and an n-th multiplier being connected to an output terminal of an n-th time unit time delay element, and an adder connected to output terminals of the n multipliers, said filter having an impulse response expressed by using a finite time length, the impulse response being equivalent to the filter coefficients of the FIR filter, the FIR filter having an arbitrary number of taps, and a transfer function H (z) related to a transfer function Z (z) of a pre-filter,
wherein the filter coefficients are calculated by a weighted approximation to the desired characteristics so as to satisfy an attenuation quantity of a stop band in relation to the frequency response of the pre-filter which satisfies the attenuation quantity of the stop band, when the number of taps is variable and the bandwidth is fixed.

17. A method of setting filter coefficients of an FIR filter according to claim 16, wherein the weighted approximation is performed to the desired characteristics using Remez Exchange algorithms taking into account a frequency response of the pre-filter.

18. A method of setting filter coefficients of an FIR filter comprising n-1 series-connected unit time delay elements, n multipliers having the filter coefficients, (n-1) multipliers being connected to input terminals of the corresponding unit time delay elements and an n-th multiplier being connected to an output terminal of an n-th time unit time delay element, and an adder connected to output terminals of the n multipliers, said filter having an impulse response expressed by using a finite time length, wherein the impulse response is equivalent to the filter coefficients of the FIR filter, the FIR filter having an arbitrary number of taps, and a transfer function H (z) related to a transfer function Z (z) of a pre-filter and a transfer function K (z) of an equalizer,
wherein the filter coefficients are calculated depending on an amplitude characteristic of the equalizer obtained by performing a weighted approximation to the desired characteristics so as to satisfy an attenuation quantity of a stop band in relation to the frequency response of the pre-filter which satisfies the attenuation quantity of the stop band, when the number of taps is variable and the bandwidth is fixed.

19. A method of setting filter coefficients of an FIR filter according to claim 18, wherein the weighted approximation is performed to the desired characteristics using Remez Exchange algorithms taking into account a frequency response of the pre-filter.

20. A method of setting filter coefficients of an FIR filter comprising n-1 series-connected unit time delay elements, n multipliers having the filter coefficients, (n-1) multipliers being connected to input terminals of the corresponding unit time delay elements and an n-th multiplier being connected to an output terminal of an n-th time unit time delay element, and an adder connected to output terminals of the n multipliers, said filter having an impulse response expressed by a finite time length, the impulse response being equivalent to the filter coefficients, a number of taps is variable, and a band that is fixed, comprising:
a first step for generating an interpolation polynomial equation for interpolating an amplitude characteristic from an extreme value point of the amplitude characteristic of the frequency;
a second step for determining a new extreme value point from the amplitude characteristic obtained from the interpolation polynomial equation that is generated in the first step;
a third step for judging whether or not a position of the extreme value is approximated within a required range by repeating the operations of the first step and the second step;

a fourth step for examining an attenuation quantity of a stop band from the approximated amplitude characteristic obtained in the third step;

a fifth step for comparing the examined attenuation quantity with the attenuation quantity of the designated stop band to judge whether or not the result of the comparison satisfies a predetermined condition;

a sixth step for changing the number of taps when the result of the comparison of the fifth step does not satisfy the predetermined condition; and a seventh step for finding the filter coefficients from the amplitude characteristic approximated in the third step which satisfies the predetermined condition in the fifth step.

21. A method of setting filter coefficients of an FIR filter according to claim 20, further comprising an initial setting step for carrying out, at least, setting of the FIR filter, setting of the band, setting of coefficients of the pre-filter, and setting of an initial extreme value point, before executing the operation of the first step.

22. A method of setting filter coefficients of an FIR filter according to claim 20, wherein in the fourth step, the minimum attenuation quantity in the stop band is examined, and in the sixth step, the number of the taps is increased.

23. A method of setting filter coefficients of an FIR filter according to claim 20, wherein in the seventh step, the filter coefficients are calculated by performing a weighted approximation with reference to the desired characteristics so as to satisfy an attenuation quantity of a stop band in relation to a frequency response of the pre-filter that satisfies the attenuation quantity of the stop band when the number of taps is variable and the bandwidth is fixed.

24. A method of setting filter coefficients of an FIR filter according to claim 23, wherein the weighted approximation is performed to the desired characteristics using Remez Exchange algorithms taking into account a frequency response of the pre-filter.

25. A method of setting filter coefficients of an FIR filter according to claim 20, wherein in the seventh step, the filter coefficients are calculated depending on an amplitude characteristic of the equalizer obtained by performing the weighted approximation with reference to the desired characteristics so as to satisfy the attenuation quantity of the stop band in relation to the frequency response of the pre-filter that satisfies the attenuation quantity of the stop band when the number of taps is variable and the bandwidth is fixed.

26. A method of setting filter coefficients of an FIR filter according to claim 25, wherein the weighted approximation is performed to the desired characteristics using Remez Exchange algorithms taking into account a frequency response of the pre-filter.

27. A FIR filter comprising n-1 series-connected unit time delay elements, n multipliers having filter coefficients, (n-1) multipliers being connected to input terminals of the corresponding unit time delay elements and an n-th multiplier being connected to an output terminal of an n-th time unit time delay element, and an adder connected to output terminals of the n multipliers, said filter having an impulse response expressed by using a finite time length, the impulse response being equivalent to the filter coefficients of the FIR filter, the FIR filter having an arbitrary number of taps, and a transfer function $H(z)$ related to a transfer function $Z(z)$ of a pre-filter, wherein the filter coefficients are set by performing a weighted approximation to the desired characteristics so as to satisfy an attenuation quantity of a stop band in relation to a frequency response of the pre-filter which satisfies the attenuation quantity of the stop band, when the number of taps is fixed and the bandwidth is changeable.

28. A FIR filter comprising n-1 series-connected unit time delay elements, n multipliers having filter coefficients, (n-1) multipliers being connected to input terminals of the corresponding unit time delay elements and an n-th multiplier being connected to an output terminal of an n-th time unit time delay element, and an adder connected to output terminals of the n multipliers, said filter having an impulse response expressed by using a finite time length, the impulse response being equivalent to the filter coefficients of the FIR filter, the FIR filter having an arbitrary number of taps, and a transfer function $H(z)$ related to a transfer function $Z(z)$ of a pre-filter and a transfer function $K(z)$ of an equalizer, wherein the filter coefficients are set on the basis of an amplitude characteristic of the equalizer obtained by a weighted approximation to the desired characteristics so as to satisfy an attenuation quantity of a stop band in relation to a frequency response of the pre-filter which satisfies the attenuation quantity of the stop band, when the number of taps is fixed and the bandwidth is changeable.

29. A method of setting filter coefficients of an FIR filter comprising n-1 series-connected unit time delay elements, n multipliers having the filter coefficients, (n-1) multipliers being connected to input terminals of the corresponding unit time delay elements and an n-th multiplier being connected to an output terminal of an n-th time unit time delay element, and an adder connected to output terminals of the n multipliers, said filter having an impulse response expressed by using a finite time length, the impulse response being equivalent to the filter coefficients of the FIR filter, the FIR filter having an arbitrary number of taps, and a transfer function $H(z)$ related to a transfer function $Z(z)$ of a pre-filter, wherein the filter coefficients are calculated by performing a weighted approximation to the desired characteristics so as to satisfy an attenuation quantity of a stop band in relation to a frequency response of the pre-filter which satisfies the attenuation quantity of the stop band, when the number of taps is fixed and the bandwidth is changeable.

30. A method of setting filter coefficients of an FIR filter according to claim 29, wherein the weighted approximation is performed to the desired characteristics using Remez Exchange algorithms taking into account a frequency response of the pre-filter.

31. A method of setting filter coefficients of an FIR filter comprising n-1 series-connected unit time delay elements, n multipliers having the filter coefficients, (n-1) multipliers being connected to input terminals of the corresponding unit time delay elements and an n-th multiplier being connected to an output terminal of an n-th time unit time delay element, and an adder connected to output terminals of the n multipliers, said filter having an impulse response expressed by using a finite time length, the impulse response being equivalent to the filter coefficients of the FIR filter, the FIR filter having an arbitrary number of taps, and a transfer function $H(z)$ related to a transfer function $Z(z)$ of a pre-filter and a transfer function $K(z)$ of an equalizer, wherein the filter coefficients are calculated depending on an amplitude characteristic of the equalizer obtained by performing a weighted approximation to the desired characteristics so as to satisfy an attenuation quantity of a stop band in relation to a frequency response of the pre-filter which satisfies the attenuation quantity of the stop band, when the number of taps is fixed and the bandwidth is changeable.

32. A method of setting filter coefficients of an FIR filter according to claim 31, wherein the weighted approximation is performed to the desired characteristics using Remez Exchange algorithms taking into a account frequency response of the pre-filter.

33. A method of setting filter coefficients of an FIR filter comprising n-1 series-connected unit time delay elements, n multipliers having the filter coefficients, (n-1) multipliers being connected to input terminals of the corresponding unit time delay elements and an n-th multiplier being connected to an output terminal of an n-th time unit time delay element, and an adder connected to output terminals of the n multipliers, said filter having an impulse response expressed by finite time length, the impulse response being equivalent to the filter coefficients, and whose number of taps is fixed, and whose band setting is changeable, comprising:

a first step for generating an interpolation polynomial equation for interpolating an amplitude characteristic from an extreme value point of the amplitude characteristic of the frequency;

a second step for determining a new extreme value point from the amplitude characteristic obtained from the interpolation polynomial equation that is generated in the first step;

a third step for judging whether or not a position of the extreme value is approximated within a required range by repeating the operations of the first step and the second step;

a fourth step for examining an attenuation quantity of a stop band from the approximated amplitude characteristic obtained in the third step;

a fifth step for comparing the examined attenuation quantity with the attenuation quantity of the designated stop band to judge whether or not the result of the comparison satisfies a predetermined condition;

a sixth step for changing the band setting when the result of the comparison of the fifth step does not satisfy a predetermined condition; and a seventh step for finding the filter coefficient from the amplitude characteristic approximated in the third step which satisfies the predetermined condition in the fifth step.

34. A method of setting filter coefficients of an FIR filter according to claim 33, further comprising an initial setting step for carrying out, at least, setting of the FIR filter, setting of the band, setting of a coefficient of a pre-filter, and setting of an initial extreme value point, before executing the operation of the first step.

35. A method of setting filter coefficients of an FIR filter according to claim 33, wherein in the fourth step, the minimum attenuation quantity in the stop band is examined.

36. A method of setting filter coefficients of an FIR filter according to claim 33, wherein in the seventh step, the filter coefficients are calculated by performing a weighted approximation with reference to the desired characteristics so as to satisfy the attenuation quantity of the stop band in relation to the frequency response of the pre-filter that satisfies the attenuation quantity of the stop band when the number of taps is fixed and the bandwidth is changeable.

37. A method of setting filter coefficients of an FIR filter according to claim 36, wherein the weighted approximation is performed to the desired characteristics using Remez Exchange algorithms taking into a account frequency response of the pre-filter.

38. A method of setting filter coefficients of an FIR filter according to claim 33, wherein in the above described seventh step, the filter coefficients are calculated depending on the amplitude characteristic of the equalizer obtained by performing the weighted approximation with reference to the desired characteristics so as to satisfy the attenuation quantity of the stop band in relation to a frequency response of the pre-filter that satisfies the attenuation quantity of the stop band when the number of taps is fixed and the band setting is changeable.

39. A method of setting filter coefficients of an FIR filter according to claim 38, wherein the weighted approximation is performed to the desired characteristics using Remez Exchange algorithms taking into a account frequency response of the pre-filter.

40. A FIR filter comprising n-1 series-connected unit time delay elements, n multipliers having filter coefficients, (n-1) multipliers being connected to input terminals of the corresponding unit time delay elements and an n-th multiplier being connected to an output terminal of an n-th time unit time delay element, and an adder connected to output terminals of the n multipliers, said filter having an impulse response expressed by using a finite time length, the impulse response being equivalent to the filter coefficients of the FIR filter, the FIR filter having an arbitrary number of taps, and a transfer function H (z) related to a transfer function Z (z) of a pre-filter, wherein the filter coefficients are set by performing a weighted approximation to the desired characteristics so as to satisfy an attenuation quantity of a stop band in relation to a frequency response of the pre-filter which satisfies the attenuation quantity of a stop band, when the number of taps is variable and the bandwidth is changeable.

41. A FIR filter comprising n-1 series-connected unit time delay elements, n multipliers having filter coefficients, (n-1) multipliers being connected to input terminals of the corresponding unit time delay elements and an n-th multiplier being connected to an output terminal of an n-th time unit time delay element, and an adder connected to output terminals of the n-multipliers, said filter having an impulse response expressed by using a finite time length, the impulse response being equivalent to the filter coefficients of the FIR filter, the FIR filter having an arbitrary number of taps, and a transfer function H (z) related to a transfer function Z (z) of a pre-filter and transfer function K (z) of an equalizer, wherein the filter coefficients are set on the basis of an amplitude characteristic of the equalizer obtained by performing a weighted approximation to the desired characteristics so as to satisfy an attenuation quantity of a stop band in relation to a frequency response of the pre-filter which satisfies the attenuation quantity of the stop band, when the number of taps is variable and band setting is changeable.

42. A method of setting filter coefficients of an FIR filter comprising n-1 series-connected unit time delay elements, n multipliers having the filter coefficients, (n-1) multipliers being connected to input terminals of the corresponding unit time delay elements and an n-th multiplier being connected to an output terminal of an n-th time unit time delay element, and an adder connected to output terminals of the n multipliers, said filter having an impulse response expressed by using a finite time length, the impulse response being equivalent to the filter coefficients of the FIR filter, the FIR filter having an arbitrary number of taps, and a transfer function H (z) related to a transfer function Z (z) of a pre-filter, wherein the filter coefficients are calculated by performing a weighted approximation to the desired characteristics so as to satisfy an attenuation quantity of a stop band in relation to a frequency response of the pre-filter which satisfies the attenuation quantity of the stop band, when the number of taps is variable and band setting is changeable.

43. A method of setting filter coefficients of an FIR filter according to claim 42, wherein the weighted approximation is executed to the desired characteristics using Remez Exchange algorithms taking into account a frequency response of the pre-filter.

44. A method of setting filter coefficients of an FIR filter comprising n-1 series-connected unit time delay elements, n multipliers having the filter coefficients, (n-1) multipliers being connected to input terminals of the corresponding unit time delay elements and an n-th multiplier being connected to an output terminal of an n-th time unit time delay element, and an adder connected to output terminals of the n multipliers, said filter having an impulse response expressed by using a finite time length, the impulse response being equivalent to the filter coefficients of the FIR filter, the FIR filter having an arbitrary number of taps, and a transfer function H (z) is related to a transfer function Z (z) of a pre-filter and a transfer function K (z) of an equalizer, wherein the filter coefficients are calculated depending on an amplitude characteristic of the equalizer obtained by performing a weighted approximation to the desired characteristics so as to satisfy an attenuation quantity of a stop band in relation to a frequency response of the pre-filter which satisfies the attenuation quantity of the stop band, when the number of taps is variable and band setting is changeable.

45. A method of setting filter coefficients of an FIR filter according to claim 44, wherein the weighted approximation is executed to the desired characteristics using Remez Exchange algorithms taking into an account frequency response of the pre-filter.

46. A method of setting filter coefficients of an FIR filter comprising n-1 series-connected unit time delay elements, n multipliers having the filter coefficients, (n-1) multipliers being connected to input terminals of the corresponding unit time delay elements and an n-th multiplier being connected to an output terminal of an n-th time unit time delay element, and an adder connected to output terminals of the n multipliers, said filter having an impulse response expressed by finite time length, and the impulse response being equivalent to the filter coefficients, and number of taps is variable, and whose band setting is changeable, comprising:

a first step for generating an interpolation polynomial equation for interpolating an amplitude characteristic from an extreme value point of the amplitude characteristic of the frequency;

a second step for determining a new extreme value point from the amplitude characteristic obtained from the interpolation polynomial equation that is generated in the first step;

a third step for judging whether or not position of the extreme value is approximated within a required range by repeating the operations in the first step and the second step;

a fourth step for examining an attenuation quantity of a stop band from the approximated amplitude characteristic obtained in the third step;

a fifth step for comparing the examined attenuation quantity with the attenuation quantity of the designated stop band to judge whether or not the result of the comparison satisfies a predetermined condition;

a sixth step for changing the band setting when the result of the comparison of the fifth step does not satisfy the predetermined condition;

a seventh step for judging whether or not the current number of taps can satisfy the attenuation quantity of the stop band after changing the band in the sixth step;

an eighth step for changing the number of taps when judgement is performed that the current number of taps do not satisfy the attenuation quantity of the stop band in the seventh step; and a ninth step for finding the filter coefficients from the amplitude characteristic approximated in the third step which satisfies the predetermined condition in the fifth step.

47. A method of setting filter coefficients of an FIR filter according to claim 46, further comprising an initial setting step for carrying out setting, at least, of the FIR filter, setting of the band, setting of coefficients of a pre-filter, and setting of an initial extreme value point, before executing the operation of the first step.

48. A method of setting filter coefficients of an FIR filter according to claim 46, wherein in the fourth step, the minimum attenuation quantity in the stop band is examined, and in the eighth step, the number of the taps is increased.

49. A method of setting filter coefficients of an FIR filter according to claim 46, wherein in the ninth step, the filter coefficients are calculated by performing a weighted approximation to the desired characteristics so as to satisfy the attenuation quantity of the stop band in relation to the frequency response of the pre-filter that satisfies the attenuation quantity of the stop band when the number of taps is variable and band setting is changeable.

50. A method of setting filter coefficients of an FIR filter according to claim 49, wherein the weighted approximation is executed to the desired characteristics using Remez Exchange algorithms taking into account a frequency response of the pre-filter.

51. A method of setting filter coefficients of an FIR filter according to claim 46, wherein in the ninth step, the filter coefficients are calculated depending on an amplitude characteristic of the equalizer obtained by performing a weighted approximation with reference to the desired characteristics so as to satisfy the attenuation quantity of the stop band in relation to the frequency response of the pre-filter that satisfies the attenuation quantity of the stop band when the number of taps is variable and the band setting is changeable.

52. A method of setting filter coefficients of an FIR filter according to claim 51, wherein the weighted approximation is executed to the desired characteristics using Remez Exchange algorithms taking into an account frequency response of the pre-filter.

53. A FIR filter comprising n-1 series-connected unit time delay elements, n multipliers having filter coefficients, (n-1) multipliers being connected to input terminals of the corresponding unit time delay elements and an n-th multiplier being connected to an output terminal of an n-th time unit time delay element, and an adder connected to output terminals of the n multipliers, said filter having qn impulse response expressed by using a finite time length, the impulse response being equivalent to the filter coefficients of the FIR filter, the FIR filter having an arbitrary number of taps, and a transfer function H (z) related to a transfer function Z (z) of a pre-filter, wherein the filter coefficients are set by performing a weighted approximation to the desired characteristics so as to satisfy an attenuation quantity of a stop band in relation to a frequency response of the pre-filter through which the attenuation quantity of the designated frequency of a transition band is passed, and which satisfies the attenuation quantity of a stop band, when the number of taps is made to fix and band setting is changeable.

54. A FIR filter comprising n-1 series-connected unit time delay elements, n multipliers having filter coefficients, (n-1) multipliers being connected to input terminals of the corresponding unit time delay elements and an n-th multiplier being connected to an output terminal of an n-th time unit time delay element, and an adder connected to output terminals of the n multipliers, said filter having an impulse response expressed by using a finite time length, the impulse response being equivalent to the filter coefficients of the FIR filter, the FIR filter having an arbitrary number of taps, and a transfer function H (z) related to a transfer function Z (z) of a pre-filter and transfer function K (z) of an equalizer, wherein the filter coefficients are set on the basis of an amplitude characteristic of the equalizer obtained by performing a weighted approximation to the desired characteristics so as to satisfy an attenuation quantity of a stop band in relation to a frequency response of a pre-filter through which an attenuation quantity of a designated frequency of a transition band is passed, and which satisfies the attenuation quantity of the stop band, when the number of taps is variable and the bandwidth is changeable.

55. A method of setting filter coefficients of an FIR filter comprising n-1 series-connected unit time delay elements, n multipliers having the filter coefficients, (n-1) multipliers being connected to input terminals of the corresponding unit time delay elements and an n-th multiplier being connected to an output terminal of an n-th time unit time delay element, and an adder connected to output terminals of the n multipliers, said filter having an impulse response is expressed by using a finite time length, the impulse response being equivalent to the filter coefficients of the FIR filter, the FIR filter having an arbitrary number of taps, and a transfer function H (z) related to a transfer function Z (z) of a pre-filter, wherein the filter coefficients are calculated by performing a weighted approximation to the desired characteristics so as to satisfy an attenuation quantity of a stop band in relation to a frequency response of the pre-filter through which the attenuation quantity of the designated frequency of the stop band is passed, and which satisfies the attenuation quantity of the stop band, when the number of taps is variable and the bandwidth is changeable.

56. A method of setting filter coefficients of an FIR filter according to claim 55, wherein the weighted approximation is executed to the desired characteristics using Remez Exchange algorithms taking into a account frequency response of the pre-filter.

57. A method of setting filter coefficients of an FIR filter comprising n-1 series-connected unit time delay elements, n multipliers having the filter coefficients, (n-1) multipliers being connected to input terminals of the corresponding unit time delay elements and an n-th multiplier being connected to an output terminal of an n-th time unit time delay element, and an adder connected to output terminals of the n multipliers, said filter having an impulse response expressed by using a finite time length, the impulse response being equivalent to the filter coefficients of the FIR filter, the FIR filter having an arbitrary number of taps, and a transfer function H (z) related to a transfer function Z (z) of a pre-filter and a transfer function K (z) of an equalizer, wherein the filter coefficients are calculated depending on an amplitude characteristic of the equalizer obtained by performing a weighted approximation to the desired characteristics so as to satisfy an attenuation quantity of a stop band in relation to a frequency response of the pre-filter through which the attenuation quantity of the designated frequency of a stop band is passed, and which satisfies the attenuation quantity of the stop band, when the number of taps is variable and the bandwidth is changeable.

58. A method of setting filter coefficients of an FIR filter according to claim 57, wherein the weighted approximation is executed to the desired characteristics using Remez Exchange algorithms taking into an account frequency response of the pre-filter.

59. A method of setting filter coefficients of an FIR filter comprising n-1 series-connected unit time delay elements, n multipliers having the filter coefficients, (n-1) multipliers being connected to input terminals of the corresponding unit time delay elements and an n-th multiplier being connected to an output terminal of an n-th time unit time delay element, and an adder connected to output terminals of the n multipliers, said filter having an impulse response expressed by a finite time length, and the impulse response being equivalent to the filter coefficients, and a number of taps that are fixed, and whose band setting is changeable, comprising:

a first step for generating an interpolation polynomial equation for nterpolating an amplitude characteristic from an extreme value point of the amplitude characteristic of a frequency;

a second step for determining a new extreme value point from the amplitude characteristic obtained from the interpolation polynomial equation that is generated in the first step;

a third step for judging whether or not a position of the extreme value is approximated within a required range by repeating the operation in the first step and the second step;

a fourth step for examining an attenuation quantity of a stop band from the approximated amplitude characteristic obtained in the third step;

a fifth step for comparing the examined attenuation quantity in the fourth step with the attenuation quantity of the designated stop band to judge whether or not the result of the comparison satisfies a predetermined condition;

a sixth step for changing the band setting when the result of the comparison of the fifth step does not satisfy the predetermined condition;

a seventh step for examining the attenuation quantity of the designated frequency of a transition band which the attenuation quantity satisfies the predetermined condition in the fifth step;

an eighth step for comparing the attenuation quantity of the designated frequency of the transition band that is examined in the seventh step with the attenuation quantity of the designated transition band, and for judging whether or not the result of comparison satisfies the predetermined condition;

a ninth step for changing the setting of the band when the result of comparison of the seventh step does not satisfy the predetermined condition; and a tenth step for finding the filter coefficients from the amplitude characteristic approximated in the seventh step which the amplitude characteristic satisfies the predetermined condition.

60. A method of setting filter coefficients of an FIR filter according to claim 59, further comprising an initial setting step for carrying out, at least, setting of the FIR filter, setting of the band, setting of a coefficient of a pre-filter, and setting of an initial extreme value point, before executing the operation of the first step.

61. A method of setting filter coefficients of an FIR filter according to claim 59, wherein in the fourth step, the minimum attenuation quantity in the stop band is examined.

62. A method of setting filter coefficients of an FIR filter according to claim 59, wherein in the tenth step, the filter coefficients are calculated by performing the weighted approximation to the desired characteristics so as to satisfy the attenuation quantity of the stop band in relation to the frequency response of the pre-filter that satisfies the attenuation quantity of the stop band, and that causes the attenuation quantity of the designated frequency of the transition band to pass when the number of taps is fixed and band setting is changeable.

63. A method of setting filter coefficients of an FIR filter according to claim 62, wherein the weighted approximation is executed to the desired characteristics using Remez Exchange algorithms taking into account a frequency response of the pre-filter.

64. A method of setting filter coefficients of an FIR filter according to claim 59, wherein in the tenth step, the filter coefficients are calculated depending on an amplitude characteristic of the equalizer obtained by performing the weighted approximation to the desired characteristics so as to satisfy the attenuation quantity of the stop band in relation to the frequency response of the pre-filter that satisfies the attenuation quantity of the stop band, and that causes the attenuation quantity of the designated frequency of the transition band to pass when the number of taps is fixed and the band setting is changeable.

65. A method of setting filter coefficients of an FIR filter according to claim 64, wherein the weighted approximation is executed to the desired characteristics using Remez Exchange algorithms taking into account a frequency response of the pre-filter.

66. A FIR filter comprising n-1 series connected unit time delay elements, n multipliers having filter coefficients, (n-1) multipliers being connected to input terminals of the corresponding unit time delay elements and an n-th multiplier being connected to an output terminal of an n-th time unit time delay element, and an adder connected to output terminals of the n multipliers, said filter having qn impulse response expressed by using a finite time length, the impulse response being equivalent to the filter coefficients of the FIR filter, the FIR filter having arbitrary number of taps, and a transfer function H (z) related to a transfer function Z (z) of a pre-filter, wherein the filter coefficients are set by performing a weighted approximation to the desired characteristics so as to satisfy an attenuation quantity of a stop band in relation to a frequency response of the pre-filter through which the attenuation quantity of the designated frequency of a transition band is passed, and which satisfies the attenuation quantity of a stop band, when the number of taps is variable and band setting is changeable.

67. A FIR filter comprising n-1 series-connected unit time delay elements, n multipliers having filter coefficients, (n-1) multipliers being connected to input terminals of the corresponding unit time delay elements and an n-th multiplier being connected to an output terminal of an n-th time unit time delay element, and an adder connected to output terminals of the n multipliers, said filter having an impulse response expressed by using a finite time length, wherein the impulse response is equivalent to the filter coefficients of the FIR filter, the FIR filter having an arbitrary number of taps, and a transfer function H (z) related to a transfer function Z (z) of a pre-filter and transfer function K (z) of an equalizer, wherein the filter coefficients are set on the basis of an amplitude characteristic of an equalizer obtained by performing a weighted approximation to the desired characteristics so as to satisfy an attenuation quantity of a stop band in relation to a frequency response of the pre-filter through which the attenuation quantity of the designated frequency of a transition band is passed, and which satisfies the attenuation quantity of a stop band, when the number of taps is variable and band setting is changeable.

68. A method of setting filter coefficients of an FIR filter comprising n-1 series-connected unit time delay elements, n multipliers having the filter coefficients, (n-1) multipliers being connected to input terminals of the corresponding unit time delay elements and an n-th multiplier being connected to an output terminal of an n-th time unit time delay element, and an adder connected to output terminals of the n multipliers, said filter having an impulse response expressed by using a finite time length, the impulse response being equivalent to the filter coefficients of the FIR filter, the FIR filter having an arbitrary number of taps, and a transfer function H (z) related to a transfer function Z (z) of a pre-filter, wherein the filter coefficients are calculated by performing a weighted approximation to the desired characteristics so as to satisfy an attenuation quantity of a stop band in relation to a frequency response of the pre-filter through which the attenuation quantity of the designated frequency of the stop band is passed, and which satisfies the attenuation quantity of the stop band, when the number of taps are variable and a band setting is changeable.

69. A method of setting filter coefficients of an FIR filter according to claim 68, wherein the weighted approximation is executed to the desired characteristics using Remez Exchange algorithms taking into account a frequency response of the pre-filter.

70. A method of setting filter coefficients of an FIR filter comprising n-1 series-connected unit time delay elements, n multipliers having the filter coefficients, (n-1) multipliers being connected to input terminals of the corresponding unit time delay elements and an n-th multiplier being connected to an output terminal of an n-th time unit time delay element, and an adder connected to output terminals of the n multipliers, said filter having an impulse response expressed by using a finite time length, the impulse response being equivalent to the filter coefficients of the FIR filter, the FIR filter having an arbitrary number of taps, and a transfer function H (z) related to a transfer function Z (z) of a pre-filter and a transfer function K (z) of an equalizer, wherein the filter coefficients are calculated depending on an amplitude characteristic of the equalizer obtained by performing a weighted approximation to the desired characteristics so as to satisfy an attenuation quantity of a stop band in relation to a frequency response of the pre-filter through which the attenuation quantity of the designated frequency of the stop band is passed, and which satisfies the attenuation quantity of the stop band, when the number of taps is variable and band setting is changeable.

71. A method of setting filter coefficients of an FIR filter according to claim 70, wherein the weighted approximation is executed to the desired characteristics using Remez Exchange algorithms taking into account a frequency response of the pre-filter.

72. A method of setting filter coefficients of an FIR filter comprising n-1 series-connected unit time delay elements, n multipliers having the filter coefficients, (n-1) multipliers being connected to input terminals of the corresponding unit time delay elements and an n-th multiplier being connected to an output terminal of an n-th time unit time delay element, and an adder connected to output terminals of the n multipliers, said filter having an impulse response expressed by a finite time length, and the impulse response being equivalent to the filter coefficients, and wherein number of taps is variable, and a band setting that is changeable, comprising:

a first step for generating an interpolation polynomial equation for interpolating an amplitude characteristic from an extreme value point of the amplitude characteristic of a frequency;

a second step for determining a new extreme value point from the amplitude characteristic obtained from the interpolation polynomial equation that is generated in the first step;

a third step for judging whether or not a position of the extreme value is approximated within required range by repeating the operation in the first step and the second step;

a fourth step for examining attenuation quantity of a stop band from the approximated amplitude characteristic obtained in the third step;

a fifth step for comparing the examined attenuation quantity in the fourth step with the attenuation quantity of the designated stop band to judge whether or not the result of the comparison satisfies a predetermined condition;

a sixth step for changing the band setting when the result of the comparison of the fifth step does not satisfy the predetermined condition;

a seventh step for judging whether or not the current number of taps can satisfy the attenuation quantity of the stop band after changing of the band in the sixth step;

an eighth step for changing the number of taps when judgement is performed that the current number of taps can not satisfy the attenuation quantity in the seventh step;

a ninth step for examining the attenuation quantity of the designated frequency of a transition band which the attenuation quantity satisfies a predetermined condition in the fifth step;

a tenth step for comparing the attenuation quantity of the designated frequency of the transition band that is examined in the ninth step with the attenuation quantity of the designated transition band, and for judging whether or not the result of comparison satisfies the predetermined condition;

an eleventh step for changing setting of the band when the result of comparison of the tenth step does not satisfy the predetermined condition;

a twelfth step for judging whether or not the current number of taps causes the signal to pass the designated frequency of the stop band after changing the band in the eleventh step;

a thirteenth step changing the number of taps when judgement is performed that the current number of taps does not enable the designated frequency to be passed in the twelfth step; and a fourteenth step for finding the filter coefficients from the amplitude characteristic approximated depending on the tenth step which amplitude characteristic satisfies the predetermined condition.

73. A method of setting filter coefficients of an FIR filter according to claim 72, further comprising an initial setting step for carrying out, at least, setting of the FIR filter, setting of the band, setting of a coefficient of a pre-filter, and setting of the initial extreme value point, before executing the operation in the first step.

74. A method of setting filter coefficients of an FIR filter according to claim 72, wherein in the fourth step, the minimum attenuation quantity in the stop band is examined, and both in the eighth step and in the thirteenth step, the number of the taps is increased.

75. A method of setting filter coefficients of an FIR filter according to claim 72, wherein in the fourteenth step, the filter coefficients are calculated by performing the weighted approximation with reference to the desired characteristics so as to satisfy the attenuation quantity of the stop band in relation to the frequency response of the pre-filter that satisfies the attenuation quantity of the stop band, and that causes the attenuation quantity of the designated frequency of the transition band to pass when the number of taps is variable and band setting is changeable.

76. A method of setting filter coefficients of an FIR filter according to claim 75, wherein the weighted approximation is executed to the desired characteristics using Remez Exchange algorithms taking into account frequency response of the pre-filter.

77. A method of setting filter coefficients of an FIR filter according to claim 72, wherein in the fourteenth step, the filter coefficients are calculated depending on an amplitude characteristic of the equalizer obtained by performing the weighted approximation to the desired characteristics so as to satisfy the attenuation quantity of the stop band in relation to the frequency response of the pre-filter that satisfies the attenuation quantity of the stop band, and that causes the attenuation quantity of the designated frequency of the transition band to pass when the number of taps is variable and the band setting is changeable.

78. A method of setting filter coefficients of an FIR filter according to claim 77, wherein the weighted approximation is executed to the desired characteristics using Remez Exchange algorithms taking into account frequency response of the pre-filter.

* * * * *